(12) United States Patent
Nagayama et al.

(10) Patent No.: US 11,404,652 B2
(45) Date of Patent: Aug. 2, 2022

(54) IRIDIUM COMPLEX COMPOUND, COMPOSITION CONTAINING THE COMPOUND AND SOLVENT, ORGANIC ELECTROLUMINESCENT ELEMENT CONTAINING THE COMPOUND, DISPLAY DEVICE, AND ILLUMINATION DEVICE

(71) Applicant: Mitsubishi Chemical Corporation, Tokyo (JP)

(72) Inventors: Kazuhiro Nagayama, Tokyo (JP); Oki Iemura, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 17/240,255

(22) Filed: Apr. 26, 2021

(65) Prior Publication Data

US 2021/0257564 A1    Aug. 19, 2021

Related U.S. Application Data

(63) Continuation of application No. 15/931,758, which is a continuation of application No. (Continued)

(30) Foreign Application Priority Data

Nov. 29, 2017  (JP) .............................. JP2017-229167
Nov. 29, 2017  (JP) .............................. JP2017-229168

(51) Int. Cl.
    *C07F 15/00*       (2006.01)
    *C09K 11/00*       (2006.01)
    (Continued)

(52) U.S. Cl.
    CPC ...... *H01L 51/0085* (2013.01); *C07F 15/0033* (2013.01); *C09K 11/06* (2013.01); (Continued)

(58) Field of Classification Search
    CPC .... C07F 15/0033; C07F 15/004; C09K 11/06; H01L 27/32; H01L 51/50
    See application file for complete search history.

(56) References Cited

U.S. PATENT DOCUMENTS 8,519,130 B2 *  8/2013  Alleyne ................ H05B 33/14
                                                         546/2
9,758,719 B2 *  9/2017  Lee ..................... H01L 51/0085
                          (Continued)

FOREIGN PATENT DOCUMENTS

EP      3 067 361 A1    9/2016
JP      2010-027970     2/2010
                (Continued)

OTHER PUBLICATIONS

International Search Report dated Mar. 5, 2019 in PCT/JP2018/043899 file Nov. 29, 2018.
(Continued)

*Primary Examiner* — Mark Kopec
(74) *Attorney, Agent, or Firm* — Oblon, McClelland, Maier & Neustadt, L.L.P.

(57) ABSTRACT

An iridium complex compound of formula (10):

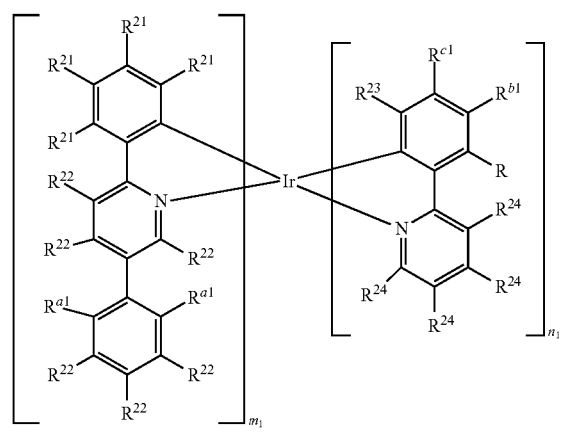

(10)

wherein Ir represents an iridium atom. $m_1$ represents an integer of 1 or 2, $n_1$ represents an integer of 1 or 2, and
(Continued)

$m_1+n_1=3$. $R^{a1}$ at each occurrence represents an alkyl group or an aralkyl group. $R^{b1}$, $R^{c1}$, and $R^{21}$ to $R^{24}$ each independently represent a hydrogen atom or a substituent. and $R^{a1}$ to $R^{c1}$ and $R^{21}$ to $R^{24}$ may be further bonded to each other to form a ring, and wherein at least one of $R^{b1}$ and $R^{c1}$ is a substituted or unsubstituted aromatic or heteroaromatic group.

8 Claims, 1 Drawing Sheet

Related U.S. Application Data

PCT/JP2018/043899, filed on Nov. 29, 2018, now Pat. No. 11,038,126.

(51) Int. Cl.
*H01L 51/00* (2006.01)
*C09K 11/06* (2006.01)
*H01L 51/50* (2006.01)

(52) U.S. Cl.
CPC .......... *C09K 2211/1007* (2013.01); *C09K 2211/1029* (2013.01); *C09K 2211/185* (2013.01); *H01L 51/0007* (2013.01); *H01L 51/5016* (2013.01)

(56) References Cited

U.S. PATENT DOCUMENTS

| | | |
|---|---|---|
| 9,799,837 B2 | 10/2017 | Nagayama et al. |
| 10,600,974 B2 | 3/2020 | Ishibashi et al. |
| 2006/0127696 A1 | 6/2006 | Stossel et al. |
| 2009/0108737 A1* | 4/2009 | Kwong ............... C07F 15/0033 313/504 |
| 2015/0155502 A1 | 6/2015 | Ishibashi et al. |
| 2015/0236279 A1 | 8/2015 | Szigethy et al. |
| 2016/0072082 A1 | 3/2016 | Brooks et al. |
| 2016/0181529 A1* | 6/2016 | Tsai ...................... H01L 51/009 257/40 |
| 2016/0268521 A1 | 9/2016 | Lee et al. |
| 2020/0317706 A1 | 10/2020 | Nagayama et al. |
| 2020/0358012 A1 | 11/2020 | Lee et al. |

FOREIGN PATENT DOCUMENTS

| | | |
|---|---|---|
| JP | 2012-151226 A | 8/2012 |
| JP | 2014-74000 A | 4/2014 |
| JP | 2016-169212 A | 9/2016 |
| WO | WO 2004/026886 A2 | 4/2004 |
| WO | WO 2016/194784 A1 | 12/2016 |

OTHER PUBLICATIONS

Lee, K. H. et al., "Highly Efficient Green-Emitting Electrophosphorescent Iridium Complexes with Enhanced Steric Hindrance," Journal of Nanoscience and Nanotechnology, vol. 9, 2009, pp. 7099-7103.

Extended European Search Report dated Nov. 24, 2020 in European Patent Application No. 18884709.9.

Office Action dated Jun. 21, 2022, in corresponding Chinese Patent Application No. 2019-557303 (with machine English-language Translation).

* cited by examiner

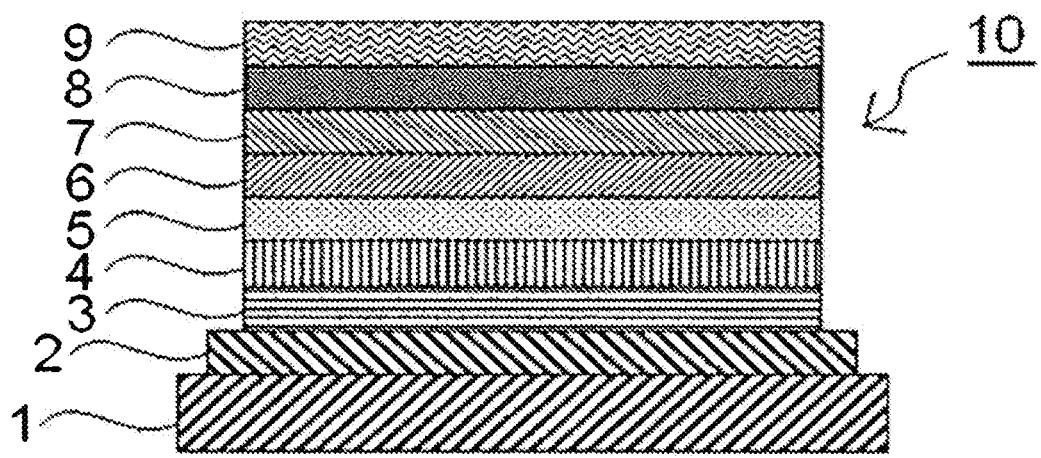

ic elements, and an illumination device including the organic electroluminescent element.

IRIDIUM COMPLEX COMPOUND, COMPOSITION CONTAINING THE COMPOUND AND SOLVENT, ORGANIC ELECTROLUMINESCENT ELEMENT CONTAINING THE COMPOUND, DISPLAY DEVICE, AND ILLUMINATION DEVICE

This application is a continuation of U.S. application Ser. No. 15/931,758 filed May 14, 2020, now U.S. Pat. No. 11,038,126, which is a continuation of PCT/JP2018/043899 filed Nov. 29, 2018 and claims the benefit of JP 2017-229168 filed Nov. 29, 2017 and JP 2017-229167 filed Nov. 29, 2017.

TECHNICAL FIELD

The present invention relates to an iridium complex compound useful as a material for a light-emitting layer of an organic electroluminescent element (hereinafter also referred to as an "organic EL element"). The present invention also relates to a composition containing the compound and a solvent, an organic electroluminescent element containing the compound, a display device including the organic electroluminescent element, and an illumination device including the organic electroluminescent element.

BACKGROUND ART

Various electronic devices in which organic EL elements are used, such as organic EL illuminators and organic EL displays, have been put to practical use. Organic EL elements, which consume little power because of their low applied voltage and are also enable light emission of three primary colors, have been put to practical use not only in large-sized display monitors but also in medium- and small-sized displays typified by cellular phones and smartphones.

Organic electroluminescent elements are produced by stacking a plurality of layers such as a light-emitting layer, a charge injection layer, and a charge transport layer.

Many of the organic electroluminescent elements are produced by depositing organic materials under vacuum. Vacuum deposition methods involve complex deposition processes and are poor in productivity. It is very difficult to provide a large-sized panel for an illuminator or a display by using an organic electroluminescent element produced by a vacuum deposition method.

In recent years, wet film-forming methods (application methods) have been studied as processes for efficiently producing an organic electroluminescent element that can be used in a large-sized display or illuminator. Wet film-forming methods, as compared to vacuum deposition methods, have the advantage of being able to easily form stable layers, and thus are expected to enable mass production of displays and illumination devices and to be used for large-sized devices.

To produce an organic EL element by a wet film-forming method, materials used all need to dissolve in an organic solvent and to be able to be used in the form of an ink. When the materials used have poor solvent solubility, operations such as long-time heating are required, and thus the materials may deteriorate before use. If homogeneity cannot be maintained for a long time in the state of a solution, the materials may precipitate from the solution, thus making it impossible to form a film with an ink-jet apparatus or the like. The materials used in the wet film-forming method are required to have solubility with two meanings, i.e., to be rapidly soluble in an organic solvent and to maintain homogeneity without precipitation after the dissolution.

In recent years, there has been an increasing need to increase the density of such an ink. By forming a light-emitting layer having a larger thickness using an ink with a high density, improvements have been made: for example, the operating lifetime of an element has been prolonged, and color purity has been increased by optimizing the optical design of an element to effectively produce what is called a microcavity effect. Materials for wet film formation of an organic EL element are required to have solvent solubility higher than those of materials of the related art.

As a green-light-emitting material in an organic electroluminescent element, an iridium complex compound having phenyl-pyridine ligands, such as Ir(ppy)$_3$, is being widely used. Since the compound itself has very poor solvent solubility, the solvent solubility is improved by introducing a substituent that imparts solvent solubility (PTLs 1 to 3 and NPL 1).

PTL 1: International Publication No. 2004/026886
PTL 2: Japanese Unexamined Patent Application Publication No. 2014-074000
PTL 3: International Publication No. 2016/194784
NPL 1: K.-H. Lee et al, Journal of Nanoscience and Nanotechnology, 9, 7099-7103 (2009)

PTLs 1 to 3 and NPL 1 disclose introducing a bent aromatic group, such as a m-phenylene group, or an alkyl group serving as a solubility-imparting group for the purpose of improving the solvent solubility of an iridium complex compound having phenyl-pyridine ligands, such as Ir(ppy)$_3$. Introducing a phenyl group into the ortho position of a phenyl-pyridine ligand is also disclosed. However, introducing such a solubility-imparting group may cause an emission wavelength shift to a wavelength longer than the intrinsic emission wavelength of Ir(ppy)$_3$ due to the conjugation-extending effect of the aromatic group or the electron-donating effect of the alkyl group. Therefore, when such a compound is used for an organic EL display, the color purity of green may deteriorate.

The emission wavelength can be shortened, for example, by introducing fluorine or an electron-withdrawing substituent such as a trifluoromethyl group or a cyano group into the phenyl group side of a phenyl-pyridine ligand. Alternatively, an electron-donating substituent such as an alkyl group or an amino group may be introduced into the pyridine side. However, these methods are unsuitable for existing organic electroluminescent elements because the electrochemical properties, that is, HOMO and LUMO values of the iridium complex compound will change greatly.

It is also possible that when such a substituent is introduced into a substitution position thereof, the ligand may decompose during the operation of an organic electroluminescent element to cause a significant reduction in operating lifetime.

For these reasons, there is a need to develop a new molecular design that improves the color purity of green, that is, achieves a shorter emission wavelength without impairing solvent solubility only by means of a design of the basic skeleton of a ligand.

SUMMARY OF INVENTION

An object of the present invention is to provide an iridium complex compound that provides both high solvent solubility and improved color purity, particularly, a green iridium complex compound that exhibits high solvent solubility and a shorter emission maximum wavelength.

Solution to Problem

The present inventors have discovered that an iridium complex compound having a specific chemical structure exhibits, as a green-light-emitting material, higher solvent solubility and a shorter emission maximum wavelength than materials of the related art.

Thus, the gist of the present invention is as follows.

[1] An iridium complex compound represented by formula (1) below:

[Chem. 1]

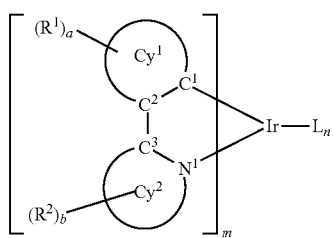

(1)

[in formula (1), Ir represents an iridium atom,

L represents a bidentate ligand, in the case of a plurality of L's, the plurality of L's may be the same or different, a ring $Cy^1$ represents an aromatic or heteroaromatic ring including carbon atoms $C^1$ and $C^2$, a ring $Cy^2$ represents a heteroaromatic ring including a carbon atom $C^3$ and a nitrogen atom $N^1$, $R^1$ and $R^2$ each independently represent a hydrogen atom or a substituent, a and b represent maximum integer numbers of possible substituents on the ring $Cy^1$ and the ring $Cy^2$, respectively, m represents an integer of 1 to 3, n represents an integer of 0 to 2, m+n=3, in the case of a plurality of $R^1$'s and/or a plurality of $R^2$'s, the plurality of $R^1$'s and/or the plurality of $R^2$'s may be the same or different, provided that at least one $R^1$ is represented by formula (2) below:

[Chem. 2]

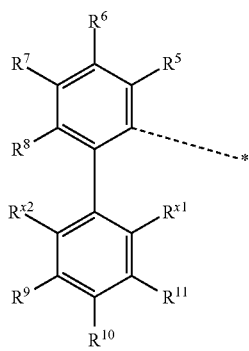

(2)

in formula (2), * represents a position of bonding to the ring $Cy^1$, $R^5$ to $R^{11}$ each independently represent a hydrogen atom or a substituent, and $R^{X1}$ and $R^{X2}$ each independently represent an alkyl group or an aralkyl group].

[2] The iridium complex compound according to [1], wherein the ring $Cy^1$ and $(R^1)$ a in formula (1) are represented by formula (3) below:

[Chem. 3]

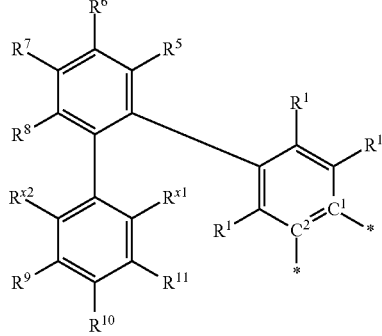

(3)

[in formula (3), * represents a bonding position, and $R^1$, $R^5$ to $R^{11}$, $R^{X1}$, and $R^{X2}$ are as defined in formula (1) and formula (2)].

[3] The iridium complex compound according to [1] or [2], wherein the ligand L is represented by formula (4) below:

[Chem. 4]

(4)

[in formula (4), * represents a bonding position, a ring $Cy^3$ represents an aromatic or heteroaromatic ring including carbon atoms $C^4$ and $C^5$ and is bonded to the iridium atom through $C^4$, a ring $Cy^4$ represents a heteroaromatic ring including a carbon atom $C^6$ and a nitrogen atom $N^2$ and is bonded to the iridium atom through $N^2$, $R^3$ and $R^4$ each independently represent a hydrogen atom or a substituent, and c and d are maximum integer numbers of possible substituents on the ring $Cy^3$ and the ring $Cy^4$, respectively].

[4] The iridium complex compound according to [3], wherein the ligand L is represented by formula (5) below:

[Chem. 5]

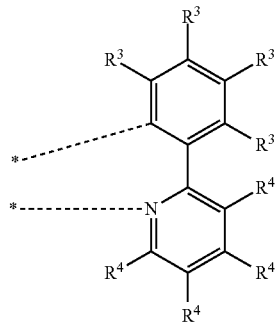

(5)

[in formula (5), * represents a bonding position, and $R^3$ and $R^4$ each independently represent a hydrogen atom or a substituent].

[5] A composition comprising the iridium complex compound according to any one of [1] to [4] and a solvent.

[6] An organic electroluminescent element comprising the iridium complex compound according to any one of [1] to [4].

[7] A display device comprising the organic electroluminescent element according to [6].

[8] An illumination device comprising the organic electroluminescent element according to [6].

Advantageous Effects of Invention

The iridium complex compound of the present invention has high solvent solubility and thus is suitable for use in producing an organic electroluminescent element by a wet film-forming method.

The iridium complex compound of the present invention is a green iridium complex compound that exhibits a short emission maximum wavelength.

The element containing the iridium complex compound of the present invention exhibits high color purity particularly when used as a green-light-emitting element, and thus is particularly useful for an organic EL display device.

BRIEF DESCRIPTION OF DRAWINGS

The FIGURE is a sectional view schematically illustrating an example of a structure of an organic electroluminescent element of the present invention.

DESCRIPTION OF EMBODIMENTS

Embodiments of the present invention will now be described in detail, but the present invention is not limited to the following embodiments and can be practiced with various modifications within the scope of the gist of the invention.

As used herein, the term "aromatic ring" refers to an "aromatic hydrocarbon ring" and is distinct from a "heteroaromatic ring" which includes a heteroatom as an annular atom. Similarly, the term "aromatic group" refers to an "aromatic hydrocarbon ring group", and the term "heteroaromatic group" refers to a "heteroaromatic ring group".

[Iridium Complex Compound]

An iridium complex compound of the present invention is a compound represented by formula (1) below.

[Chem. 6]

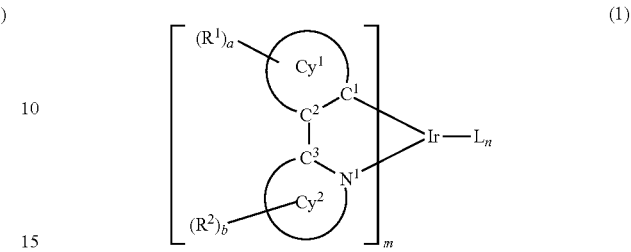

(1)

[in formula (1), Ir represents an iridium atom,

L represents a bidentate ligand, in the case of a plurality of L's, the plurality of L's may be the same or different, a ring $Cy^1$ represents an aromatic or heteroaromatic ring including carbon atoms $C^1$ and $C^2$, a ring $Cy^2$ represents a heteroaromatic ring including a carbon atom $C^3$ and a nitrogen atom $N^1$, $R^1$ and $R^2$ each independently represent a hydrogen atom or a substituent, a and b represent maximum integer numbers of possible substituents on the ring $Cy^1$ and the ring $Cy^2$, respectively, m represents an integer of 1 to 3, n represents an integer of 0 to 2, m+n=3, in the case of a plurality of $R^1$'s and/or a plurality of $R^2$'s, the plurality of $R^1$'s and/or the plurality of $R^2$'s may be the same or different, provided that at least one $R^1$ is represented by formula (2) below:

[Chem. 7]

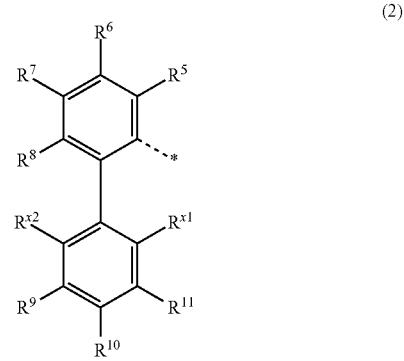

(2)

in formula (2), * represents a position of bonding to the ring $Cy^1$, $R^5$ to $R^{11}$ each independently represent a hydrogen atom or a substituent, and $R^{X1}$ and $R^{X2}$ each independently represent an alkyl group or an aralkyl group].

<Structural Feature>

A significant feature of the iridium complex compound of the present invention is that the substituent represented by formula (2) is present on a ring structure moiety (ring $Cy^1$ moiety) of a ligand directly covalently bonded to the iridium atom.

A compound in which the ring structure moiety is substituted with a 2,6-dimethylphenyl group as in compound D-2 given later is known well. This compound cannot produce a sufficient wavelength-shortening effect because the steric hindrance by the dimethyl groups is not sufficient so that the HOMO distributed over the iridium atom and the ring structure moiety leaks out to the dimethylphenyl group. Furthermore, due to the structure in which the methyl groups project into a space where the HOMO exists, when holes enter the iridium complex compound in an organic electroluminescent element, hydrogen atoms of the methyl groups are undesirably converted into hydride anions to induce decomposition of the ligand.

As described in NPL 1, when an unsubstituted ortho-biphenyl group is introduced into the ring structure moiety, a large emission wavelength shift to a longer wavelength is caused. This may also be explained as follows: due to insufficient steric hindrance, the twist of the biphenyl moiety is wholly insufficient, and the HOMO expands, thus leading to a longer wavelength.

As shown in formula (2), the iridium complex compound of the present invention is designed such that substituents $R^{X1}$ and $R^{X2}$ are introduced into the 2-position and the 6-position to considerably twist the biphenyl moiety, while the twisted state is fixed to prevent rotation in the biphenyl, whereby the substituents $R^{X1}$ and $R^{X2}$ at the 2- and 6-positions introduced for twisting do not come into contact with the HOMO. With this design, the problems mentioned above have been solved.

In the ligand of the iridium complex compound of the present invention, the bonding between the ring $Cy^1$ and the benzene ring including $R^5$ to $R^8$ in formula (2) cannot rotate. Therefore, the ligand is a mixture of compounds in which the substituent represented by formula (2) is located above or below the plane including the ring $Cy^1$ and the bonding (the drawing plane), that is, optical isomers. This relationship holds after the ligand is coordinated to iridium to form a complex. This means that the iridium complex compound of the present invention, although represented by a single chemical formula, is an ensemble of a plurality of structural isomers.

In a solution in which different compounds having partially different structures are present, each other's crystallization is inhibited, and thus crystallization is less likely to occur than in a solution containing a completely single isomeric structure alone at the same concentration. In addition, crystals in the former solution typically have a small particle size and are formed as a powder mixture of crystals of different isomers, and have the drawback that the other structural isomer is taken into in each crystal, albeit only slightly, thus leading to a more unstable crystal structure and a higher rate of dissolution in a solvent.

For the above reasons, the iridium complex compound of the present invention presumably has solvent solubility higher than normal, that is, has a higher rate of dissolution in a solvent and is kept dissolved for a long time after once being dissolved to become an ink.

<Ring $Cy^1$>

The ring $Cy^1$ represents an aromatic or heteroaromatic ring including the carbon atoms $C^1$ and $C^2$ coordinating to the iridium atom.

The ring $Cy^1$ may be a monocyclic ring or a fused ring formed of a plurality of rings bonded together. In the case of a fused ring, the number of rings is not particularly limited and is preferably 6 or less, and preferably 5 or less because the solvent solubility of the complex tends not to be impaired.

Although not particularly limited, when the ring $Cy^1$ is a heteroaromatic ring, the heteroatom included as an annular atom in addition to the carbon atoms is preferably selected from a nitrogen atom, an oxygen atom, a sulfur atom, a silicon atom, a phosphorus atom, and a selenium atom, from the viewpoint of chemical stability of the complex.

Specific examples of the ring $Cy^1$ include, in the case of aromatic rings, monocyclic rings such as a benzene ring; bicyclic rings such as a naphthalene ring; and tri- or higher cyclic rings such as a fluorene ring, an anthracene ring, a phenanthrene ring, a perylene ring, a tetracene ring, a pyrene ring, a benzpyrene ring, a chrysene ring, a triphenylene ring, and a fluoranthene ring. In the case of heteroaromatic rings, specific examples include oxygen-containing rings such as a furan ring, a benzofuran ring, and a dibenzofuran ring; sulfur-containing rings such as a thiophene ring, a benzothiophene ring, and a dibenzothiophene ring; nitrogen-containing rings such as a pyrrole ring, a pyrazole ring, an imidazole ring, a benzimidazole ring, an indole ring, an indazole ring, a carbazole ring, an indolocarbazole ring, an indenocarbazole ring, a pyridine ring, a pyrazine ring, a pyridazine ring, a pyrimidine ring, a triazine ring, a quinoline ring, an isoquinoline ring, a cinnoline ring, a phthalazine ring, a quinoxaline ring, a quinazoline ring, a quinazolinone ring, an acridine ring, a phenanthridine ring, a carboline ring, and a purine ring; and rings including two or more different heteroatoms, such as an oxazole ring, an oxadiazole ring, an isoxazole ring, a benzisoxazole ring, a thiazole ring, a benzothiazole ring, an isothiazole ring, and a benzisothiazole ring.

In particular, to precisely control the emission wavelength, improve the solubility in an organic solvent, and provide an organic electroluminescent element with improved durability, an appropriate substituent is preferably introduced onto these rings. Therefore, rings for which many methods of introducing such a substituent are known are preferred. Thus, among the above specific examples, rings in which one ring including the carbon atoms $C^1$ and $C^2$ is a benzene ring or a pyridine ring are preferred. Examples thereof include, in addition to the aromatic rings described above, a dibenzofuran ring, a dibenzothiophene ring, a carbazole ring, an indolocarbazole ring, an indenocarbazole ring, and a carboline ring. Of these, rings in which one ring including the carbon atoms $C^1$ and $C^2$ is a benzene ring are more preferred. Examples thereof include a benzene ring, a naphthalene ring, a fluorene ring, a dibenzofuran ring, a dibenzothiophene ring, and a carbazole ring.

The number of atoms constituting the ring $Cy^1$ is not particularly limited, but to maintain the solvent solubility of the iridium complex compound, the number of atoms constituting the ring is preferably 5 or more, more preferably 6 or more. The number of atoms constituting the ring is preferably 30 or less, more preferably 20 or less.

<Ring $Cy^2$>

The ring $Cy^2$ represents a heteroaromatic ring including the carbon atom $C^3$ and the nitrogen atom $N^2$ coordinating to the iridium atom.

Specific examples of the ring $Cy^2$ include monocyclic rings such as a pyridine ring, a pyridazine ring, a pyrimidine ring, a pyrazine ring, a triazine ring, a pyrrole ring, a pyrazole ring, an isoxazole ring, a thiazole ring, an oxazole ring, an oxadiazole ring, a thiazole ring, and a purine ring; bicyclic fused rings such as a quinoline ring, an isoquinoline ring, a cinnoline ring, a phthalazine ring, a quinazoline ring, a quinoxaline ring, a naphthyridine ring, an indole ring, an indazole ring, a benzisoxazole ring, a benzisothiazole ring, a benzimidazole ring, a benzoxazole ring, and a benzothiazole ring; tricyclic fused rings such as an acridine ring, a phenanthroline ring, a carbazole ring, and a carboline ring; and tetra- or higher cyclic fused rings such as a benzophenanthridine ring, a benzacridine ring, and an indolocarboline ring. Furthermore, carbon atoms constituting these rings may be further substituted with nitrogen atoms.

Of these, the ring $Cy^2$ is preferably a monocyclic ring or a tetra- or lower cyclic fused ring, more preferably a monocyclic ring or a tri- or lower cyclic fused ring, most preferably a monocyclic ring or a bicyclic fused ring, because the emission wavelength and the solvent solubility are easily adjusted due to the ease of introduction of a substituent, and because there are many known methods by which a complex with iridium can be synthesized in good yield. The ring $Cy^2$ is most preferably a pyridine ring, which readily allows the iridium complex compound to emit green light.

<$R^1$ and $R^2$>

$R^1$ and $R^2$ each independently represent a hydrogen atom or a substituent, provided that at least one $R^1$ is represented by formula (2) below.

[Chem. 8]

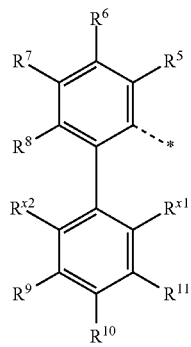

(2)

[In formula (2), * represents a position of bonding to the ring $Cy^1$.

$R^5$ to $R^{11}$ each independently represent a hydrogen atom or a substituent.

$R^{x1}$ and $R^{x2}$ each independently represent an alkyl group or an aralkyl group.]

$R^1$, $R^2$, and $R^5$ to $R^{11}$ are independent of each other and may be the same or different. $R^1$, $R^2$, and $R^5$ to $R^{11}$ may be further bonded together to form an aliphatic, aromatic, or heteroaromatic, monocyclic or fused ring.

When $R^1$, $R^2$, and $R^5$ to $R^{11}$ are substituents, the substituents are not particularly limited, and optimal groups are selected taking into account, for example, precise control of the desired emission wavelength, the affinity with a solvent used, and the affinity with a host compound in the case where an organic electroluminescent element is produced. In considering the optimization, preferred substituents are each independently within a substituent range selected from a substituent group W described below.

(Substituent Group W)

$R^1$, $R^2$, and $R^5$ to $R^{11}$ are each independently selected from a hydrogen atom, D, F, Cl, Br, I, —N(R')$_2$, —CN, —NO$_2$, —OH, —COOR', —C(=O)R', —C(=O)NR', —P(=O)(R')$_2$, —S(=O)R', —S(=O)$_2$R', —OS(=O)$_2$R', a linear, branched, or cyclic alkyl group having 1 to 30 carbon atoms, a linear, branched, or cyclic alkoxy group having 1 to 30 carbon atoms, a linear, branched, or cyclic alkylthio group having 1 to 30 carbon atoms, a linear, branched, or cyclic alkenyl group having 2 to 30 carbon atoms, a linear, branched, or cyclic alkynyl group having 2 to 30 carbon atoms, an aromatic group having 5 to 60 carbon atoms, a heteroaromatic group having 5 to 60 carbon atoms, an aryloxy group having 5 to 40 carbon atoms, an arylthio group having 5 to 40 carbon atoms, an aralkyl group having 5 to 60 carbon atoms, a heteroaralkyl group having 5 to 60 carbon atoms, a diarylamino group having 10 to 40 carbon atoms, an arylheteroarylamino group having 10 to 40 carbon atoms, and a diheteroarylamino group having 10 to 40 carbon atoms.

The alkyl group, the alkoxy group, the alkylthio group, the alkenyl group, the alkynyl group, the aralkyl group and the heteroaralkyl group may be further substituted with one or more R', and one —CH$_2$— group or two or more non-adjacent —CH$_2$— groups in these groups may be substituted with —C(—R')=C(—R')—, —C≡C—, —Si(—R')$_2$—, —C(=O)—, —NR'—, —O—, —S—, —CONR'—, or a divalent aromatic group. One or more hydrogen atoms in these groups may be substituted with D, F, Cl, Br, I, or —CN.

The aromatic group, the heteroaromatic group, the aryloxy group, the arylthio group, the diarylamino group, the arylheteroarylamino group, and the diheteroarylamino group may each independently be further substituted with one or more R'.

R' will be described later.

Examples of the linear, branched, or cyclic alkyl group having 1 to 30 carbon atoms include a methyl group, an ethyl group, an n-propyl group, an isopropyl group, an n-butyl group, an n-pentyl group, an n-hexyl group, an n-octyl group, a 2-ethylhexyl group, an isopropyl group, an isobutyl group, a cyclopentyl group, a cyclohexyl group, an n-octyl group, a norbornyl group, and an adamantyl group. From the viewpoint of durability, the number of carbon atoms is preferably 1 or more, and preferably 30 or less, more preferably 20 or less, most preferably 12 or less.

Examples of the linear, branched, or cyclic alkoxy group having 1 to 30 carbon atoms include a methoxy group, an ethoxy group, an n-propyloxy group, an n-butoxy group, an n-hexyloxy group, an isopropyloxy group, a cyclohexyloxy group, a 2-ethoxyethoxy group, and a 2-ethoxyethoxyethoxy group. From the viewpoint of durability, the number of carbon atoms is preferably 1 or more, and preferably 30 or less, more preferably 20 or less, most preferably 12 or less.

Examples of the linear, branched, or cyclic alkylthio group having 1 to 30 carbon atoms include a methylthio group, an ethylthio group, an n-propylthio group, an n-butylthio group, an n-hexylthio group, an isopropylthio group, a cyclohexylthio group, a 2-methylbutylthio group, and an n-hexylthio group. From the viewpoint of durability, the number of carbon atoms is preferably 1 or more, and preferably 30 or less, more preferably 20 or less, most preferably 12 or less.

Examples of the linear, branched, or cyclic alkenyl group having 2 to 30 carbon atoms include a vinyl group, an allyl group, a propenyl group, a heptenyl group, a cyclopentenyl group, a cyclohexenyl group, and a cyclooctenyl group. From the viewpoint of durability, the number of carbon atoms is preferably 2 or more, and preferably 30 or less, more preferably 20 or less, most preferably 12 or less.

Examples of the linear, branched, or cyclic alkynyl group having 2 to 30 carbon atoms include an ethynyl group, a propynyl group, a butynyl group, a pentynyl group, a hexynyl group, a heptynyl group, and an octynyl group. From the viewpoint of durability, the number of carbon atoms is preferably 2 or more, and preferably 30 or less, more preferably 20 or less, most preferably 12 or less.

The aromatic group having 5 to 60 carbon atoms and the heteroaromatic group having 5 to 60 carbon atoms may be present in the form of a single ring or a fused ring, or may be a group formed through bonding or condensation between one ring and another type of aromatic group or heteroaromatic group.

Examples of such groups include a phenyl group, a naphthyl group, an anthracenyl group, a benzanthracenyl group, a phenanthrenyl group, a benzophenanthrenyl group, a pyrenyl group, a chrysenyl group, a fluoranthenyl group, a perylenyl group, a benzopyrenyl group, a benzofluoranthenyl group, a naphthacenyl group, a pentacenyl group, a biphenyl group, a terphenyl group, a fluorenyl group, a spirobifluorenyl group, a dihydrophenanthrenyl group, a dihydropyrenyl group, a tetrahydropyrenyl group, an indenofluorenyl group, a furyl group, a benzofuryl group, an isobenzofuryl group, a dibenzofuranyl group, a thiophene group, a benzothiophenyl group, a dibenzothiophenyl group, a pyrrolyl group, an indolyl group, an isoindolyl group, a carbazolyl group, a benzocarbazolyl group, an indolocarbazolyl group, an indenocarbazolyl group, a pyridyl group, a cinnolyl group, an isocinnolyl group, an acridyl group, a phenanthridyl group, a phenothiazinyl group, a phenoxazyl group, a pyrazolyl group, an indazolyl group, an imidazolyl group, a benzimidazolyl group, a naphthoimidazolyl group, a phenanthroimidazolyl group, a pyridinimidazolyl group, an oxazolyl group, a benzoxazolyl group, a naphthoxazolyl group, a thiazolyl group, a benzothiazolyl group, a pyrimidyl group, a benzopyrimidyl group, a pyridazinyl group, a quinoxalinyl group, a diazaanthracenyl group, a diazapyrenyl group, a pyrazinyl group, a phenoxazinyl group, a phenothiazinyl group, a naphthyridinyl group, an azacarbazolyl group, a benzocarbolinyl group, a phenanthrolinyl group, a triazolyl group, a benzotriazolyl group, an oxadiazolyl group, a thiadiazolyl group, a triazinyl group, a 2,6-diphenyl-1,3,5-triazin-4-yl group, a tetrazolyl group, a purinyl group, and a benzothiadiazolyl group.

From the viewpoint of the balance between solubility and durability, the number of carbon atoms in these groups is preferably 5 or more, and preferably 50 or less, more preferably 40 or less, most preferably 30 or less.

Examples of the aryloxy group having 5 to 40 carbon atoms include a phenoxy group, a methylphenoxy group, a naphtoxy group, and a methoxyphenoxy group. From the viewpoint of the balance between solubility and durability, the number of carbon atoms in these aryloxy groups is preferably 5 or more, and preferably 30 or less, more preferably 25 or less, most preferably 20 or less.

Examples of the arylthio group having 5 to 40 carbon atoms include a phenylthio group, a methylphenylthio group, a naphthylthio group, and a methoxyphenylthio group. From the viewpoint of the balance between solubility and durability, the number of carbon atoms in these arylthio groups is preferably 5 or more, and preferably 30 or less, more preferably 25 or less, most preferably 20 or less.

Examples of the aralkyl group having 5 to 60 carbon atoms include a 1,1-dimethyl-1-phenylmethyl group, a 1,1-di(n-butyl)-1-phenylmethyl group, a 1,1-di(n-hexyl)-1-phenylmethyl group, a 1,1-di(n-octyl)-1-phenylmethyl group, a phenylmethyl group, a phenylethyl group, a 3-phenyl-1-propyl group, a 4-phenyl-1-n-butyl group, a 1-methyl-1-phenylethyl group, a 5-phenyl-1-n-propyl group, a 6-phenyl-1-n-hexyl group, a 6-naphthyl-1-n-hexyl group, a 7-phenyl-1-n-heptyl group, an 8-phenyl-1-n-octyl group, and a 4-phenylcyclohexyl group. From the viewpoint of the balance between solubility and durability, the number of carbon atoms in these aralkyl groups is preferably 5 or more and more preferably 40 or less.

Examples of the heteroaralkyl group having 5 to 60 carbon atoms include a 1,1-dimethyl-1-(2-pyridyl)methyl group, a 1,1-di(n-hexyl)-1-(2-pyridyl)methyl group, a (2-pyridyl)methyl group, a (2-pyridyl)ethyl group, a 3-(2-pyridyl)-1-propyl group, a 4-(2-pyridyl)-1-n-butyl group, a 1-methyl-1-(2-pyridypethyl group, a 5-(2-pyridyl)-1-n-propyl group, a 6-(2-pyridyl)-1-n-hexyl group, a 6-(2-pyrimidyl)-1-n-hexyl group, a 6-(2,6-diphenyl-1,3,5-triazin-4-yl)-1-n-hexyl group, a 7-(2-pyridyl)-1-n-heptyl group, an 8-(2-pyridyl)-1-n-octyl group, and a 4-(2-pyridyl)cyclohexyl group. From the viewpoint of the balance between solubility and durability, the number of carbon atoms in these heteroaralkyl groups is preferably 5 or more, and preferably 50 or less, more preferably 40 or less, most preferably 30 or less.

Examples of the diarylamino group having 10 to 40 carbon atoms include a diphenylamino group, a phenyl(naphthyl)amino group, a di(biphenyl)amino group, and a di(p-terphenyl)amino group. From the viewpoint of the balance between solubility and durability, the number of carbon atoms in these diarylamino groups is preferably 10 or more, and preferably 36 or less, more preferably 30 or less, most preferably 25 or less.

Examples of the arylheteroarylamino group having 10 to 40 carbon atoms include a phenyl(2-pyridyl)amino group and a phenyl(2,6-diphenyl-1,3,5-triazin-4-yl)amino group. From the viewpoint of the balance between solubility and durability, the number of carbon atoms in these arylheteroarylamino groups is preferably 10 or more, and preferably 36 or less, more preferably 30 or less, most preferably 25 or less.

Examples of the diheteroarylamino group having 10 to 40 carbon atoms include a di(2-pyridyl)amino group and a di(2,6-diphenyl-1,3,5-triazin-4-yl)amino group. From the viewpoint of the balance between solubility and durability, the number of carbon atoms in these diheteroarylamino groups is preferably 10 or more, and preferably 36 or less, more preferably 30 or less, most preferably 25 or less.

In order, particularly, not to impair the durability of a light-emitting material in an organic electroluminescent element, $R^1$, $R^2$, and $R^5$ to $R^{11}$ are each independently, preferably, a hydrogen atom, F, —CN, a linear, branched, or cyclic alkyl group having 1 to 30 carbon atoms, an aryloxy group having 5 to 40 carbon atoms, an aralkyl group having 5 to 60 carbon atoms, an aromatic group having 5 to 60 carbon atoms.

The preferred substitution position of the group represented by formula (2) on the ring $Cy^1$ is not particularly limited. For example, when the ring $Cy^1$ is a benzene ring, a structure that does not cause an emission wavelength shift to a longer wavelength should be selected to provide the stability and, in particular, green-light emission of the compound. Thus, the group represented by formula (2) is preferably bonded to the ring $Cy^1$ at the para position to the carbon atom $C^1$. Specifically, the ring $Cy^1$ and $(R^1)a$ in formula (1) are preferably a structure represented by formula (3) below.

[Chem. 9]

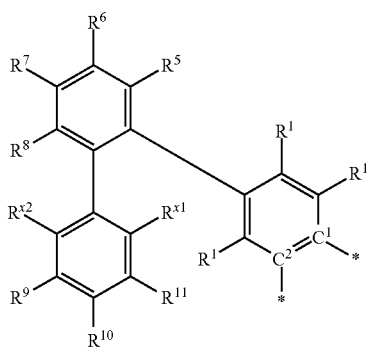

(3)

[In formula (3), * represents a bonding position.

$R^1$, $R^5$ to $R^{11}$, $R^{X1}$, and $R^{X2}$ are as defined in formula (1) and formula (2).]

<$R^{X1}$ and $R^{X2}$>

$R^{X1}$ and $R^{X2}$ each independently represent an alkyl group or an aralkyl group, preferably an alkyl or aralkyl group having 1 to 20 carbon atoms. These groups may be further substituted with R' described later and mentioned in the substituent group W of $R^1$, $R^2$, and $R^5$ to $R^{11}$. $R^{X1}$ and $R^{X2}$ are substituents located at sterically more crowded positions, and thus to facilitate synthesis, each of $R^{X1}$ and $R^{X2}$ is more preferably an alkyl group having 1 to 10 carbon atoms, still more preferably an alkyl group having 1 to 6 carbon atoms.

<R'>

Each R' is independently selected from H, D, F, Cl, Br, I, —N(R")$_2$, —CN, —NO$_2$, —Si(R")$_3$, —B(OR")$_2$, —C(=O)R", —P(=O)(R")$_2$, —S(=O)$_2$R", —OSO$_2$R", a linear, branched, or cyclic alkyl group having 1 to 30 carbon atoms, a linear, branched, or cyclic alkoxy group having 1 to 30 carbon atoms, a linear, branched, or cyclic alkylthio group having 1 to 30 carbon atoms, a linear, branched, or cyclic alkenyl group having 2 to 30 carbon atoms, a linear, branched, or cyclic alkynyl group having 2 to 30 carbon atoms, an aromatic group having 5 to 60 carbon atoms, a heteroaromatic group having 5 to 60 carbon atoms, an aryloxy group having 5 to 40 carbon atoms, an arylthio group having 5 to 40 carbon atoms, an aralkyl group having 5 to 60 carbon atoms, a heteroaralkyl group having 5 to 60 carbon atoms, a diarylamino group having 10 to 40 carbon atoms, an arylheteroarylamino group having 10 to 40 carbon atoms, and a diheteroarylamino group having 10 to 40 carbon atoms.

The alkyl group, the alkoxy group, the alkylthio group, the alkenyl group, the alkynyl group, the aralkyl group, and the heteroaralkyl group may be further substituted with one or more R", and one —CH$_2$— group or two or more non-adjacent —CH$_2$— groups in these groups may be substituted with —C(—R")=C(—R")—, —C≡C—, —Si(—R")$_2$—, —C(=O)—, —NR"—, —O—, —S—, —CONR"—, or a divalent aromatic group. One or more hydrogen atoms in these groups may be substituted with D, F, Cl, Br, I, or —CN.

The aromatic group, the heteroaromatic group, the aryloxy group, the arylthio group, the aralkyl group, the heteroaralkyl group, the diarylamino group, the arylheteroarylamino group, and the diheteroarylamino group may be further substituted with one or more R". R" will be described later.

Two or more adjacent R' may be bonded together to form an aliphatic, aromatic, or heteroaromatic, monocyclic or fused ring.

R" will be described later.

<R">

Each R" is independently selected from H, D, F, —CN, an aliphatic hydrocarbon group having 1 to 20 carbon atoms, an aromatic group having 1 to 20 carbon atoms, and a heteroaromatic group having 1 to 20 carbon atoms.

Two or more adjacent R" may be bonded together to form an aliphatic, aromatic, or heteroaromatic, monocyclic or fused ring.

<L>

L represents a bidentate ligand and is not particularly limited as long as the feature of the present invention is not impaired. When there is a plurality of L's in one molecule, they may be the same or different. In view of the use as a light-emitting material for an organic electroluminescent element, non-limiting examples of preferred structures of L are shown as formulae (7A) to (7F) below. In formulae (7A) to (7F) below, * represents a bonding position.

In the bidentate ligand L, as long as its structure can be maintained, carbon atoms in the skeleton may be replaced with other atoms such as nitrogen atoms or may be further substituted. When the bidentate ligand L has a substituent, examples of the substituent include those exemplified as $R^1$, $R^2$, and $R^5$ to $R^{11}$, and the substituent is preferably a linear, branched, or cyclic alkyl group having 1 to 30 carbon atoms, an aralkyl group having 5 to 60 carbon atoms, a heteroaralkyl group having 5 to 60 carbon atoms, an aromatic group having 5 to 60 carbon atoms, or a heteroaromatic group having 5 to 60 carbon atoms. These groups may be further substituted with R' mentioned above.

[Chem. 10]

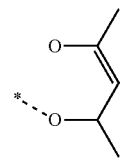

(7A)

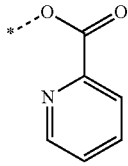

(7B)

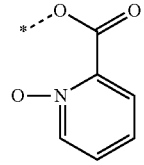

(7C)

(7D)

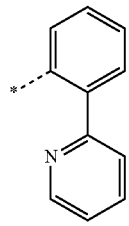

(7E)

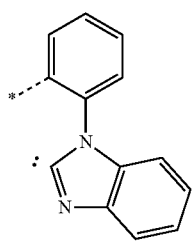

(7F)

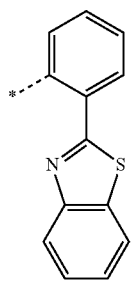

The iridium atom and the bidentate ligand L of the iridium complex compound of the present invention may be bonded together in any manner which can be appropriately selected depending on the purpose. Examples include bonding through a nitrogen atom and a carbon atom of the bidentate ligand L, bonding through two nitrogen atoms of the bidentate ligand L, bonding through two carbon atoms of the bidentate ligand L, bonding through a carbon atom and an oxygen atom of the bidentate ligand L, and bonding through two oxygen atoms of the bidentate ligand L. Of these, bonding through a nitrogen atom and a carbon atom of the bidentate ligand L is preferred to provide high thermal stability, that is, durability, and bonding through two oxygen atoms of the bidentate ligand L is preferred to increase light emission efficiency.

In particular, when the ligand L is a structure represented by formula (4) below, particularly, a structure represented by formula (5) below, very high durability is advantageously provided.

[Chem. 11]

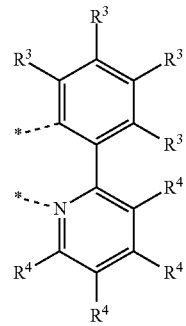

(4)

[In formula (4), * represents a bonding position.

A ring $Cy^3$ represents an aromatic or heteroaromatic ring including carbon atoms $C^4$ and $C^5$ and is bonded to the iridium atom through $C^4$.

A ring $Cy^4$ represents a heteroaromatic ring including a carbon atom $C^6$ and a nitrogen atom $N^2$ and is bonded to the iridium atom through $N^2$.

$R^3$ and $R^4$ each independently represent a hydrogen atom or a substituent.

c and d are maximum integer numbers of possible substituents on the ring $Cy^3$ and the ring $Cy^4$, respectively.]

Preferred examples and ranges of the ring $Cy^3$ and the ring $Cy^4$ are the same as those of the ring $Cy^1$ and the ring $Cy^2$, respectively. Preferred examples and ranges of $R^3$ and $R^4$ are the same as those of $R^1$ and $R^2$.

[Chem. 12]

(5)

[In formula (5), * represents a bonding position. $R^3$ and $R^4$ each independently represent a hydrogen atom or a substituent.]

<a, b, c, d, m, and n> a, b, c, and d are maximum integer numbers of possible substituents on the rings $Cy^1$, $Cy^2$, $Cy^3$, and $Cy^4$, respectively.

m is an integer of 1 to 3, n is an integer of 0 to 2, and m+n is 3. Preferably, m=2 and n=1, or m=3.

<Specific Examples>

Specific examples of preferred iridium complex compounds of the present invention other than compound 1 of Example 1 described later will be given below, but the present invention is not limited thereto. In the following, "Ph" represents a phenyl group.

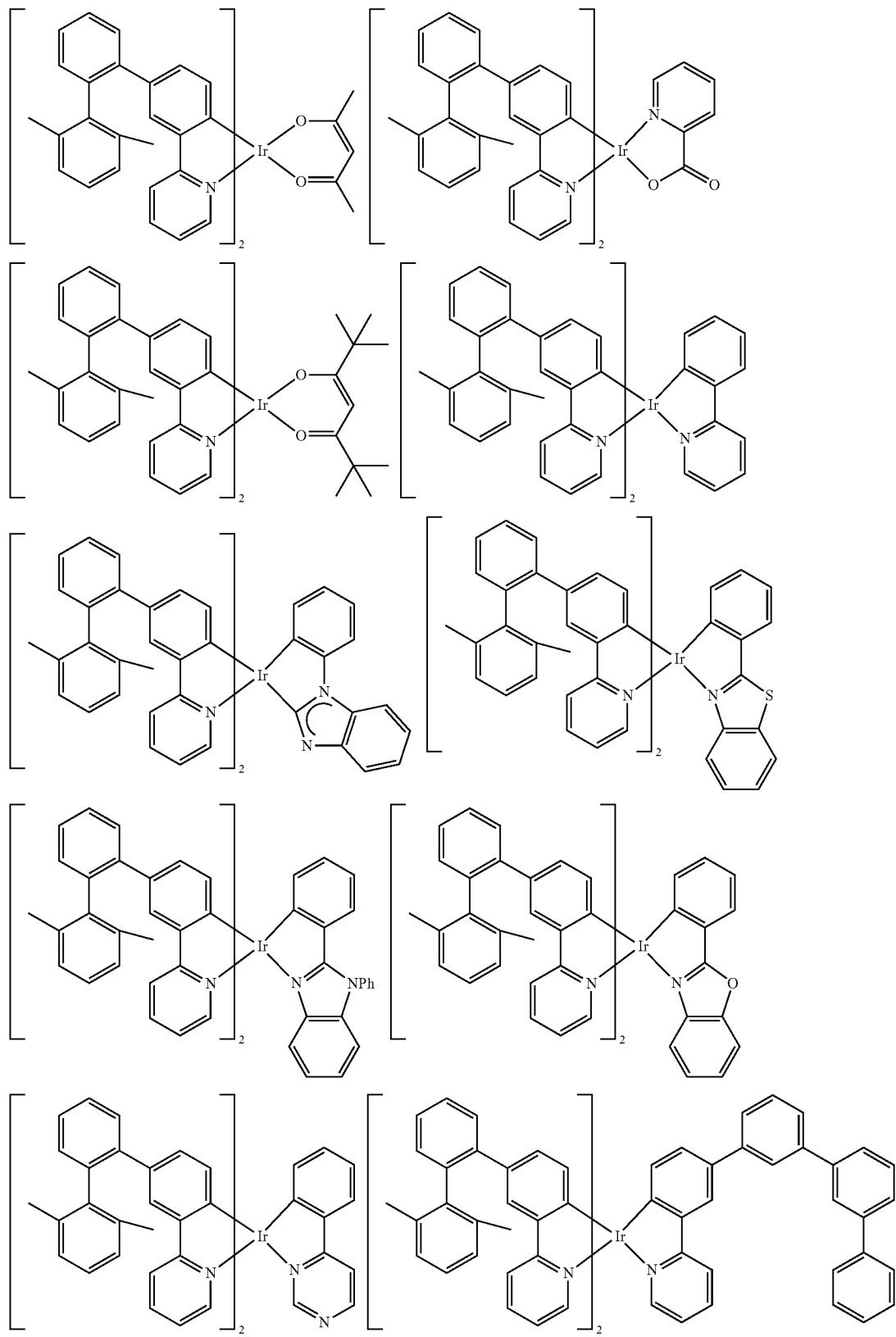

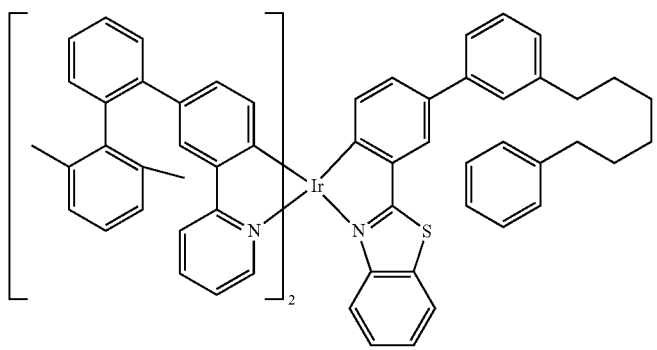
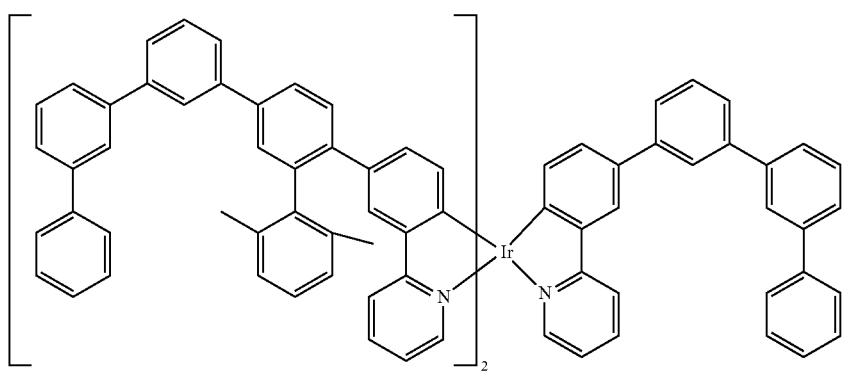
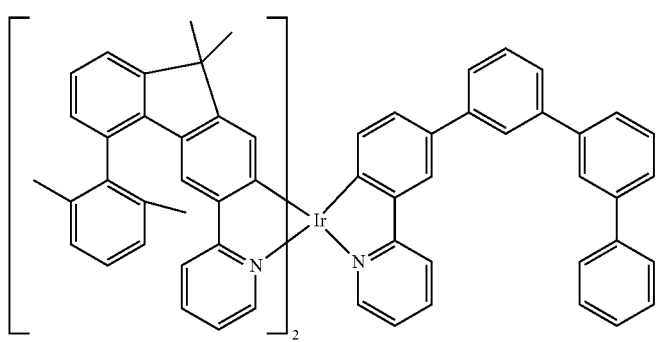
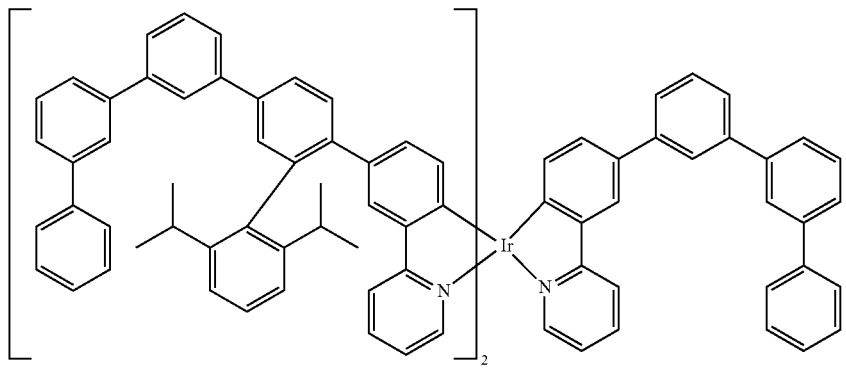

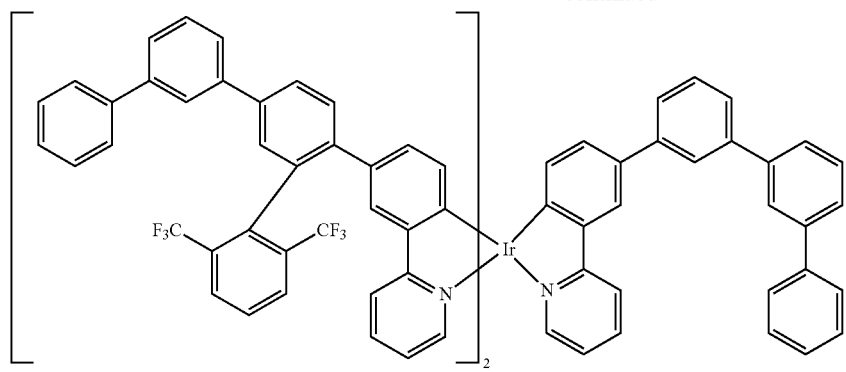
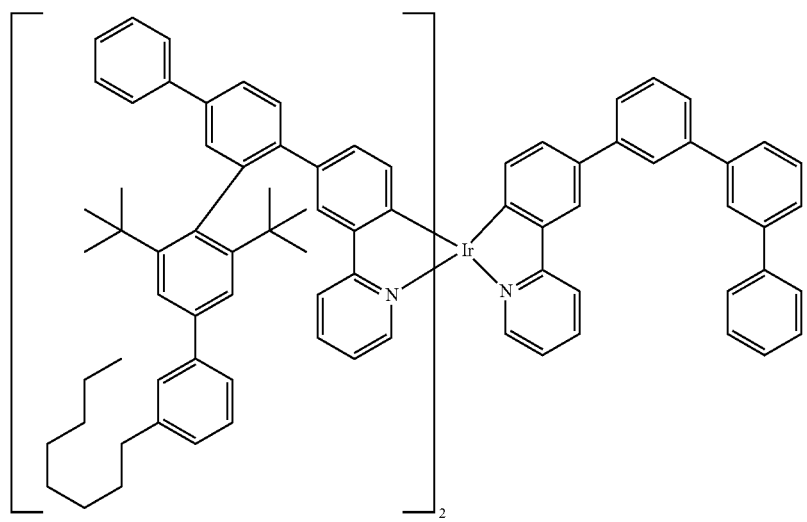
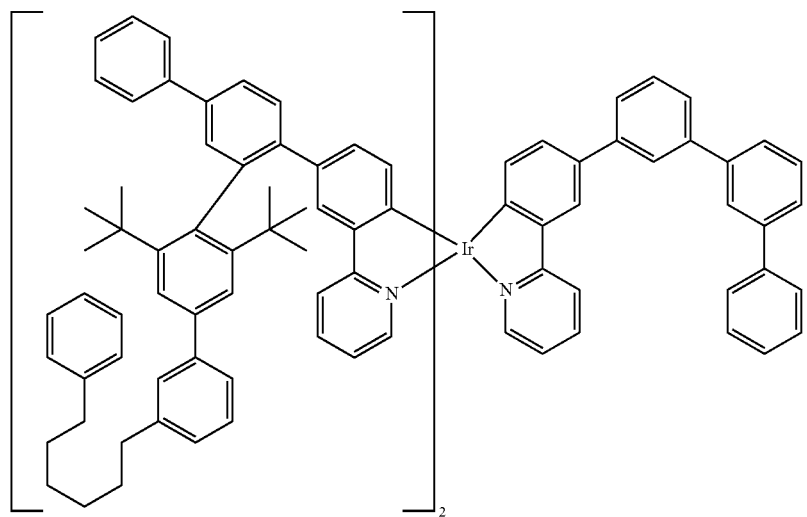

[Chem. 14]
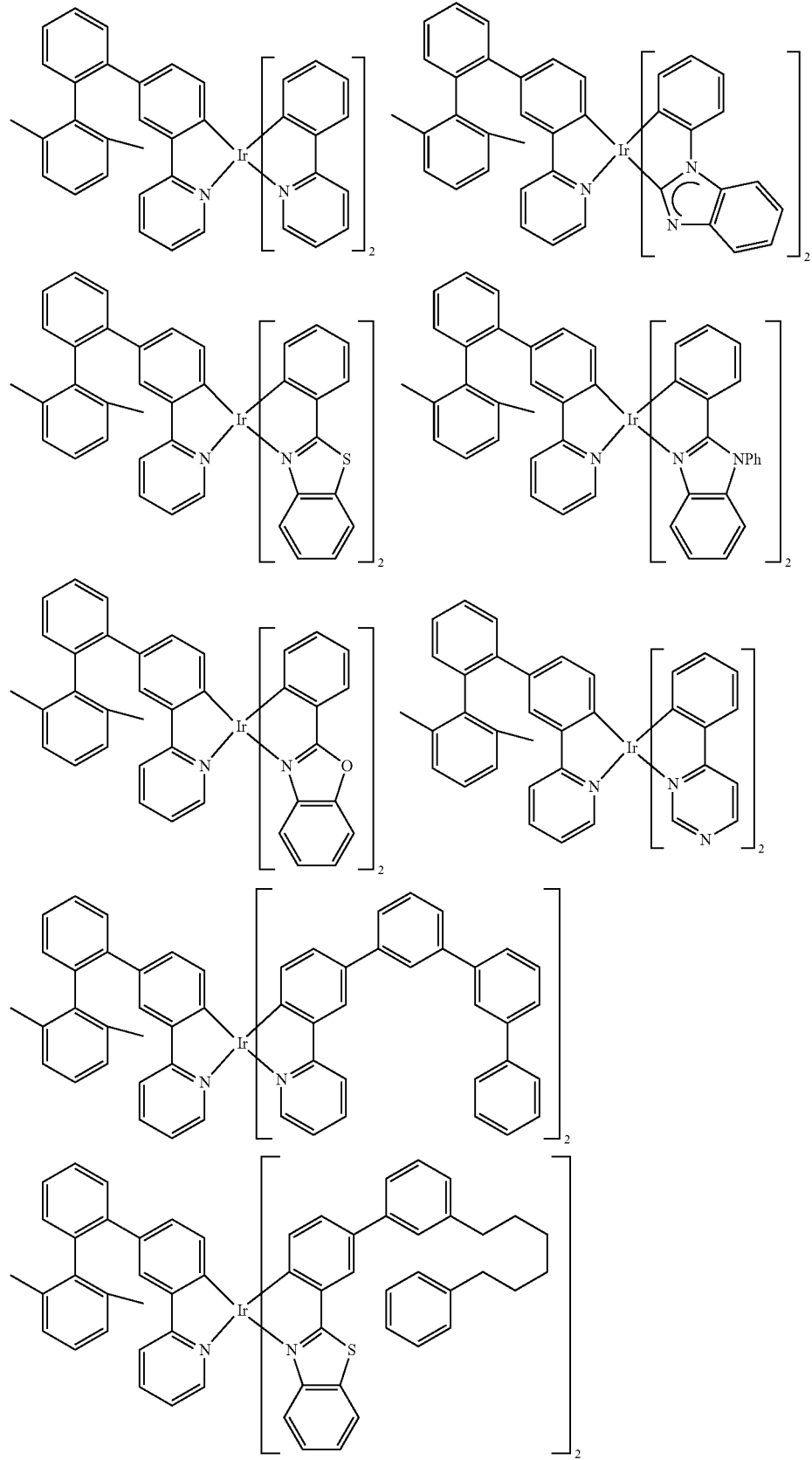

-continued
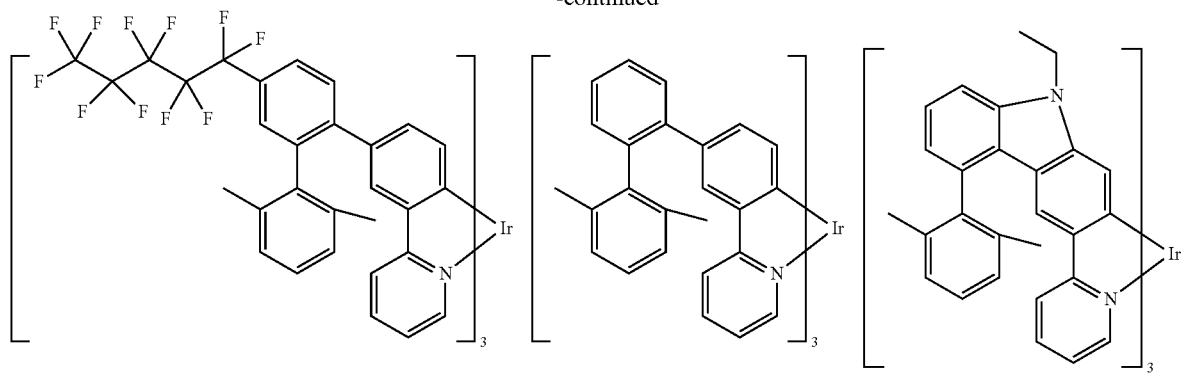
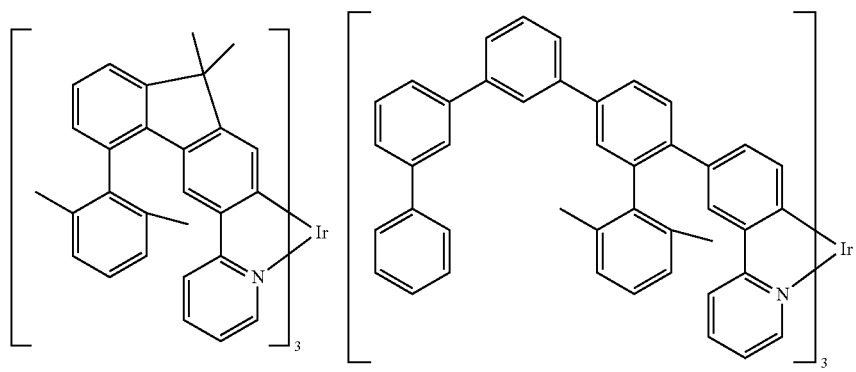
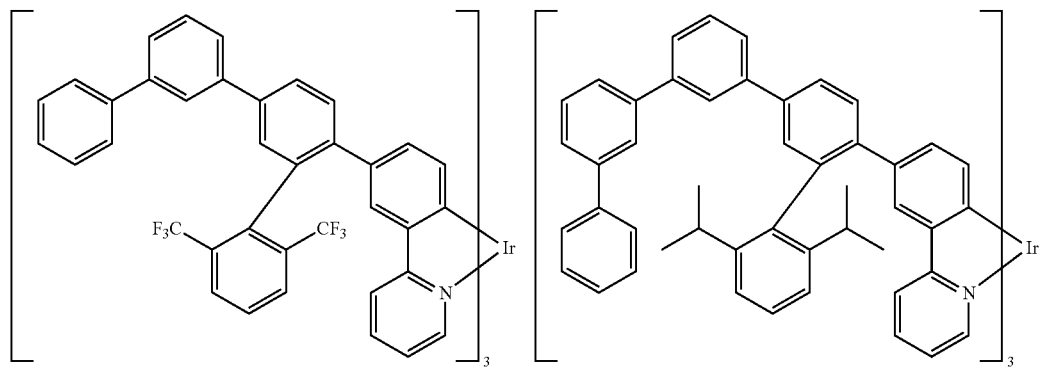
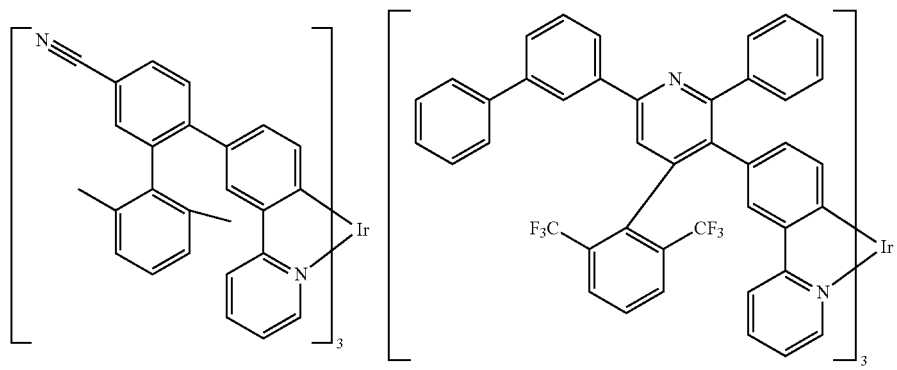

-continued
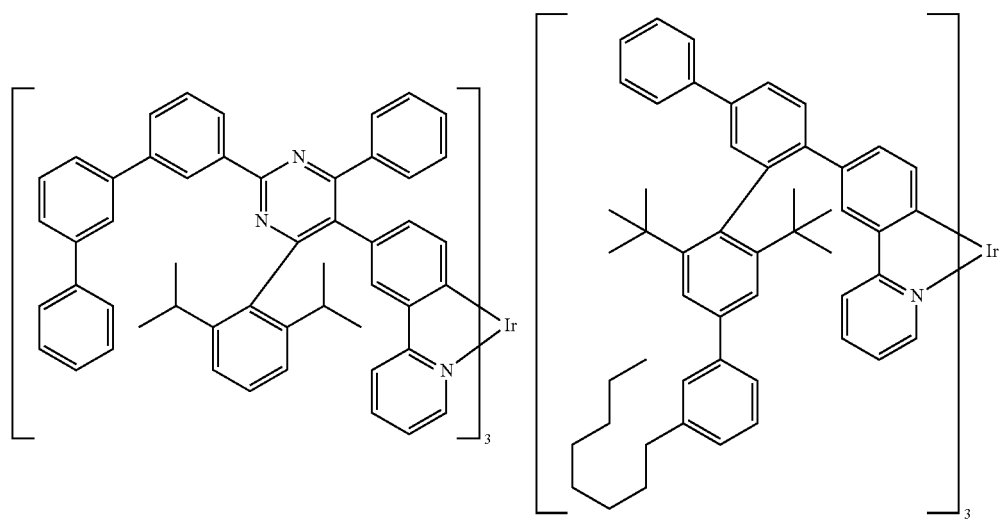
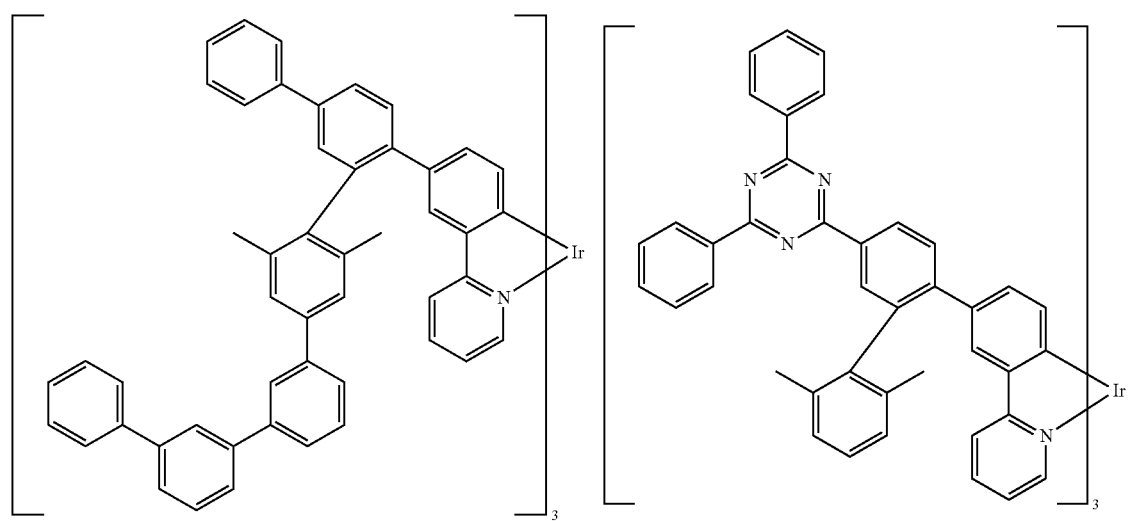

[Novel iridium complex compound]

The present invention provides, in addition to the iridium complex compound represented by formula (1) above, a different novel iridium complex compound (hereinafter also referred to as an "iridium complex compound 2").

The iridium complex compound 2 is a green iridium complex compound that provides both high solvent solubility and improved color purity, particularly, that exhibits high solvent solubility and a shorter emission maximum wavelength. The gist of the iridium complex compound 2 is as follows.

[10] An iridium complex compound represented by formula (10) below.

[Chem. 15]

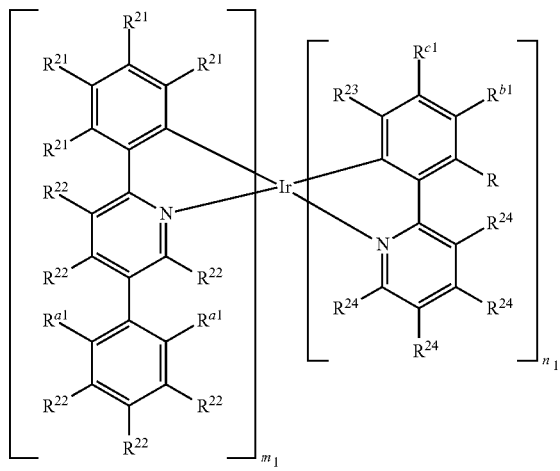

(10)

The iridium complex compound 2 of the present invention has high solvent solubility and thus is suitable for use in producing an organic electroluminescent element by a wet film-forming method.

The iridium complex compound 2 of the present invention is a green iridium complex compound that exhibits a short emission maximum wavelength.

The element containing the iridium complex compound 2 of the present invention exhibits high color purity particularly when used as a green-light-emitting element, and thus is particularly useful for an organic EL display device.

[Iridium complex compound 2]

The iridium complex compound 2 of the present invention is a compound represented by formula (10) below.

[Chem. 16]

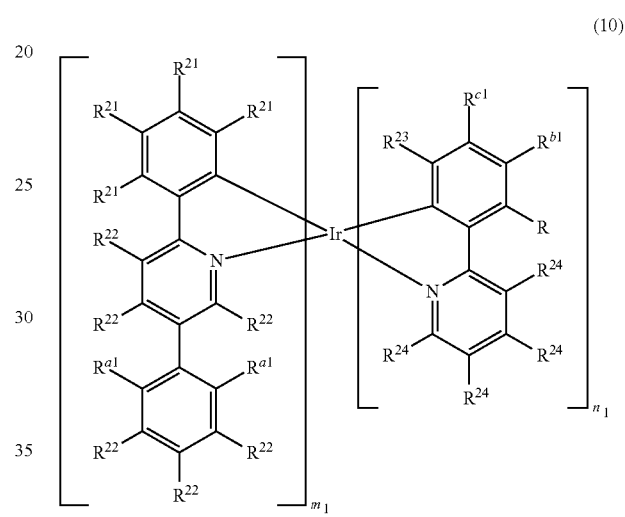

(10)

[In formula (10), Ir represents an iridium atom.

$m_1$ represents an integer of 1 or 2, $n_1$ represents an integer of 1 or 2, and $m_1+n_1=3$.

$R^{a1}$ at each occurrence represents an alkyl group or an aralkyl group.

$R^{b1}$, $R^{c1}$, and $R^{21}$ to $R^{24}$ each independently represent a hydrogen atom or a substituent.

$R^{a1}$ to $R^{c1}$ and $R^{21}$ to $R^{24}$ may be further bonded to each other to form a ring.

At least one of $R^{b1}$ and $R^{c1}$ is a substituted or unsubstituted aromatic or heteroaromatic group.]

[11] The iridium complex compound according to [10], wherein $m_1$ in formula (10) above is 2.
[12] The iridium complex compound according to [10] or [11], wherein $R^{b1}$ is a substituted or unsubstituted aromatic or heteroaromatic group.
[13] The iridium complex compound according to any one of [10] to [12], wherein $R^{21}$ at each occurrence is a hydrogen atom or an alkyl or aralkyl group having 1 to 20 carbon atoms.
[14] A composition containing the iridium complex compound according to any one of [10] to [13] and a solvent.
[15] An organic electroluminescent element including the iridium complex compound according to any one of [10] to [13].
[16] A display device including the organic electroluminescent element according to [15].
[17] An illumination device including the organic electroluminescent element according to [15].

[In formula (10), Ir represents an iridium atom.

$m_1$ represents an integer of 1 or 2, $n_1$ represents an integer of 1 or 2, and $m_1+n_1=3$.

$R^{a1}$ at each occurrence represents an alkyl group or an aralkyl group.

$R^{b1}$, $R^{c1}$, and $R^{21}$ to $R^{24}$ each independently represent a hydrogen atom or a substituent.

$R^{a1}$ to $R^{c1}$ and $R^{21}$ to $R^{24}$ may be further bonded to each other to form a ring.

At least one of $R^{b1}$ and $R^{c1}$ is a substituted or unsubstituted aromatic or heteroaromatic group.]

<Structural Feature>

In the iridium complex compound 2 of the present invention, a 2- and 6-substituted benzene ring is introduced into the 5-position of a pyridine ring of one of the phenyl-pyridine ligands. With this configuration, substituent introduction required to impart solubility is minimized compared to the related art.

Thus, an iridium complex compound having high solvent solubility can be provided without causing an emission wavelength shift to a longer wavelength.

In the case of an iridium complex having phenyl-pyridine skeletons as ligands, when each of the pyridine rings of three phenyl-pyridine ligands is unsubstituted, the iridium complex has significantly low solvent solubility. This is probably because the pyridine rings have high polarity and are arranged in a propeller-like configuration in one particular direction in the molecule due to a facial structure of the complex, and thus the polarity of the whole molecule is considerably increased, and a moiety having a partially ordered structure is formed, thus resulting in increased crystallinity.

When a substituent is introduced into a moiety other than the pyridine rings for the purpose of imparting solvent solubility, it is necessary to use a considerably large substituent in order to cancel the crystallinity.

As described in the maximum emission wavelength measurement example given later, when the substitution position of the 2- and 6-substituted benzene ring, which is introduced as a solubility-imparting group in the present invention, is not the 5-position but the 4-position of the pyridine ring, a shift of a longer wavelength undesirably tends to occur.

<$m_1$ and $n_1$>

$m_1$ represents an integer of 1 or 2, $n_1$ represents an integer of 1 or 2, and $m_1+n_1=3$. To improve the solubility of the iridium complex compound of the present invention, preferably, $m_i=2$ and $n_i=1$.

<$R^{a1}$>

$R^{a1}$ represents an alkyl group or an aralkyl group. Two $R^{a1}$'s in formula (10) are independent of each other and may be the same or different.

The alkyl group and the aralkyl group may be linear, branched, or cyclic and may be further substituted with a substituent in the substituent group W given below.

The number of carbon atoms in the alkyl group and the aralkyl group is not particularly limited. For ease of synthesis, the number of carbon atoms in the alkyl group is preferably 1 to 20, more preferably 1 to 10, still more preferably 1 to 6. The number of carbon atoms in the aralkyl group is preferably 5 to 60, more preferably 5 to 40, still more preferably 5 to 30.

<$R^{b1}$, $R^{c1}$, and $R^{21}$ to $R^{24}$>

$R^{b1}$, $R^{c1}$, and $R^{21}$ to $R^{24}$ each represent a hydrogen atom or a substituent.

The pluralities of $R^{b1}$'s, and $R^{21}$'s to $R^{24}$'s included in formula (10) are all independent of each other and may each be the same or different.

$R^{b1}$, $R^{c1}$, and $R^{21}$ to $R^{24}$ may be further bonded to each other to form an aliphatic, aromatic, or heteroaromatic, monocyclic or fused ring.

At least one of $R^{b1}$ and $R^{c1}$ is a substituted or unsubstituted aromatic or heteroaromatic group. The preferred range thereof is the same as those of the aromatic or heteroaromatic group and the substituents that may be substituted thereon described in the above substituent group W.

The substituent $R^{b1}$ or $R^{c1}$ other than the above aromatic or heteroaromatic group and the substituents $R^{21}$ to $R^{24}$ are not particularly limited, and optimal groups can be selected taking into account, for example, precise control of the desired emission wavelength, the affinity with a solvent used, and the affinity with a host compound in the case where an organic electroluminescent element is produced. In considering the optimization, preferred substituents are each independently within a substituent range selected from the substituent group W described above.

Of $R^{b1}$ and $R^{c1}$, in order, particularly, not to impair the durability of a light-emitting material in an organic electroluminescent element, at least $R^{b1}$ is preferably a substituted or unsubstituted aromatic or heteroaromatic group.

In order not to impair the durability of a light-emitting material for an organic electroluminescent element, the rest of $R^{b1}$ or $R^{c1}$ and $R^{21}$ to $R^{24}$ are more preferably each independently a hydrogen atom, F, —CN, a linear, branched, or cyclic alkyl group having 1 to 30 carbon atoms, an aromatic group having 5 to 60 carbon atoms, or a heteroaromatic group having 5 to 60 carbon atoms.

To easily achieve a shorter emission wavelength and improve green chromaticity, $R^{21}$ at each occurrence is particularly preferably a hydrogen atom, D, F, Cl, Br, I, —N(R')$_2$, —CN, —NO$_2$, —OH, —COOR', —C(=O)R', —C(=O)NR', —P(=O)(R')$_2$, —S(=O)R', —S(=O)$_2$R', —OSO$_2$R', a linear, branched, or cyclic alkyl group having 1 to 30 carbon atoms, a linear, branched, or cyclic alkoxy group having 1 to 30 carbon atoms, a linear, branched, or cyclic alkylthio group having 1 to 30 carbon atoms, an aryloxy group having 5 to 40 carbon atoms, an arylthio group having 5 to 40 carbon atoms, an aralkyl group having 5 to 60 carbon atoms, a heteroaralkyl group having 5 to 60 carbon atoms, a diarylamino group having 10 to 40 carbon atoms, an arylheteroarylamino group having 10 to 40 carbon atoms, or a diheteroarylamino group having 10 to 40 carbon atoms, most preferably a hydrogen atom, a fluorine atom, or an alkyl or aralkyl group having 1 to 20 carbon atoms.

R' used in $R^{11}$ above is as defined as R' above.

<Specific Examples>

Specific examples of preferred iridium complex compounds 2 of the present invention will be given below, but the present invention is not limited to thereto.

[Chem. 17]

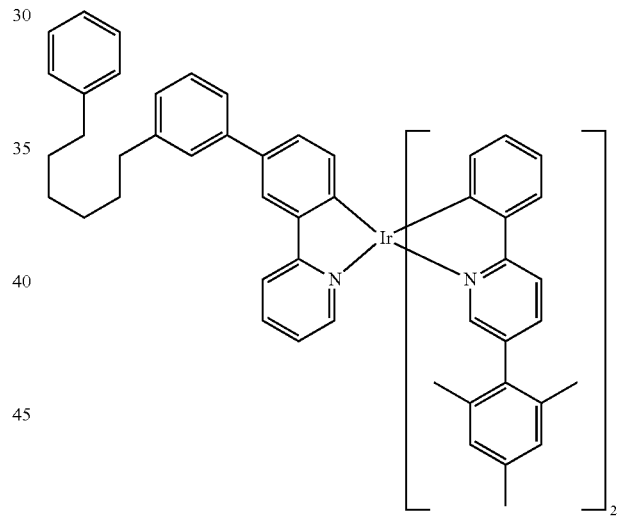

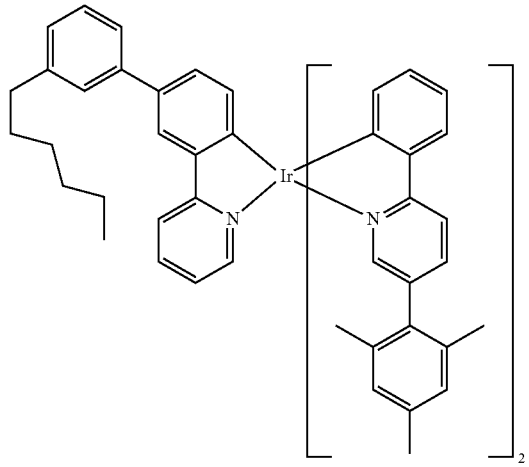

33
-continued
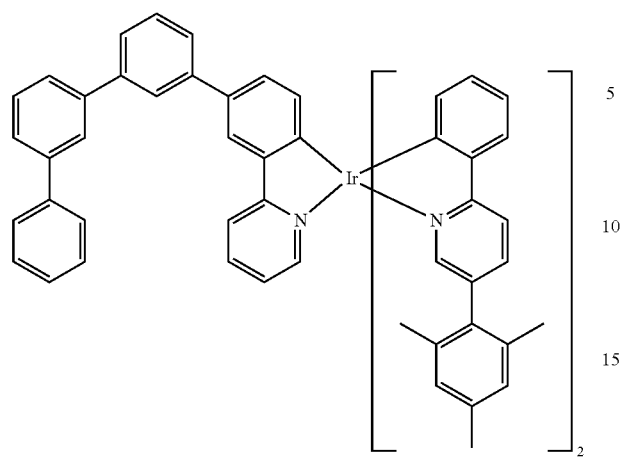
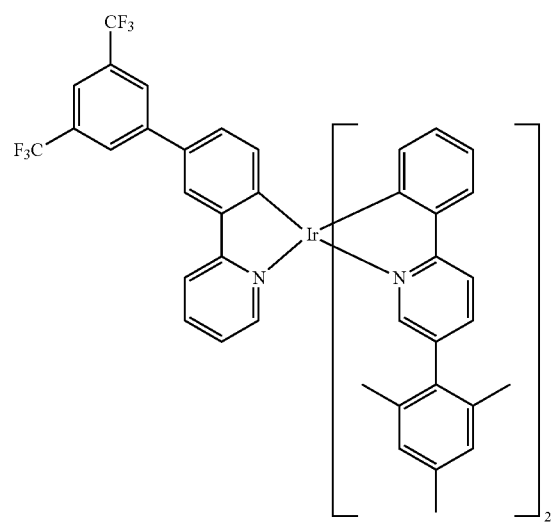
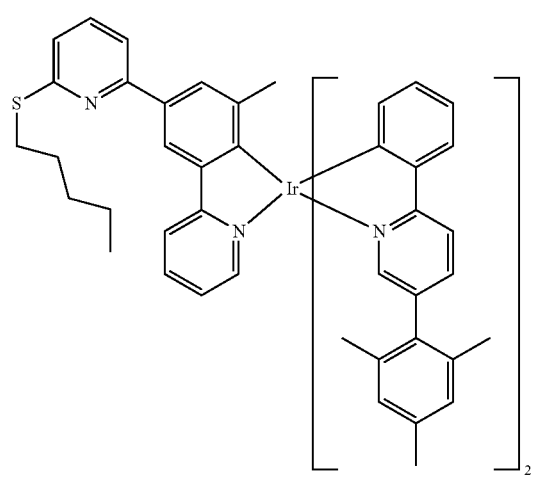
34
-continued
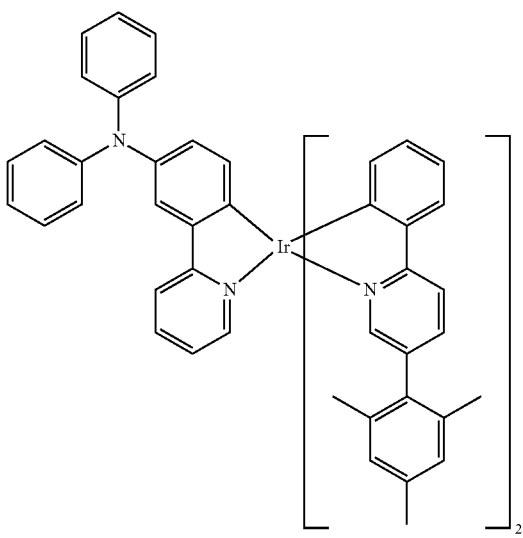
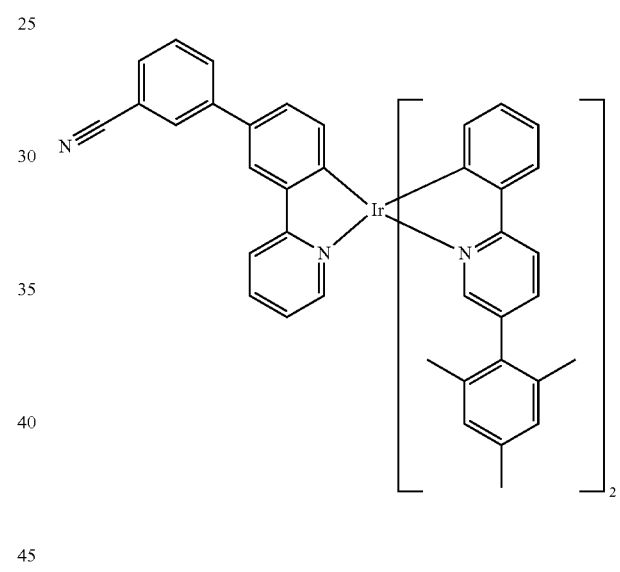
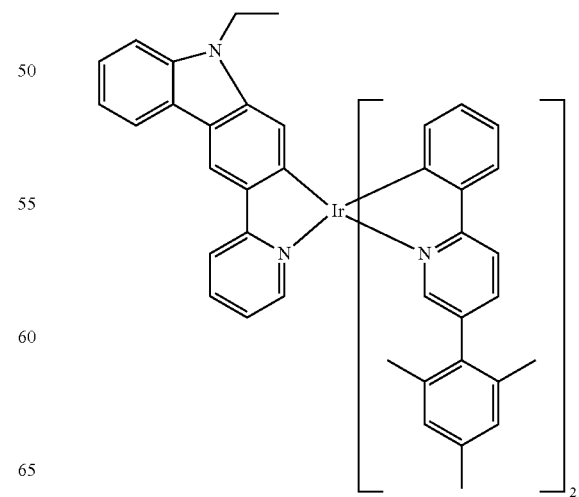

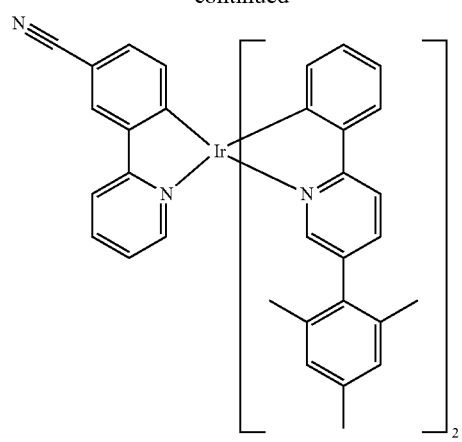
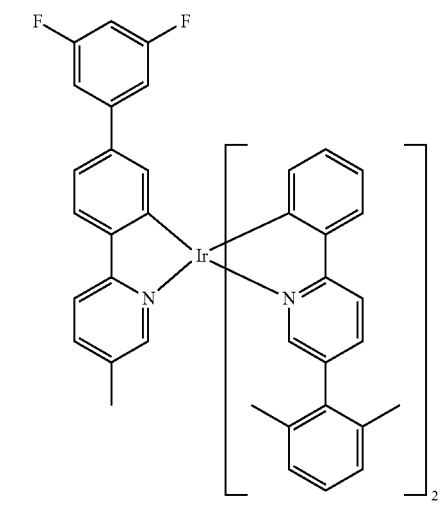
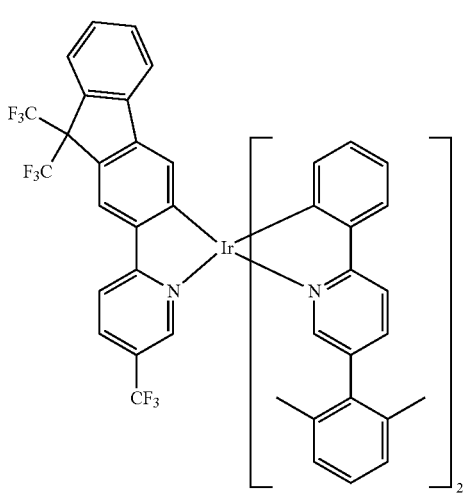
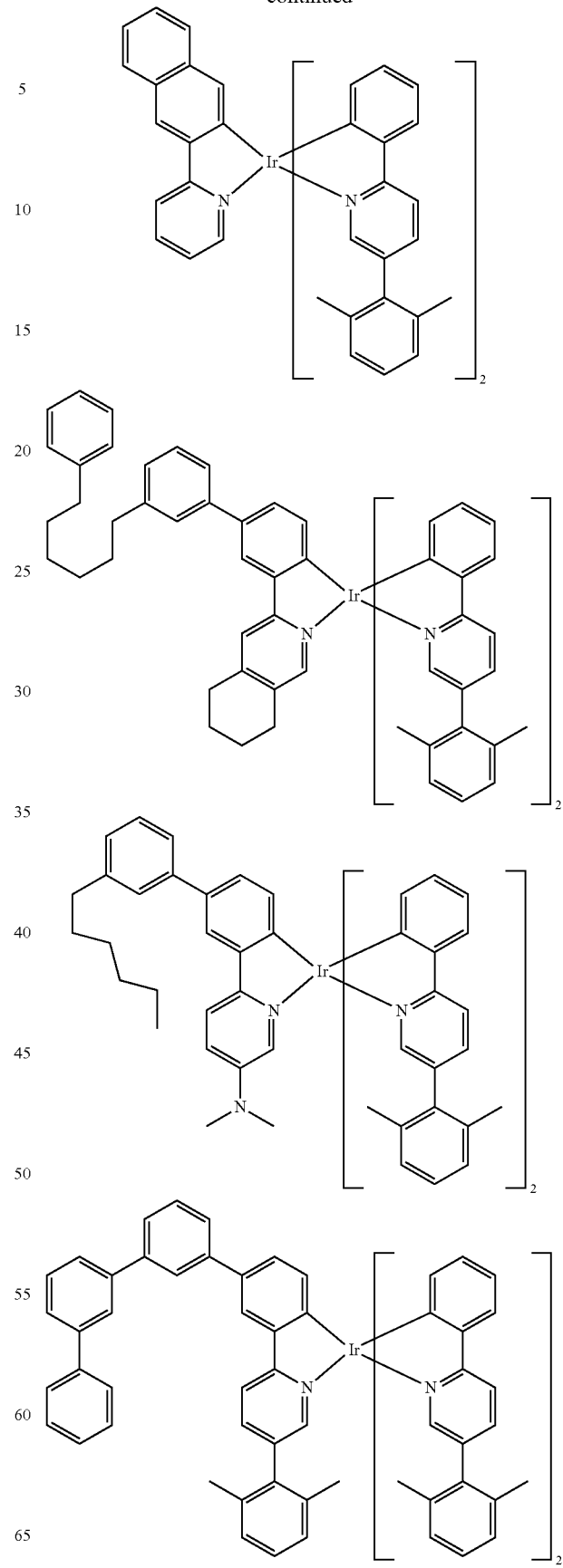

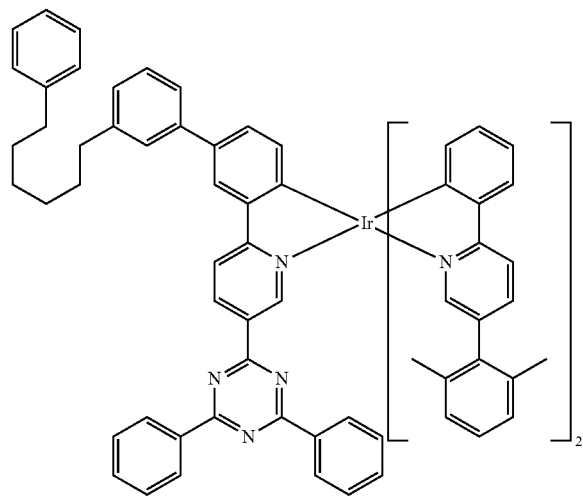
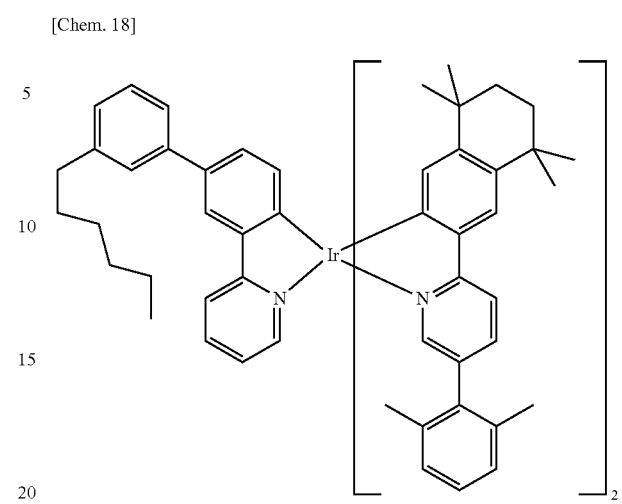
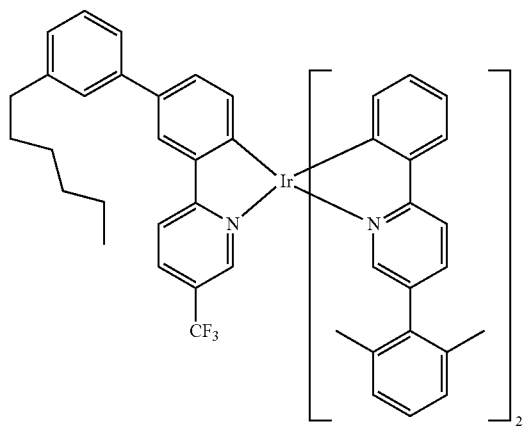
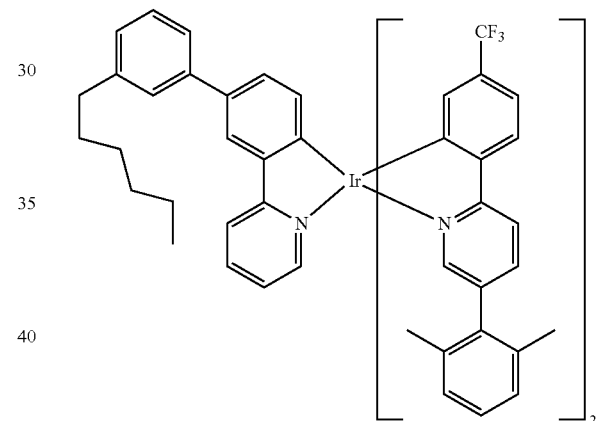
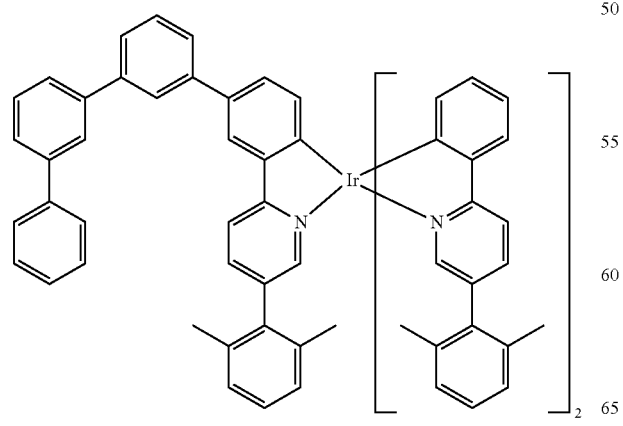
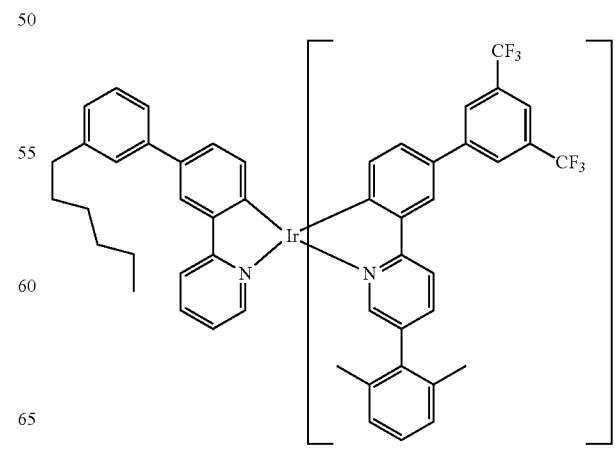

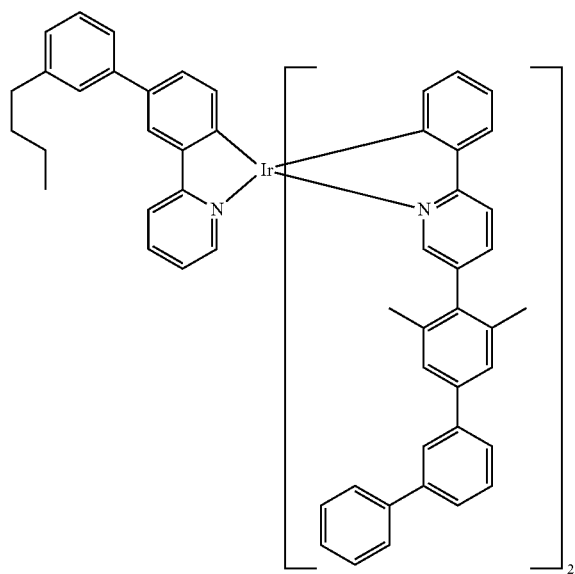
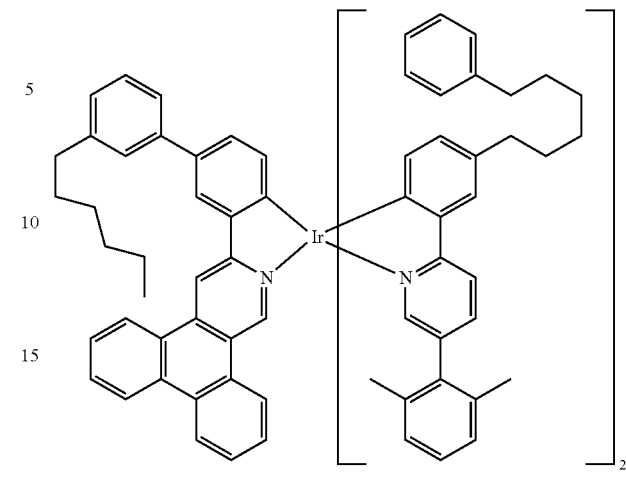
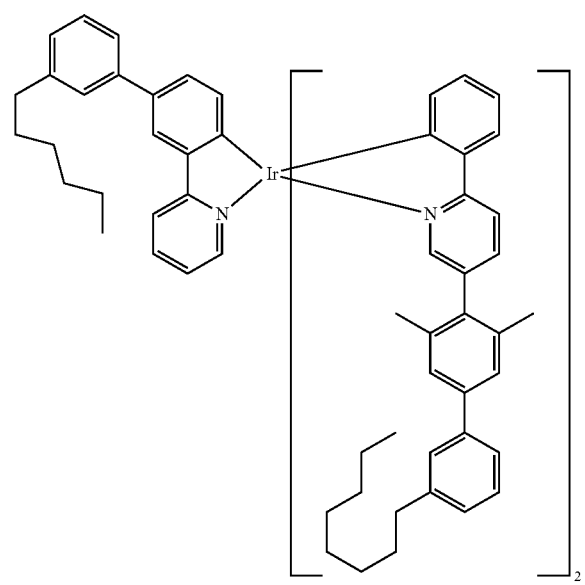
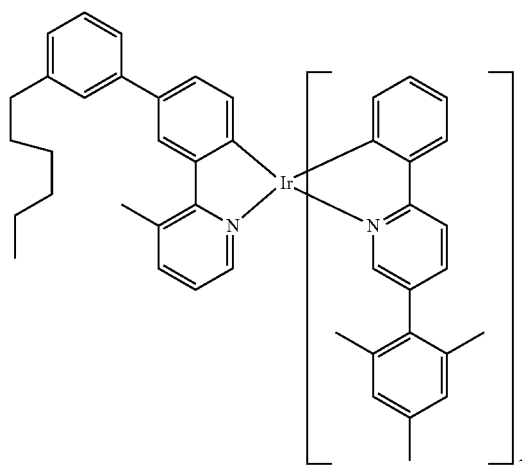
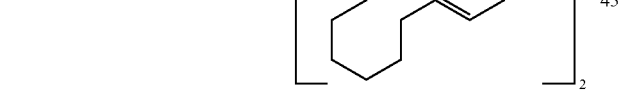
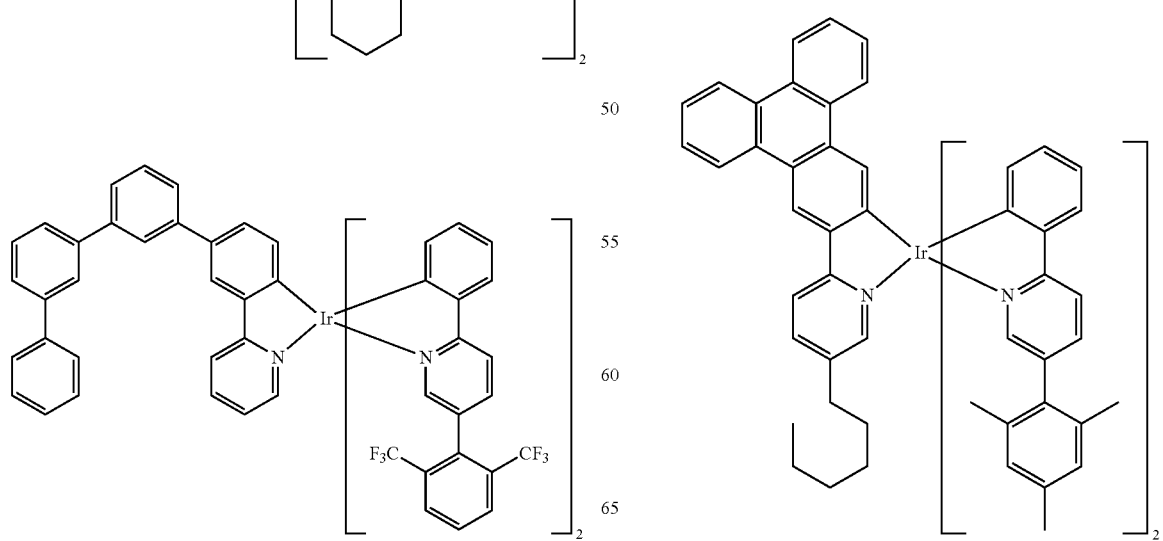

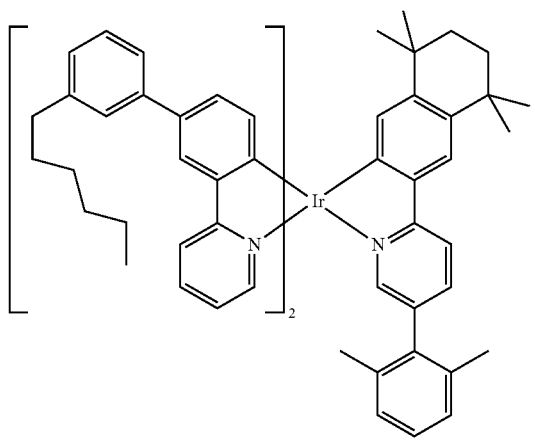
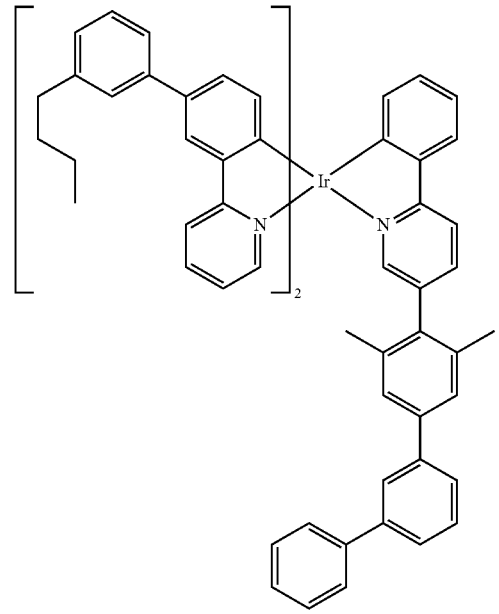
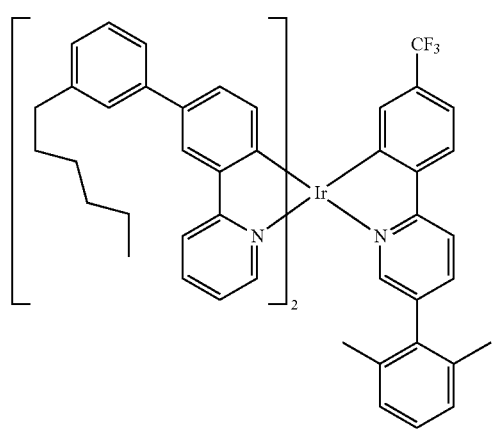
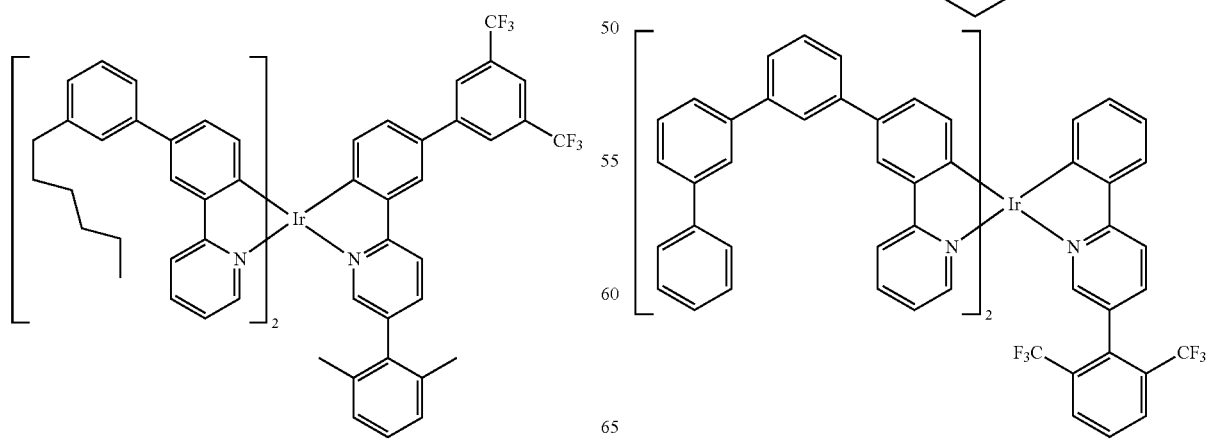

<Maximum Emission Wavelength (Emission Maximum Wavelength)>

The iridium complex compound and the iridium complex compound 2 of the present invention may each have a shorter emission wavelength. Although the emission wavelength is not particularly limited, the present invention is suitable particularly for an iridium complex compound in the green-light-emitting region.

As an indicator of how the emission wavelength is short in green light emission, the maximum emission wavelength measured by the following procedure is preferably 540 nm or less, more preferably 530 nm or less, still more preferably 520 nm or less. The maximum emission wavelength is preferably 490 nm or more, more preferably 500 nm or more. When the maximum emission wavelength is in this range, the green-light-emitting material tends to exhibit a preferred color suitable for an organic electroluminescent element.

(Method of Measuring Maximum Emission Wavelength)

At normal temperature, the phosphorescence spectrum of a solution obtained by dissolving the iridium complex compound in 2-methyltetrahydrofuran at a concentration $1\times10^{-4}$ mol/L or less is measured with a spectrophotometer (C9920-02 organic EL quantum yield spectrometer manufactured by Hamamatsu Photonics K. K.). The wavelength at a maximum intensity in the measured phosphorescence spectrum is used a maximum emission wavelength in the present invention.

<Method of Synthesizing Iridium Complex Compound>
<Method of Synthesizing Ligand>

The ligands of the iridium complex compound and the iridium complex compound 2 of the present invention can be synthesized by combining known organic synthesis reactions. In particular, various derivatives for the ligands can be synthesized by mainly using Suzuki-Miyaura coupling reaction and/or a pyridine ring synthesis reaction and further combining a reaction for introducing a substituent into the formed product.

<Method of Synthesizing Iridium Complex Compound>

The iridium complex compound and the iridium complex compound 2 of the present invention can be synthesized, for example, by a combination of known methods. Details will be described below.

Examples of the method of synthesizing the iridium complex compound and the iridium complex compound 2 includes, but are not limited to, a method by which the target compound is obtained through a chloro-bridged iridium binuclear complex as expressed by reaction scheme [A] below (M. G. Colombo, T. C. Brunold, T. Riedener, H. U. Gudel, Inorg. Chem., 1994, 33, 545-550), where a phenylpyridine ligand is used for ease of understanding, and a method by which the target compound is obtained after a binuclear complex is converted into a mononuclear complex by exchanging a chloro bridge for acetylacetonate as expressed by reaction scheme [B] below (S. Lamansky, P. Djurovich, D. Murphy, F. Abdel-Razzaq, R. Kwong, I. Tsyba, M. Borz, B. Mui, R. Bau, M. Thompson, Inorg. Chem., 2001, 40, 1704-1711).

For example, conditions for the typical reaction expressed by reaction scheme [A] below are as follows.

In the first stage, a chloro-bridged iridium binuclear complex is synthesized through a reaction of 2 equivalents of a first ligand and 1 equivalent of iridium chloride n-hydrate. Typically, a mixed solvent of 2-ethoxyethanol and water is used, but the reaction may be performed without a solvent or with another solvent. The reaction can be promoted by using the ligand in excess amount or using an additive such as a base. Instead of chlorine, other crosslinkable anionic ligands such as bromine can be used.

The reaction temperature is not particularly limited, and typically, it is preferably 0° C. or more, more preferably 50° C. or more, and preferably 250° C. or less, more preferably 150° C. or less. When the reaction temperature is in this range, the desired reaction alone tends to proceed with no by-products or decomposition reaction, thus achieving high selectivity.

[Chem. 19]

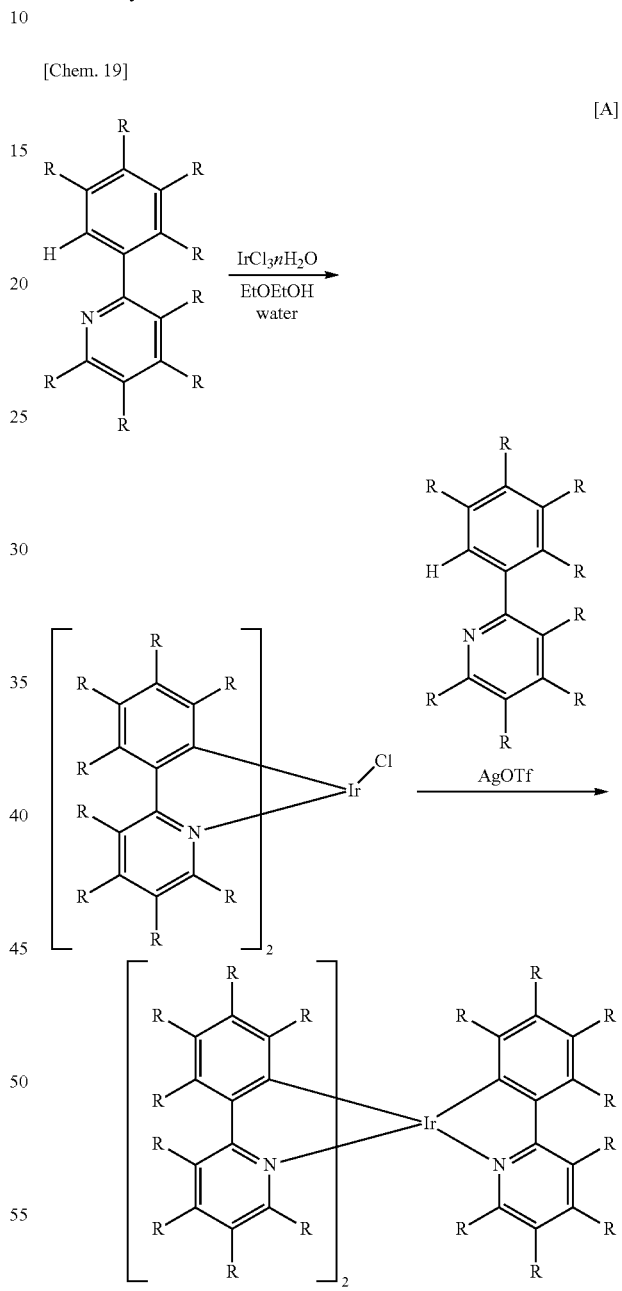

In the second stage, a halogen ion scavenger such as silver trifluoromethanesulfonate is added to bring the chloro-bridged iridium binuclear complex into contact with a second ligand, whereby the target complex is obtained. Typically, ethoxyethanol or diglyme is used as a solvent, but depending on the type of ligand, the reaction may be performed without a solvent, with another solvent, or with a mixture of two or more solvents.

Although the halogen ion scavenger is not essential since the reaction may proceed without it, the addition of the scavenger is advantageous for increasing the reaction yield and selectively synthesizing a facial isomer having a higher quantum yield. The reaction temperature is typically, but not necessarily, in the range of 0° C. to 250° C.

Typical reaction conditions expressed by reaction scheme [B] below will be described.

The binuclear complex in the first stage can be synthesized in the same manner as in reaction scheme [A].

In the second stage, the binuclear complex is allowed to react with 1 equivalent or more of a 1,3-dione compound such as acetylacetone and 1 equivalent or more of a basic compound, such as sodium carbonate, that can abstract active hydrogen of the 1,3-dione compound, to thereby convert into a mononuclear complex coordinated with a 1,3-dionate ligand. Typically, a solvent such as ethoxyethanol or dichloromethane that can dissolve the starting binuclear complex is used, but when the ligand is liquid, the reaction can be performed without a solvent. The reaction temperature is typically, but not necessarily, in the range of 0° C. to 200° C.

[Chem. 20]

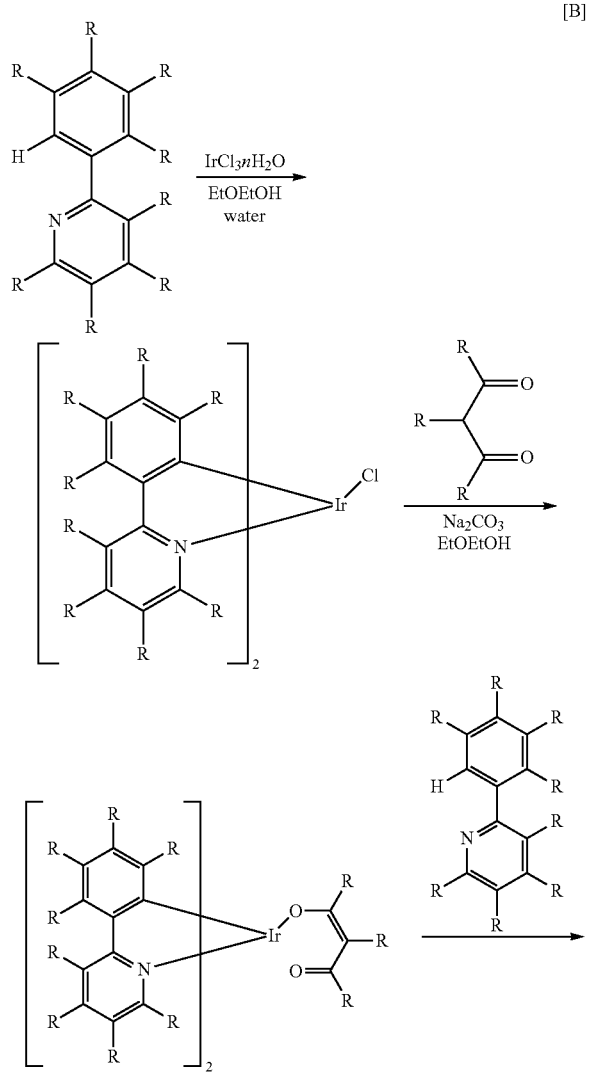

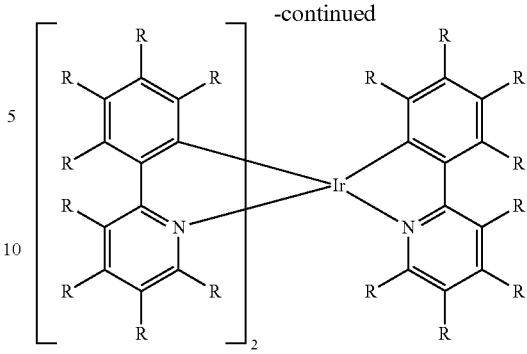

In the third stage, 1 equivalent or more of the second ligand is allowed to react. The type and amount of solvent is not particularly limited, and when the second ligand is liquid at a reaction temperature, the reaction may be performed without a solvent. The reaction temperature is also not particularly limited, but the reaction is often performed at a relatively high temperature of 100° C. to 300° C. because the reactivity is somewhat low. Thus, a high-boiling solvent such as glycerol is preferably used.

After the final reaction, purification is performed to remove unreacted raw materials, by-products, and the solvents. While a standard purification operation in synthetic organic chemistry can be used, purification by normal silica gel column chromatography is mainly performed as described in NPL above. As an eluent, hexane, heptane, dichloromethane, chloroform, ethyl acetate, toluene, methyl ethyl ketone, methanol, or a mixture thereof can be used. The purification may be performed more than once under different conditions. Purification operations such as other chromatography techniques (reverse phase silica gel chromatography, size exclusion chromatography, and paper chromatography), separate washing, reprecipitation, recrystallization, washing by powder suspension, and vacuum drying can be performed as required.

<Applications for Iridium Complex Compound>

The iridium complex compound and the iridium complex compound 2 of the present invention can be suitably used as a material used for an organic electroluminescent element, that is, a red-light-emitting material for an organic electroluminescent element, and can also be suitably used as a light-emitting material for an organic electroluminescent element and other light-emitting elements.

[Iridium Complex Compound-Containing Composition]

The iridium complex compound and the iridium complex compound 2 of the present invention has high solvent solubility and thus is preferably used together with a solvent. A composition of the present invention containing the iridium complex compound of the present invention and a solvent (hereinafter also referred to as an "iridium complex compound-containing composition") will be described below.

The iridium complex compound-containing composition of the present invention contains the iridium complex compound or the iridium complex compound 2 of the present invention and a solvent. The iridium complex compound-containing composition of the present invention is typically used to form a layer or a film by a wet film-forming method, and in particular, the composition is preferably used to form an organic layer of an organic electroluminescent element. In particular, the organic layer is preferably a light-emitting layer.

The iridium complex compound-containing composition of the present invention is preferably a composition for an organic electroluminescent element, and is particularly preferably used as a composition for light-emitting layer formation.

The content of the iridium complex compound or the iridium complex compound 2 of the present invention in the iridium complex compound-containing composition is typically 0.001 mass % or more, preferably 0.01 mass % or more, and typically 99.9 mass % or less, preferably 99 mass % or less. When the content of the iridium complex compound or the iridium complex compound 2 in the composition is in this range, holes and electrons are efficiently injected from adjacent layers (e.g., a hole transport layer and a hole blocking layer) into a light-emitting layer, thus leading to a low drive voltage. The iridium complex compound or the iridium complex compound 2 of the present invention may be contained in the iridium complex compound-containing composition in the form of a single compound or a combination of two or more compounds.

The iridium complex compound-containing composition, when used, for example, for an organic electroluminescent element, may contain, in addition to the iridium complex compound or the iridium complex compound 2 of the present invention and the solvent, a charge transport compound used for an organic electroluminescent element, particularly, for a light-emitting layer.

The iridium complex compound-containing composition of the present invention, when used to form a light-emitting layer of an organic electroluminescent element, preferably contains the iridium complex compound or the iridium complex compound 2 of the present invention as a light-emitting material and another charge transport compound as a charge transport host material.

The solvent contained in the iridium complex compound-containing composition of the present invention is a volatile liquid component used to form a layer containing the iridium complex compound or the iridium complex compound 2 by wet film-formation.

Since the iridium complex compound or the iridium complex compound 2 of the present invention serving as a solute has high solvent solubility, the solvent is not particularly limited as long as it is an organic solvent in which the charge transport compounds described later are dissolved well.

Examples of preferred solvents include alkanes such as n-decane, cyclohexane, ethylcyclohexane, decalin, and bicyclohexane; aromatic hydrocarbons such as toluene, xylene, mesitylene, phenylcyclohexane, and tetralin; halogenated aromatic hydrocarbons such as chlorobenzene, dichlorobenzene, and trichlorobenzene; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole, and diphenyl ether; aromatic esters such as phenyl acetate, phenyl propionate, methyl benzoate, ethyl benzoate, propyl benzoate, and n-butyl benzoate; alicyclic ketones such as cyclohexanone, cyclooctanone, and fenchone; alicyclic alcohols such as cyclohexanol and cyclooctanol; aliphatic ketones such as methyl ethyl ketone and dibutyl ketone; aliphatic alcohols such as butanol and hexanol; and aliphatic ethers such as ethylene glycol dimethyl ether, ethylene glycol diethyl ether, and propylene glycol-1-monomethyl ether acetate (PGMEA).

Of these, alkanes and aromatic hydrocarbons are preferred. In particular, phenylcyclohexane has a viscosity and boiling point preferred for a wet film-forming process.

These solvents may be used alone, or two or more of them may be used in any combination and ratio.

The boiling point of the solvent used is typically 80° C. or more, preferably 100° C. or more, more preferably 120° C. or more, and typically 270° C. or less, preferably 250° C. or less, more preferably 230° C. or less. Below this range, the solvent may evaporate from the composition during wet film-formation, resulting in unstable film formation.

The content of the solvent in the iridium complex compound-containing composition is preferably 1 mass % or more, more preferably 10 mass % or more, particularly preferably 50 mass % or more, and preferably 99.99 mass % or less, more preferably 99.9 mass % or less, particularly preferably 99 mass % or less.

The thickness of the light-emitting layer is typically about 3 to 200 nm. When the content of the solvent is more than this lower limit, the viscosity of the composition may not be excessively high, resulting in improved workability in film formation. When the content of the solvent is lower than this upper limit, the thickness of a film obtained by removing the solvent after film formation tends to be sufficient, thus resulting in successful film formation.

As the other charge transport compound that may be contained in the iridium complex compound-containing composition of the present invention, a compound conventionally used as a material for an organic electroluminescent element can be used. Examples include pyridine, carbazole, naphthalene, perylene, pyrene, anthracene, chrysene, naphthacene, phenanthrene, coronene, fluoranthene, benzophenanthrene, fluorene, acetonaphthofluoranthene, coumarin, p-bis(2-phenylethenyl)benzene, derivatives thereof, quinacridone derivatives, DCM (4-(dicyanomethylene)-2-methyl-6-(p-dimethylaminostyryl)-4H-pyran) compounds, benzopyran derivatives, rhodamine derivatives, benzothioxanthene derivatives, azabenzothioxanthene, arylamino-substituted fused aromatic ring compounds, and arylamino-substituted styryl derivatives.

These may be used alone, or two or more of them may be used in any combination and ratio.

Relative to 1 part by mass of the iridium complex compound or the iridium complex compound 2 of the present invention in the iridium complex compound-containing composition, the content of the other charge transport compound in the iridium complex compound-containing composition is typically 1,000 parts by mass or less, preferably 100 parts by mass or less, still more preferably 50 parts by mass or less, and typically 0.01 parts by mass or more, preferably 0.1 parts by mass or more, still more preferably 1 part by mass or more.

The iridium complex compound-containing composition of the present invention may optionally further contain other compounds in addition to the above-described compounds. For example, other solvents may be contained in addition to the above-described solvents. Examples of the other solvents include amides such as N,N-dimethylformamide and N,N-dimethylacetamide, and dimethylsulfoxide. These may be used alone, or two or more of them may be used in any combination and ratio.

[Organic Electroluminescent Element]

An organic electroluminescent element of the present invention contains the iridium complex compound or the iridium complex compound 2 of the present invention.

The organic electroluminescent element of the present invention preferably includes a substrate, an anode and a cathode on the substrate, and one or more organic layers between the anode and the cathode, and at least one of the organic layers contains the iridium complex compound or the iridium complex compound 2 of the present invention. The organic layers include a light-emitting layer.

The organic layer containing the iridium complex compound or the iridium complex compound 2 of the present invention is more preferably a layer formed using the composition of the present invention, still more preferably a layer formed by a wet film-forming method. The layer formed by a wet film-forming method is preferably a light-emitting layer.

In the present invention, the term "wet film-forming method" refers to a method of forming a film in which film formation, that is, application is performed by a wet method, such as a spin coating method, a dip coating method, a die coating method, a bar coating method, a blade coating method, a roll coating method, a spray coating method, a capillary coating method, an ink-jet method, a nozzle printing method, a screen printing method, a gravure printing method, or a flexographic printing method, to form a film and the film formed by any of these methods is dried.

The FIG. is a schematic sectional view of an exemplary structure suitable for an organic electroluminescent element 10 of the present invention. In the FIG., reference numeral 1 denotes a substrate, reference numeral 2 an anode, reference numeral 3 a hole injection layer, reference numeral 4 a hole transport layer, reference numeral 5 a light-emitting layer, reference numeral 6 a hole blocking layer, reference numeral 7 an electron transport layer, reference numeral 8 an electron injection layer, and reference numeral 9 a cathode.

Materials used for the structure may be known materials and are not particularly limited. For each layer, an exemplary material and production method will be described below. It is intended that the content of any patent publications and journals cited herein may be appropriately applied or used within the common knowledge of a person skilled in the art.

<Substrate 1>

A substrate 1 serves as a support for the organic electroluminescent element and is typically, for example, a quartz or glass plate, a metal plate or metal foil, or a plastic film or sheet. In particular, the substrate 1 is preferably a glass plate or a transparent synthetic resin plate made of, for example, polyester, polymethacrylate, polycarbonate, or polysulfone.

The substrate 1 is preferably made of a material with high gas barrier properties to prevent deterioration of the organic electroluminescent element due to ambient air. In particular, when a material with low gas barrier properties, such as a synthetic resin substrate, is used, a dense silicon oxide film or the like is preferably disposed on at least one surface of the substrate 1 to improve the gas barrier properties.

<Anode 2>

An anode 2 functions to inject holes into a layer on the light-emitting layer side. The anode 2 is typically made of a metal such as aluminum, gold, silver, nickel, palladium, or platinum; a metal oxide such as indium and/or tin oxide; a halogenated metal such as copper iodide; a conductive polymer such as carbon black, poly(3-methylthiophene), polypyrrole, or polyaniline; or the like.

The anode 2 is typically formed by a dry method such as a sputtering method or a vacuum deposition method. When the anode 2 is formed by using, for example, fine particles of a metal such as silver, fine particles of copper iodide or the like, carbon black, fine particles of a conductive metal oxide, or fine powder of a conductive polymer, a dispersion of such a material in an appropriate binder resin solution may be applied to the substrate to form the anode 2. In the case of a conductive polymer, the anode 2 can be formed by forming a thin film directly on a substrate through electrolytic polymerization or applying the conductive polymer on a substrate (Appl. Phys. Lett., vol. 60, p. 2711, 1992).

The anode 2 typically has a single-layer structure but may have a multilayer structure as appropriate. When the anode 2 has a multilayer structure, a different conductive material may be stacked on a first anode layer.

The thickness of the anode 2 may be determined according to, for example, the transparency required and the material used. When particularly high transparency is required, the thickness is preferably such that the visible light transmittance of the anode 2 is 60% or more, more preferably 80% or more. The thickness of the anode 2 is typically 5 nm or more, preferably 10 nm or more, and typically 1,000 nm or less, preferably 500 nm or less.

When transparency is not required, the anode 2 may have any thickness according to, for example, the strength required. In this case, the anode 2 may have the same thickness as the substrate 1.

When a film is formed on a surface of the anode 2, it is preferable to perform, before the film formation, a treatment with ultraviolet rays and ozone, oxygen plasma, argon plasma, or the like to thereby remove impurities on the anode and adjust the ionization potential thereof to improve hole injection ability.

<Hole Injection Layer 3>

The layer that functions to transport holes from the anode 2 side to the light-emitting layer 5 side is typically called a hole injection-transport layer or a hole transport layer. When there are two or more layers that function to transport holes from the anode 2 side to the light-emitting layer 5 side, the layer closer to the anode 2 side may be called a hole injection layer 3. The hole injection layer 3 is preferably used to enhance the function of transporting holes from the anode 2 to the light-emitting layer 5 side. When the hole injection layer 3 is used, the hole injection layer 3 is typically formed on the anode 2.

The thickness of the hole injection layer 3 is typically 1 nm or more, preferably 5 nm or more, and typically 1,000 nm or less, preferably 500 nm or less.

The hole injection layer 3 may be formed by a vacuum deposition method or a wet film-forming method. In terms of high film formability, the hole injection layer 3 is preferably formed by a wet film-forming method.

The hole injection layer 3 preferably contains a hole-transporting compound, more preferably contains a hole-transporting compound and an electron-accepting compound. Furthermore, the hole injection layer 3 preferably contains a cation radical compound, particularly preferably contains a cation radical compound and a hole-transporting compound.

(Hole-Transporting Compound)

A composition for hole injection layer formation typically contains a hole-transporting compound that will form the hole injection layer 3.

In the case of a wet film-forming method, typically, a solvent is further contained. The composition for hole injection layer formation preferably has a high hole transport ability and can efficiently transport injected holes. Thus, the composition preferably has high hole mobility and is less likely to generate trapping impurities, for example, during production or use. In addition, the composition preferably has high stability, a low ionization potential, and high transparency to visible light. Particularly when the hole injection layer 3 is in contact with the light-emitting layer 5, the composition preferably does not quench light emitted from the light-emitting layer 5 and does not form an exciplex together with the light-emitting layer 5 to reduce light emission efficiency.

The hole-transporting compound is preferably a compound having an ionization potential of 4.5 eV to 6.0 eV from the viewpoint of a barrier to charge injection from the anode 2 to the hole injection layer 3. Examples of the hole-transporting compound include aromatic amine compounds, phthalocyanine compounds, porphyrin compounds, oligothiophene compounds, polythiophene compounds, benzylphenyl compounds, compounds having tertiary amines connected to each other through a fluorene group, hydrazone compounds, silazane compounds, and quinacridone compounds.

Among the above exemplary compounds, aromatic amine compounds are preferred, and aromatic tertiary amine compounds are particularly preferred, in terms of amorphous properties and visible light transmittance. Aromatic tertiary amine compounds are compounds having an aromatic tertiary amine structure and also include compounds having a group derived from an aromatic tertiary amine.

The type of aromatic tertiary amine compound is not particularly limited, but it is preferable to use a polymer compound having a weight average molecular weight of 1,000 or more and 1,000,000 or less (polymerized compound having a series of repeating units) because uniform light emission is readily provided due to the surface-smoothing effect. Examples of preferred aromatic tertiary amine polymer compounds include a polymer compound having a repeating unit represented by formula (I) below.

[Chem. 21]

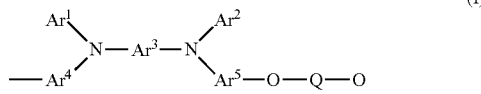

(In formula (I), $Ar^1$ and $Ar^e$ each independently represent an optionally substituted aromatic group or an optionally substituted heteroaromatic group. $Ar^3$ to $Ar^5$ each independently represent an optionally substituted aromatic group or an optionally substituted heteroaromatic group. Q represents a linking group selected from the group of linking groups given below. Among $Ar^1$ to $Ar^5$, two groups bonded to the same N atom may be bonded together to form a ring.

The linking groups are given below.

[Chem. 22]

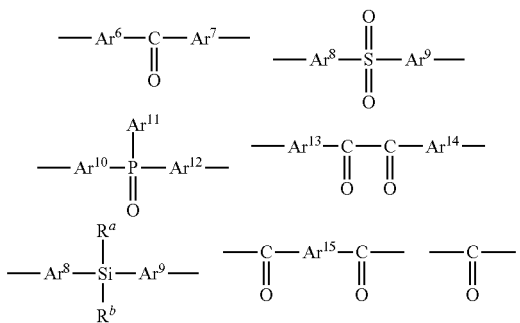

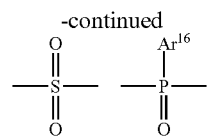

(In each of the above formulae, $Ar^6$ to $Ar^{16}$ each independently represent an optionally substituted aromatic group or an optionally substituted heteroaromatic group. $R^a$ to $R^b$ each independently represent a hydrogen atom or a substituent.)

In terms of solubility, heat resistance, and hole injection transport ability of the polymer compound, the aromatic groups and the heteroaromatic groups represented by $Ar^1$ to $Ar^{16}$ are each preferably a group derived from a benzene ring, a naphthalene ring, a phenanthrene ring, a thiophene ring, or a pyridine ring, more preferably a group derived from a benzene ring or a naphthalene ring.

Specific examples of the aromatic tertiary amine polymer compound having the repeating unit represented by formula (I) include compounds described in International Publication No. 2005/089024.

(Electron-Accepting Compound)

The hole injection layer 3 preferably contains an electron-accepting compound because the electric conductivity of the hole injection layer 3 can be improved through oxidation of the hole-transporting compound.

The electron-accepting compound is preferably a compound having oxidizing power and capable of accepting one electron from the above hole-transporting compound. Specifically, a compound having an electron affinity of 4 eV or more is preferred, and a compound having an electron affinity of 5 eV or more is more preferred.

Examples of such electron-accepting compounds include one or more compounds selected from the group consisting of triaryl boron compounds, halogenated metals, Lewis acids, organic acids, onium salts, salts of an arylamine and a halogenated metal, and salts of an arylamine and a Lewis acid. Specific examples include onium salts with a substituted organic group, such as 4-isopropyl-4'-methyldiphenyliodonium tetrakis(pentafluorophenyl)borate and triphenylsulfonium tetrafluoroborate (International Publication No. 2005/089024); high-valent inorganic compounds such as iron (III) chloride (Japanese Unexamined Patent Application Publication No. 11-251067) and ammonium peroxodisulfate; cyano compounds such as tetracyanoethylene; aromatic boron compounds such as tris(pentafluorophenyl) borane (Japanese Unexamined Patent Application Publication No. 2003-31365); fullerene derivatives; and iodine.

(Cation Radical Compound)

The cation radical compound is preferably an ionic compound composed of a cation radical, which is a chemical species resulting from the removal of one electron from a hole-transporting compound, and a counter anion. When the cation radical is derived from a hole-transporting polymer compound, the cation radical has a structure resulting from the removal of one electron from the repeating unit of the polymer compound.

The cation radical is preferably a chemical species that results from the removal of one electron from any of the compounds listed above as a hole-transporting compound. A chemical species that results from the removal of one electron from a compound preferred as a hole-transporting compound is suitable in terms of, for example, amorphous properties, visible light transmittance, heat resistance, and solubility.

The cation radical compound can be produced by mixing the hole-transporting compound and the electron-accepting compound. The mixing of the hole-transporting compound and the electron-accepting compound causes electrons to migrate from the hole-transporting compound to the electron-accepting compound, as a result of which a cationic compound composed of a cation radical of the hole-transporting compound and a counter anion is produced.

Polymer compound-derived cation radical compounds such as PEDOT/PSS (Adv. Mater., 2000, vol. 12, p. 481) and emeraldine hydrochloride (J. Phys. Chem., 1990, vol. 94, p. 7716) are produced also through oxidation polymerization (dehydrogenation polymerization).

Oxidation polymerization refers to oxidizing a monomer, in an acidic solution, chemically using peroxodisulfate or the like or electrochemically. In the case of oxidation polymerization (dehydrogenation polymerization), a monomer is oxidized to form a polymer, while one electron is removed from the repeating unit of the polymer to produce a cation radical, with an anion derived from an acidic solution serving as a counter anion.

(Formation of Hole Injection Layer 3 by Wet Film-Forming Method)

When the hole injection layer 3 is formed by a wet film-forming method, it is typically formed by mixing a material that will form the hole injection layer 3 with an appropriate solvent (a solvent for a hole injection layer) to prepare a composition for film formation (composition for hole injection layer formation), applying the composition for hole injection layer formation onto a layer (typically, the anode 2) corresponding to an underlayer of the hole injection layer 3 by a wet film-forming method to form a film, and drying the film. The drying of the formed film can be performed in the same manner as the drying in the formation of the light-emitting layer 5 by a wet film-forming method.

The concentration of the hole-transporting compound in the composition for hole injection layer formation, although not particularly limited as long as the effects of the present invention are not greatly impaired, is preferably low in terms of thickness uniformity, and is preferably high in terms of defect resistance of the hole injection layer 3. The concentration of the hole-transporting compound in the composition for hole injection layer formation is preferably 0.01 mass % or more, more preferably 0.1 mass % or more, particularly preferably 0.5 mass % or more, and preferably 70 mass % or less, more preferably 60 mass % or less, particularly preferably 50 mass % or less.

Examples of the solvent include ether solvents, ester solvents, aromatic hydrocarbon solvents, and amide solvents.

Examples of ether solvents include aliphatic ethers such as ethylene glycol dimethyl ether, ethylene glycol diethyl ether, and propylene glycol-1-monomethyl ether acetate (PGMEA) and aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, and 2,4-dimethylanisole.

Examples of ester solvents include aromatic esters such as phenyl acetate, phenyl propionate, methyl benzoate, ethyl benzoate, propyl benzoate, and n-butyl benzoate.

Examples of aromatic hydrocarbon solvents include toluene, xylene, cyclohexylbenzene, 3-isopropylbiphenyl, 1,2,3,4-tetramethylbenzene, 1,4-diisopropylbenzene, and methylnaphthalene.

Examples of amide solvents include N,N-dimethylformamide and N,N-dimethylacetamide.

Other solvents such as dimethylsulfoxide can also be used.

The formation of the hole injection layer 3 by a wet film-forming method is typically performed by preparing the composition for hole injection layer formation, then applying the composition onto a layer (typically, the anode 2) corresponding to an underlayer of the hole injection layer 3 to form a film, and drying the film. In forming the hole injection layer 3, typically, the coating film is dried, for example, by heating or vacuum drying after the film formation.

(Formation of Hole Injection Layer 3 by Vacuum Deposition Method)

When the hole injection layer 3 is formed by a vacuum deposition method, it is typically formed as described below. One or more of the constituent materials (e.g., the hole-transporting compound and the electron-accepting compound) of the hole injection layer 3 are placed in a crucible mounted in a vacuum chamber (when two or more materials are used, they are typically placed in different crucibles), and the vacuum chamber is evacuated with a vacuum pump to about $10^{-4}$ Pa. Thereafter, the crucible is heated (when two or more materials are used, the crucibles are typically each heated), and the material in the crucible is evaporated while controlling the amount of evaporation (when two or more materials are used, the materials are typically independently evaporated while controlling the amount of evaporation) to form the hole injection layer 3 on the anode 2 on a substrate placed so as to face the crucible. When two or more materials are used, a mixture thereof may be placed in a crucible, and heated and evaporated to form the hole injection layer 3.

The degree of vacuum during the deposition is not particularly limited as long as the effects of the present invention are not greatly impaired, and is typically $0.1 \times 10^{-6}$ Torr ($0.13 \times 10^{-4}$ Pa) or more and $9.0 \times 10^{-6}$ Torr ($12.0 \times 10^{-4}$ Pa) or less. The rate of deposition is not particularly limited as long as the effects of the present invention are not greatly impaired, and is typically 0.1 Å/s or more and 5.0 Å/s or less. The film formation temperature during the deposition is not particularly limited as long as the effects of the present invention are not greatly impaired, and is preferably 10° C. or more and 50° C. or less.

<Hole Transport Layer 4>

A hole transport layer 4 is a layer that functions to transport holes from the anode 2 side to the light-emitting layer 5 side. Although the hole transport layer 4 is not essential in the organic electroluminescent element of the present invention, this layer is preferably provided in order to enhance the function of transporting holes from the anode 2 to the light-emitting layer 5. When the hole transport layer 4 is provided, the hole transport layer 4 is typically formed between the anode 2 and the light-emitting layer 5. When the hole injection layer 3 is present, the hole transport layer 4 is formed between the hole injection layer 3 and the light-emitting layer 5.

The thickness of the hole transport layer 4 is typically 5 nm or more, preferably 10 nm or more, and typically 300 nm or less, preferably 100 nm or less.

The hole transport layer 4 may be formed by a vacuum deposition method or a wet film-forming method. In terms of high film formability, the hole transport layer 4 is preferably formed by a wet film-forming method.

The hole transport layer 4 typically contains a hole-transporting compound that will form the hole transport layer 4. Specific examples of the hole-transporting compound contained in the hole transport layer 4 include aromatic diamines which contain two or more tertiary amines and in which two or more fused aromatic rings are substituted with nitrogen atoms, such as 4,4'-bis[N-(1-naphthyl)-N-phenylamino]biphenyl (Japanese Unexamined Patent Application Publication No. 5-234681); aromatic amine compounds having a starburst structure, such as 4,4',4"-tris (1-naphthylphenylamino)triphenylamine (J. Lumin., vols. 72-74, p. 985, 1997); aromatic amine compounds composed of a tetramer of triphenylamine (Chem. Commun., p. 2175, 1996); spiro compounds such as 2,2',7,7'-tetrakis-(diphenylamino)-9,9'-spirobifluorene (Synth. Metals, vol. 91, p. 209, 1997); and carbazole derivatives such as 4,4'-N,N'-dicarbazolebiphenyl. Polyvinylcarbazole, polyvinyltriphenylamine (Japanese Unexamined Patent Application Publication No. 7-53953), polyarylene ether sulfone containing tetraphenylbenzidine (Polym. Adv. Tech., vol. 7, p. 33, 1996), and the like can also be preferably used.

(Formation of Hole Transport Layer 4 by Wet Film-Forming Method)

When the hole transport layer 4 is formed by a wet film-forming method, it is typically formed as in the case where the hole injection layer 3 is formed by a wet film-forming method, except that the composition for hole injection layer formation is replaced with a composition for hole transport layer formation.

When the hole transport layer 4 is formed by a wet film-forming method, the composition for hole transport layer formation typically further contains a solvent. The solvent used for the composition for hole transport layer formation may be the same solvent as used for the composition for hole injection layer formation.

The concentration of the hole-transporting compound in the composition for hole transport layer formation may be in the same range as that of the concentration of the hole-transporting compound in the composition for hole injection layer formation.

The formation of the hole transport layer 4 by a wet film-forming method can be performed in the same manner as the formation of the hole injection layer 3.

(Formation of Hole Transport Layer 4 by Vacuum Deposition Method)

Also when the hole transport layer 4 is formed by a vacuum deposition method, it can be typically formed as in the case where the hole injection layer 3 is formed by a vacuum deposition method, except that the constituent materials of the hole injection layer 3 are replaced with constituent materials of the hole transport layer 4. The film formation conditions, including the degree of vacuum during the deposition, the rate of deposition, and the temperature, may be the same as the conditions for the vacuum deposition of the hole injection layer 3.

<Light-Emitting Layer 5>

The light-emitting layer 5 is a layer that functions to emit light upon being excited by recombination of holes injected from the anode 2 and electrons injected from a cathode 9 in response to an electric field applied between the pair of electrodes.

The light-emitting layer 5 is a layer formed between the anode 2 and the cathode 9. When the hole injection layer 3 is present on the anode 2, the light-emitting layer 5 is formed between the hole injection layer 3 and the cathode 9, and when the hole transport layer 4 is present on the anode 2, the light-emitting layer 5 is formed between the hole transport layer 4 and the cathode 9.

The thickness of the light-emitting layer 5, although not particularly limited as long as the effects of the present invention are not greatly impaired, is preferably large to prevent defects of the film, and is preferably small to help achieve a low drive voltage. The thickness of the light-emitting layer 5 is preferably 3 nm or more, more preferably 5 nm or more, and preferably 200 nm or less, more preferably 100 nm or less.

The light-emitting layer 5 contains at least a material having light-emitting properties (light-emitting material), and preferably also contains a material having charge transport ability (charge-transporting material). It is only required that at least one of the light-emitting layers contain the iridium complex compound or the iridium complex compound 2 of the present invention as a light-emitting material, and other light-emitting materials may be used as appropriate.

Light-emitting materials other than the iridium complex compound or the iridium complex compound 2 of the present invention will be described below in detail.

(Light-Emitting Material)

The light-emitting material is not particularly limited as long as it emits light at a desired emission wavelength and the effects of the present invention are not impaired, and a known light-emitting material can be used. The light-emitting material may be a fluorescent material or a phosphorescent material, and is preferably a material with good light emission efficiency, preferably a phosphorescent material from the viewpoint of internal quantum efficiency.

Examples of the fluorescent material include the following materials.

Examples of fluorescent materials that provide blue-light emission (blue fluorescent materials) include naphthalene, perylene, pyrene, anthracene, coumarin, chrysene, p-bis(2-phenylethenyl)benzene, and derivatives thereof.

Examples of fluorescent materials that provide green-light emission (green fluorescent materials) include quinacridone derivatives, coumarin derivatives, and aluminum complexes such as Al $(C_9H_6NO)_3$.

Examples of fluorescent materials that provide yellow-light emission (yellow fluorescent materials) include rubrene and perimidone derivatives.

Examples of fluorescent materials that provide red-light emission (red fluorescent materials) include DCM (4-(dicyanomethylene)-2-methyl-6-(p-dimethylaminostyryl)-4H-pyran) compounds, benzopyran derivatives, rhodamine derivatives, benzothioxanthene derivatives, and azabenzothioxanthene.

Examples of the phosphorescent material include organometallic complexes containing a metal selected from groups 7 to 11 of the long-form periodic table. Preferred examples of the metal selected from groups 7 to 11 of the long-form periodic table include ruthenium, rhodium, palladium, silver, rhenium, osmium, iridium, platinum, and gold.

The ligand of such an organometallic complex is preferably a ligand in which a (hetero)aryl group is linked to pyridine, pyrazole, phenanthroline, or the like, such as a (hetero)arylpyridine ligand or a (hetero)arylpyrazole ligand, particularly preferably a phenylpyridine ligand or a phenylpyrazole ligand. Here, (hetero)aryl means an aryl group or a heteroaryl group.

Specific examples of preferred phosphorescent materials include phenylpyridine complexes such as tris(2-phenylpyridine)iridium, tris(2-phenylpyridine)ruthenium, tris (2-phenylpyridine)palladium, bis(2-phenylpyridine)platinum, tris(2-phenylpyridine)osmium, and tris(2-phenylpyridine)rhenium; and porphyrin complexes such as platinum octaethylporphyrin, platinum octaphenylporphyrin, palladium octaethylporphyrin, and palladium octaphenylporphyrin.

Examples of polymeric light-emitting materials include polyfluorene materials such as poly(9,9-dioctylfluorene-2,7-diyl), poly[(9,9-dioctylfluorene-2,7-diyl)-co-(4,4$^1$-(N-(4-sec-butylphefly))diphenylamine)], and poly[(9,9-dioctylfluorene-2,7-diyl)-co-(1,4-benzo-2{2,1'-3}-triazole)];
and polyphenylenevinylene materials such as poly[2-methoxy-5-(2-ethylhexyloxy)-1,4-phenylenevinylene].
(Charge-Transporting Material)

The charge-transporting material is a material having a positive charge (hole) or negative charge (electron) transport ability and may be any known material as long as the effects of the present invention are not impaired.

The charge-transporting material may be, for example, a compound conventionally used for the light-emitting layer 5 of an organic electroluminescent element, and, in particular, is preferably a compound used as a host material of the light-emitting layer 5.

Specific examples of the charge-transporting material include the compounds exemplified as the hole-transporting compound of the hole injection layer 3, such as aromatic amine compounds, phthalocyanine compounds, porphyrin compounds, oligothiophene compounds, polythiophene compounds, benzylphenyl compounds, compounds having tertiary amines connected to each other through a fluorene group, hydrazone compounds, silazane compounds, silanamine compounds, phosphamine compounds, and quinacridone compounds; and electron-transporting compounds such as anthracene compounds, pyrene compounds, carbazole compounds, pyridine compounds, phenanthroline compounds, oxadiazole compounds, and silole compounds.

Also preferred for use as the charge-transporting material are, for example, the compounds exemplified as the hole-transporting compound of the hole transport layer 4, such as aromatic diamines which contain two or more tertiary amines and in which two or more fused aromatic rings are substituted with nitrogen atoms, as typified by 4,4'-bis[N-(1-naphthyl)-N-phenylamino]biphenyl (Japanese Unexamined Patent Application Publication No. 5-234681); aromatic amine ompounds having a starburst structure, such as 4,4',4''-tris(1-naphthylphenylamino)triphenylamine (J. Lumin., vols. 72-74, p. 985, 1997); aromatic amine compounds composed of a tetramer of triphenylamine (Chem. Commun., p. 2175, 1996); fluoren compounds such as 2,2',7,7'-tetrakis-(diphenylamino)-9,9'-spirobifluorene (Synth. Metals, vol. 91, p. 209, 1997); and carbazole compounds such as 4,4'-N,N'-dicarbazolebiphenyl. Examples of the charge-transporting material also include oxadiazole compounds such as 2-(4-biphenylyl)-5-(p-tert-butylphenyl)-1,3,4-oxadiazole (tBu-PBD) and 2,5-bis(1-naphthyl)-1,3,4-oxadiazole (BND); silole compounds such as 2,5-bis(6'-(2',2''-bipyridyl))-1,1-dimethyl-3,4-diphenylsilole (PyPySPyPy); and phenanthroline compounds such as bathophenanthroline (BPhen) and 2,9-dimethyl-4,7-diphenyl-1,10-phenanthroline (BCP, bathocuproine).
(Formation of Light-Emitting Layer 5 by Wet Film-Forming Method)

The light-emitting layer 5 may be formed by a vacuum deposition method or a wet film-forming method. In terms of high film formability, the wet film-forming method is preferred.

When the light-emitting layer 5 is formed by a wet film-forming method, it is typically formed as in the case where the hole injection layer 3 is formed by a wet film-forming method, except that the composition for hole injection layer formation is replaced with a composition for light-emitting layer formation prepared by mixing a material that will form the light-emitting layer 5 with an appropriate solvent (a solvent for a light-emitting layer). The iridium complex compound-containing composition of the present invention is preferably used as the composition for light-emitting layer formation.

Examples of the solvent include the solvents exemplified for the formation of the hole injection layer 3, such as ether solvents, ester solvents, aromatic hydrocarbon solvents, and amide solvents; and alkane solvents, halogenated aromatic hydrocarbon solvents, aliphatic alcohol solvents, alicyclic alcohol solvents, aliphatic ketone solvents, and alicyclic ketone solvents. The solvent used is as exemplified also as the solvent of the iridium complex compound-containing composition of the present invention. Specific examples of the solvent are given below, but other solvents may also be used as long as the effects of the present invention are not impaired.

Examples include aliphatic ether solvents such as ethylene glycol dimethyl ether, ethylene glycol diethyl ether, and propylene glycol-1-monomethyl ether acetate (PGMEA);

aromatic ether solvents such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole, and diphenyl ether;

aromatic ester solvents such as phenyl acetate, phenyl propionate, methyl benzoate, ethyl benzoate, propyl benzoate, and n-butyl benzoate;

aromatic hydrocarbon solvents such as toluene, xylene, mesitylene, cyclohexylbenzene, tetralin, 3-isopropylbiphenyl, 1,2,3,4-tetramethylbenzene, 1,4-diisopropylbenzene, and methylnaphthalene;

amide solvents such as N,N-dimethylformamide and N,N-dimethylacetamide;

alkane solvents such as n-decane, cyclohexane, ethylcyclohexane, decalin, and bicyclohexane;

halogenated aromatic hydrocarbon solvents such as chlorobenzene, dichlorobenzene, and trichlorobenzene;

aliphatic alcohol solvents such as butanol and hexanol;

alicyclic alcohol solvents such as cyclohexanol and cyclooctanol;

aliphatic ketone solvents such as methyl ethyl ketone and dibutyl ketone;

and alicyclic ketone solvents such as cyclohexanone, cyclooctanone, and fenchone.

Of these, alkane solvents and aromatic hydrocarbon solvents are particularly preferred.

To form a more uniform film, the solvent is preferably evaporated from a freshly formed liquid film at an appropriate rate. Thus, the boiling point of the solvent used, as described above, is typically 80° C. or more, preferably 100° C. or more, more preferably 120° C. or more, and typically 270° C. or less, preferably 250° C. or less, more preferably 230° C. or less.

The solvent may be used in any amount as long as the effects of the present invention are not greatly impaired, but the total content of the solvent in the composition for light-emitting layer formation, that is, the iridium complex compound-containing composition is preferably high in terms of ease of film-forming operation due to a low viscosity, and is preferably low in terms of ease of film formation due to a thick film. As described above, the content of the solvent in the iridium complex compound-containing composition is preferably 1 mass % or more, more preferably 10 mass % or more, particularly preferably 50 mass % or more, and preferably 99.99 mass % or less, more preferably 99.9 mass % or less, particularly preferably 99 mass % or less.

The solvent can be removed after the wet film formation, for example, by heating or pressure reduction. The heating means used for heating is preferably a clean oven or a hot plate because heat is uniformly applied to the whole film.

The heating temperature in the heating process, although not particularly limited as long as the effects of the present invention are not greatly impaired, is preferably high in terms of reduction in drying time, and is preferably low in terms of reduction in damage to the materials. The upper limit of the heating temperature is typically 250° C. or less, preferably 200° C. or less, more preferably 150° C. or less. The lower limit of the heating temperature is typically 30° C. or more, preferably 50° C. or more, more preferably 80° C. or more. Temperatures lower than the upper limit are lower than the level of heat resistance of a commonly used charge transport material or phosphorescent material and may prevent decomposition or crystallization. When the heating temperature is higher than the lower limit, removal time of the solvent tends to become short. The heating temperature in the heating process is appropriately determined according to the boiling point of the solvent in the composition for light-emitting layer formation, the vapor pressure, the heat resistance of the materials, and the heating conditions.

(Formation of Light-Emitting Layer 5 by Vacuum Deposition Method)

When the light-emitting layer 5 is formed by a vacuum deposition method, it is typically formed as described below. One or more of the constituent materials (e.g., the light-emitting material and the charge transport compound) of the light-emitting layer 5 are placed in a crucible mounted in a vacuum chamber (when two or more materials are used, they are typically placed in different crucibles), and the vacuum chamber is evacuated with a vacuum pump to about $10^{-4}$ Pa. Thereafter, the crucible is heated (when two or more materials are used, the crucibles are typically each heated), and the material in the crucible is evaporated while controlling the amount of evaporation (when two or more materials are used, the materials are typically independently evaporated while controlling the amount of evaporation) to form the light-emitting layer 5 on the hole injection layer 3 or the hole transport layer 4 placed so as to face the crucible. When two or more materials are used, a mixture thereof may be placed in a crucible, and heated and evaporated to form the light-emitting layer 5.

The degree of vacuum during the deposition is not particularly limited as long as the effects of the present invention are not greatly impaired, and is typically $0.1 \times 10^{-6}$ Torr ($0.13 \times 10^{-4}$ Pa) or more and $9.0 \times 10^{-6}$ Torr ($12.0 \times 10^{-4}$ Pa) or less. The rate of deposition is not particularly limited as long as the effects of the present invention are not greatly impaired, and is typically 0.1 Å/s or more and 5.0 Å/s or less. The film formation temperature during the deposition is not particularly limited as long as the effects of the present invention are not greatly impaired, and is preferably 10° C. or more and 50° C. or less.

<Hole Blocking Layer 6>

A hole blocking layer 6 may be disposed between the light-emitting layer 5 and an electron injection layer 8 described later. The hole blocking layer 6 is a layer stacked on the light-emitting layer 5 so as to be in contact with a surface of the light-emitting layer 5 on the cathode 9 side.

The hole blocking layer 6 serves to prevent holes moving from the anode 2 from reaching the cathode 9 and to efficiently transport electrons injected from the cathode 9 toward the light-emitting layer 5. The material forming the hole blocking layer 6 is required to have physical properties such as high electron mobility, low hole mobility, a large energy gap (difference between HOMO and LUMO), and a high excited triplet level (T1).

Examples of materials of the hole blocking layer 6 that satisfy such requirements include mixed ligand complexes such as bis(2-methyl-8-quinolinolate)(phenolate)aluminum and bis(2-methyl-8-quinolinolate)(triphenylsilanolate)aluminum; metal complexes such as a bis(2-methyl-8-quinolate)aluminum-μ-oxo-bis-(2-methyl-8-quinolinolate)aluminum dinuclear metal complex; styryl compounds such as distyrylbiphenyl derivatives (Japanese Unexamined Patent Application Publication No. 11-242996); triazole derivatives such as 3-(4-biphenylyl)-4-phenyl-5(4-tert-butylphenyl)-1,2,4-triazole (Japanese Unexamined Patent Application Publication No. 7-41759); and phenanthroline derivatives such as bathocuproine (Japanese Unexamined Patent Application Publication No. 10-79297). A compound having at least one pyridine ring substituted at the 2-, 4-, and 6-positions described in International Publication No. 2005/022962 is also preferred as the material of the hole blocking layer 6.

The hole blocking layer 6 may be formed by any method, and can be formed in the same manner as the light-emitting layer 5.

The thickness of the hole blocking layer 6, although not particularly limited as long as the effects of the present invention are not greatly impaired, is typically 0.3 nm or more, preferably 0.5 nm or more, and typically 100 nm or less, preferably 50 nm or less.

<Electron Transport Layer 7>

An electron transport layer 7 is disposed between the light-emitting layer 5 or the hole blocking layer 6 and the electron injection layer 8 for the purpose of further improving the current efficiency of the element.

The electron transport layer 7 is formed of a compound that, between the electrodes under an electric field, is capable of efficiently transporting electrons injected from the cathode 9 toward the light-emitting layer 5. The electron-transporting compound used for the electron transport layer 7 needs to be a compound into which electrons from the cathode 9 or the electron injection layer 8 are injected with high efficiency and which has high electron mobility so that injected electrons can be efficiently transported.

Examples of electron-transporting compounds that satisfy such requirements include metal complexes such as aluminum complexes of 8-hydroxyquinoline (Japanese Unexamined Patent Application Publication No. 59-194393), metal complexes of 10-hydroxybenzo[h]quinoline, oxadiazole derivatives, distyrylbiphenyl derivatives, silole derivatives, 3-hydroxyflavone metal complexes, 5-hydroxyflavone metal complexes, benzoxazole metal complexes, benzothiazole metal complexes, trisbenzimidazolylbenzene (U.S. Pat. No. 5,645,948), quinoxaline compounds (Japanese Unexamined Patent Application Publication No. 6-207169), phenanthroline derivatives (Japanese Unexamined Patent Application Publication No. 5-331459), 2-t-butyl-9,10-N,N'-dicyanoanthraquinonediimine, n-type hydrogenated amorphous silicon carbide, n-type zinc sulfide, and n-type zinc selenide.

The thickness of the electron transport layer 7 is typically 1 nm or more, preferably 5 nm or more, and typically 300 nm or less, preferably 100 nm or less.

The electron transport layer 7 is formed by being stacked on the light-emitting layer 5 or the hole blocking layer 6 by a wet film-forming method or a vacuum deposition method as with the light-emitting layer 5. Typically, a vacuum deposition method is used.

<Electron Injection Layer 8>

The electron injection layer 8 serves to efficiently inject electrons injected from the cathode 9 into the electron transport layer 7 or the light-emitting layer 5.

To achieve efficient electron injection, the material forming the electron injection layer 8 is preferably a metal with a low work function. Examples include alkali metals such as sodium and cesium and alkaline-earth metals such as barium and calcium.

The thickness of the electron injection layer 8 is preferably 0.1 to 5 nm.

To interpose, as the electron injection layer 8, an ultrathin insulating film (about 0.1 to 5 nm thick) of LiF, $MgF_2$, $Li_2O$, $Cs_2CO_3$, or the like between the cathode 9 and the electron transport layer 7 is also an effective means for improving the efficiency of the element (Appl. Phys. Lett., vol. 70, p. 152, 1997; Japanese Unexamined Patent Application Publication No. 10-74586; IEEE Trans. Electron. Devices, vol. 44, p. 1245, 1997; and SID 04 Digest, p. 154).

Furthermore, to dope an organic electron transport material, as typified by nitrogen-containing heterocyclic compounds such as bathophenanthroline and metal complexes such as aluminum complexes of 8-hydroxyquinoline, with an alkali metal such as sodium, potassium, cesium, lithium, or rubidium (described in Japanese Unexamined Patent Application Publication No. 10-270171, Japanese Unexamined Patent Application Publication No. 2002-100478, Japanese Unexamined Patent Application Publication No. 2002-100482, etc.) is preferred because the electron injection/transport ability can be improved to achieve excellent film quality. In this case, the thickness of the film is typically 5 nm or more, preferably 10 nm or more, and typically 200 nm or less, preferably 100 nm or less.

The electron injection layer 8 is formed by being stacked on the light-emitting layer 5 or on the hole blocking layer 6 or the electron transport layer 7 thereon by a wet film-forming method or a vacuum deposition method as with the light-emitting layer 5.

Details in the case of a wet film-forming method are the same as in the case of the light-emitting layer 5.

<Cathode 9>

The cathode 9 serves to inject electrons into a layer on the light-emitting layer 5 side (e.g., the electron injection layer 8 or the light-emitting layer 5). The material of the cathode 9 may be the same as the material used for the anode 2. For efficient electron injection, it is preferable to use a metal with a low work function, such as tin, magnesium, indium, calcium, aluminum, silver, or an alloy thereof. Examples of the material of the cathode 9 include alloy electrodes with a low work function, such as magnesium-silver alloys, magnesium-indium alloys, and aluminum-lithium alloys.

In terms of element stability, a metal layer having a high work function and stable to the atmosphere is preferably stacked on the cathode 9 to protect the cathode 9 formed of a metal with a low work function. Examples of the metal stacked include metals such as aluminum, silver, copper, nickel, chromium, gold, and platinum.

The thickness of the cathode is typically the same as that of the anode 2.

<Other Constituent Layers>

While the description has been made mainly in the context of an element with a layer structure illustrated in the FIG., any desired layers, in addition to the layers described above, may be disposed between the anode 2 and the light-emitting layer 5 and between the cathode 9 and the light-emitting layer 5 in the organic electroluminescent element of the present invention, or any of the layers other than the light-emitting layer 5 may be omitted, as long as the performance of the element is not impaired.

For example, to dispose an electron blocking layer between the hole transport layer 4 and the light-emitting layer 5 is also effective for the same purpose as that of the hole blocking layer 6. The electron blocking layer serves to prevent electrons moving from the light-emitting layer 5 from reaching the hole transport layer 4, thereby increasing the probability of recombination of electrons with holes in the light-emitting layer 5 and confining the resultant excitons in the light-emitting layer 5, and also serves to efficiently transport holes injected from the hole transport layer 4 toward the light-emitting layer 5.

The electron blocking layer is required to have properties such as high hole transport ability, a large energy gap (difference between HOMO and LUMO), and a high excited triplet level (T1).

When the light-emitting layer 5 is formed by a wet film-forming method, the electron blocking layer is also preferably formed by a wet film-forming method for ease of element production.

Thus, the electron blocking layer also preferably has suitability for wet film formation, and examples of materials used for such electron blocking layers include copolymers of dioctylfluorene and triphenylamine, as typified by F8-TFB (International Publication No. 2004/084260).

The structure in the FIG. may be reversed; specifically, the cathode 9, the electron injection layer 8, the electron transport layer 7, the hole blocking layer 6, the light-emitting layer 5, the hole transport layer 4, the hole injection layer 3, and the anode 2 may be stacked in this order on the substrate 1. It is also possible to dispose the organic electroluminescent element of the present invention between two substrates at least one of which is highly transparent.

A structure formed of a plurality of the layer structures illustrated in the FIG. stacked on top of each other (a structure formed of a plurality of light-emitting units stacked on top of each other) is also possible. In this case, from the viewpoint of light emission efficiency and drive voltage, it is more preferable to use, for example, $V_2O_5$ as a charge generation layer in place of the interfacial layer (when the anode is ITO and the cathode is Al, the interfacial layer means these two layers) between the stages (between the light-emitting units) because such a configuration reduces the barrier between the stages.

The present invention can be applied to any of a single organic electroluminescent element, organic electroluminescent elements configured in an array arrangement, and a structure in which anodes and cathodes are arranged in an X-Y matrix.

[Display Device and Illumination Device]

A display device and an illumination device of the present invention each include the organic electroluminescent element of the present invention as described above. The display device and the illumination device of the present invention may be of any type and may have any structure, and can be assembled according to an ordinary method by using the organic electroluminescent element of the present invention.

For example, the display device and the illumination device of the present invention can be formed by a method as described in "Organic EL Display" (Ohmsha, Ltd., published Aug. 20, 2004, written by Shizuo Tokito, Chihaya Adachi, and Hideyuki Murata).

EXAMPLES

The present invention will now be described in more detail with reference to examples. The present invention is not limited to the following examples, and any modifications can be made without departing from the scope of the present invention.

In the following, all reactions were performed under a stream of nitrogen.

"S-Phos" is an abbreviation of "2-dicyclohexylphosphino-2',6'-dimethoxy-1,1'-biphenyl".

[Synthesis of Iridium Complex Compound (Compound 1) of the Present Invention]

<Reaction 1>

[Chem. 23]

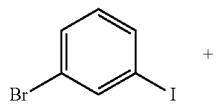
+
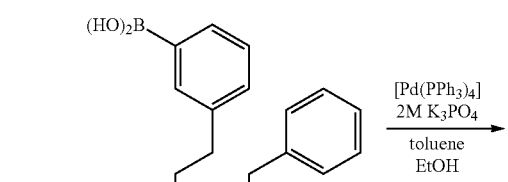
→
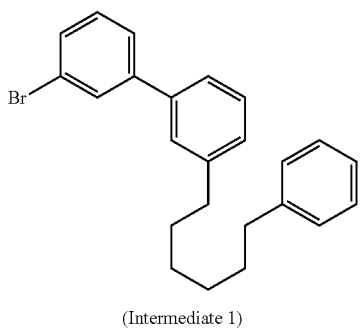

(Intermediate 1)

In a 500 mL recovery flask, 32.1 g of m-bromoiodobenzene, 8.9 g of a 3-(6-phenylhexyl)phenylboronic acid synthesized by a method described in International Publication No. 2016/194784, 2.4 g of tetrakistriphenylphosphine palladium(0), 140 mL of a 2M-aqueous tripotassium phosphate solution, 60 mL of ethanol, and 190 mL of toluene were placed, and stirring was performed for 3 hours in an oil bath at 105° C. The aqueous phase was removed, and the solvent was removed under reduced pressure. The resulting residue was purified by silica gel column chromatography (neutral gel: 500 mL, dichloromethane/hexane=5/95) to obtain 43.2 g of intermediate 1 as a colorless oil.

<Reaction 2>

[Chem. 24]

(Bpin)$_2$ +
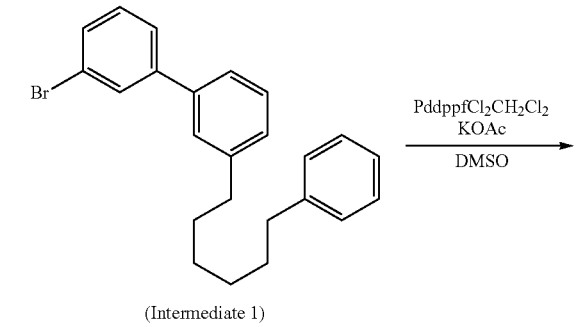

(Intermediate 1)

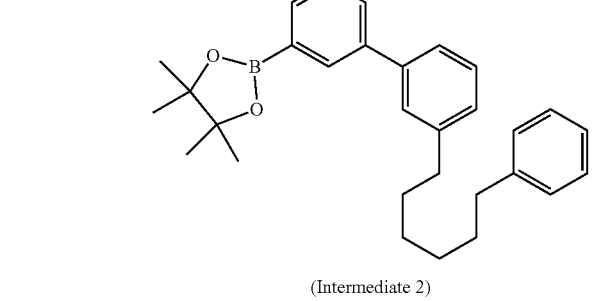

(Intermediate 2)

In a 1 L recovery flask, 43.2 g of intermediate 1, 33.2 g of bispinacolatodiboron, 2.7 g of a bis(diphenylphosphino)ferrocenedichloropalladium.dichloromet hane adduct, 55.2 g of potassium acetate, and 410 mL of dimethylsulfoxide were placed, and stirring was performed for 4 hours in an oil bath at 90° C. After cooling to room temperature, 0.8 L of water and 0.5 L of dichloromethane were added to perform separate washing. The oil phase was dried over magnesium sulfate (50 mL by volume) and then filtered, and the solvent was removed under reduced pressure. The resulting residue was purified by silica gel column chromatography (neutral gel: 400 mL, dichloromethane/hexane=3/7) to obtain 44.0 g of intermediate 2 as a yellow oil.

<Reaction 3>

[Chem. 25]

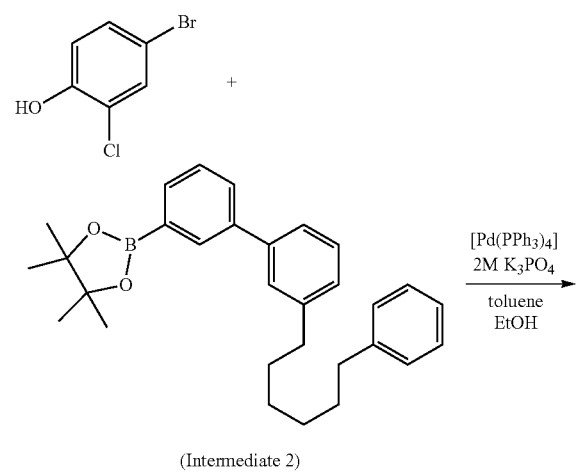

-continued

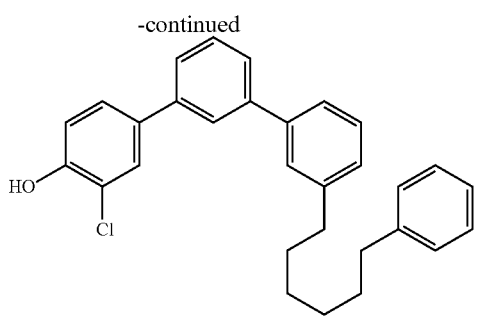

(Intermediate 3)

In a 1 L recovery flask, 7.1 g of 4-bromo-2-chlorophenol, 17.8 g of intermediate 2, 1.1 g of tetrakistriphenylphosphine palladium(0), 50 mL of a 2M-aqueous tripotassium phosphate solution, and 150 mL of 1,2-dimethoxyethane were placed, and stirring was performed for 3 hours in an oil bath at 100° C. After cooling to room temperature, 105 mL of water, 35 mL of 35% hydrochloric acid, and 150 mL of dichloromethane were added to perform separate washing. The oil phase was dried over magnesium sulfate (20 mL by volume) and filtered, and the solvent was removed under reduced pressure. The resulting residue was purified by silica gel column chromatography (neutral gel: 500 mL, dichloromethane/hexane=4/6) to obtain 9.9 g of intermediate 3 as a colorless oil.

<Reaction 4>

[Chem. 26]

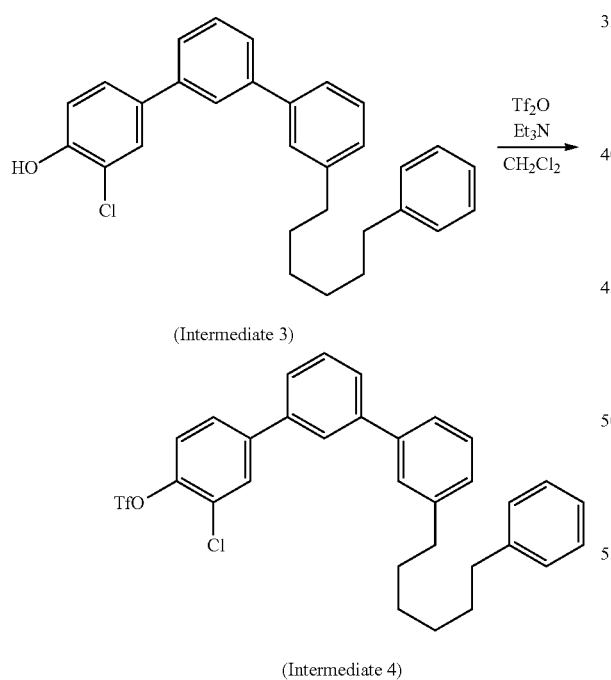

(Intermediate 4)

In a 1 L recovery flask, 9.9 g of intermediate 3, 100 mL of dry dichloromethane, and 7 mL of triethylamine were placed, and under cooling with ice water, a mixed solution of 8.0 mL of trifluoromethanesulfonic acid anhydride and 10 mL of dichloromethane was added dropwise thereto over 5 minutes. Thereafter, the temperature was returned to room temperature, and the mixture was stirred for 30 minutes. After a solution of 7.0 g of sodium carbonate in 100 mL of water was added for neutralization, 100 mL of water and 150 mL of dichloromethane were added to perform separate washing. The oil phase was dried over magnesium sulfate (30 mL by volume) and then filtered, and the solvent was removed under reduced pressure. The resulting residue was purified by silica gel column chromatography (neutral gel: 400 mL, dichloromethane/hexane=5/95, then 1/9) to obtain 10.1 g of intermediate 4 as a colorless oil.

<Reaction 5>

[Chem. 27]

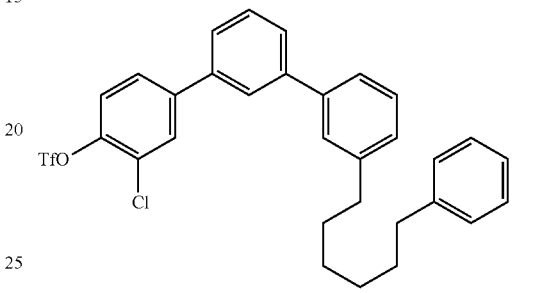

(Intermediate 4)

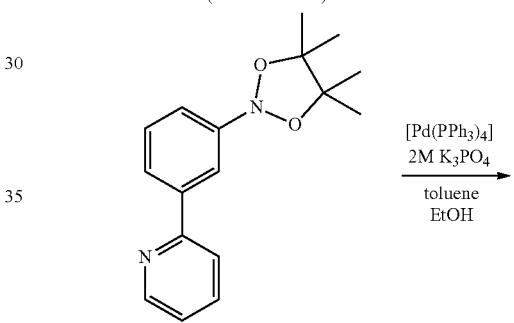

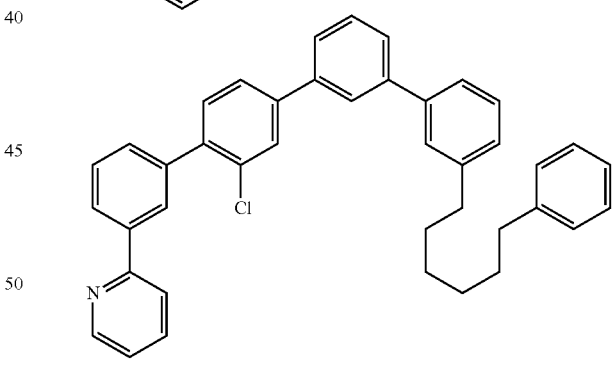

(Intermediate 5)

In a 1 L recovery flask, 10.1 g of intermediate 4, 5.8 g of 2-(3-pinacolborylphenyl)pyridine, 0.75 g of tetrakistriphenylphosphine palladium(0), 28 mL of a 2M-aqueous tripotassium phosphate solution, 25 mL of ethanol, and 62 mL of toluene were placed, and stirring was performed for 3 hours and 40 minutes in an oil bath at 100° C. After 100 mL of water was added to perform separate washing, the resultant was dried over magnesium sulfate (20 mL by volume) and then filtered, and the solvent was removed under reduced pressure. The resulting residue was purified by silica gel column chromatography (neutral gel: 500 mL, dichloromethane/hexane=1/1, then 8/2, 9/1, 1/0) to obtain 8.7 g of intermediate 5 as a white solid.

<Reaction 6>

[Chem. 28]

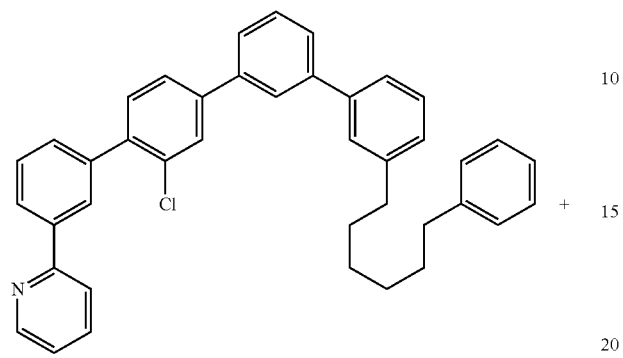

(Intermediate 5)

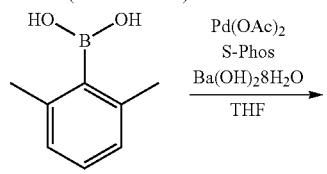

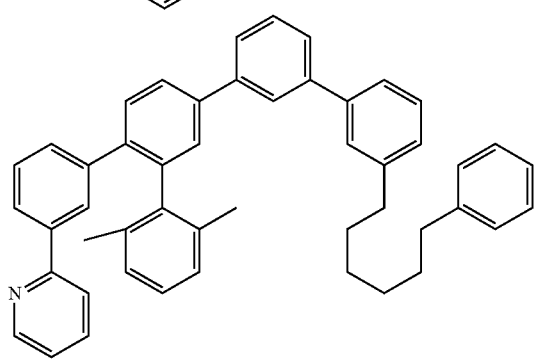

(Intermediate 6)

In a 1 L recovery flask, 8.7 g of intermediate 5, 4.8 g of 2,6-dimethylphenylboronic acid, 0.26 g of palladium acetate, 0.95 g of S-Phos, 9.7 g of barium hydroxide octahydrate, and 200 mL of tetrahydrofuran were placed, and stirring was performed for 3 hours in an oil bath at 95° C. The resulting mixture was cooled and then filtered, and the solvent was removed under reduced pressure. The resulting residue was purified by silica gel column chromatography (neutral gel: 500 mL, dichloromethane) to obtain 9.0 g of intermediate 6 as a colorless oil.

<Reaction 7>

[Chem. 29]

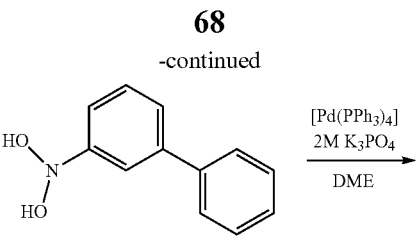

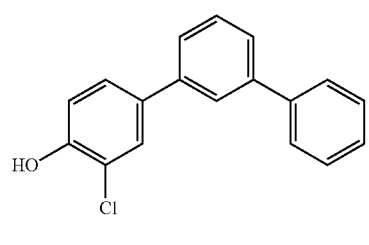

(Intermediate 7)

In a 1 L recovery flask, 24.9 g of 4-bromo-2-chlorophenol, 28.4 g of 3-biphenylboronic acid, 1.5 g of tetrakistriphenylphosphine palladium(0), 180 mL of a 2M-aqueous tripotassium phosphate solution, and 300 mL of 1,2-dimethoxyethane were placed, and stirring was performed for 2.5 hours in an oil bath at 100° C. After cooling to room temperature, 200 mL of water, 180 mL of 1 N hydrochloric acid, and 5 mL of 35% hydrochloric acid were added to perform separate washing. The oil phase was dried over magnesium sulfate (50 mL by volume) and filtered, and the solvent was removed under reduced pressure. The resulting residue was purified by silica gel column chromatography (neutral gel: 550 mL, dichloromethane/hexane=4/6) to obtain 24.8 g of intermediate 7 as a colorless oil.

<Reaction 8>

[Chem. 30]

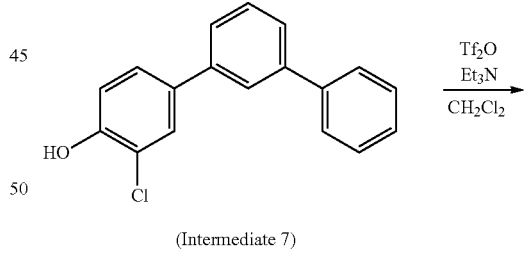

(Intermediate 7)

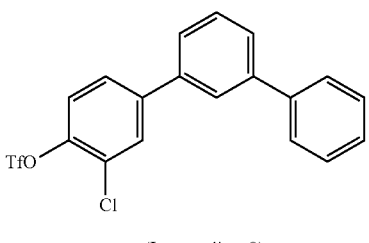

(Intermediate 8)

In a 1 L recovery flask, 24.8 g of intermediate 7, 300 mL of dry dichloromethane, and 25 mL of triethylamine were placed, and under cooling with ice water, a mixed solution of 30 mL of trifluoromethanesulfonic acid anhydride and 25 mL of dichloromethane was added dropwise thereto over 25 minutes. Thereafter, the temperature was returned to room temperature, and the mixture was stirred for 1 hour. After a solution of 10 g of sodium carbonate in 200 mL of water was added for neutralization, separation was performed. The oil phase was dried over magnesium sulfate (20 mL by volume) and then filtered, and the solvent was removed under reduced pressure. The resulting residue was purified by silica gel column chromatography (neutral gel: 400 mL, dichloromethane/hexane=3/7) to obtain 34.4 g of intermediate 8 as a yellow oil.
<Reaction 9>

[Chem. 31]

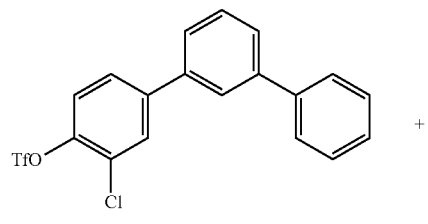

(Intermediate 8)

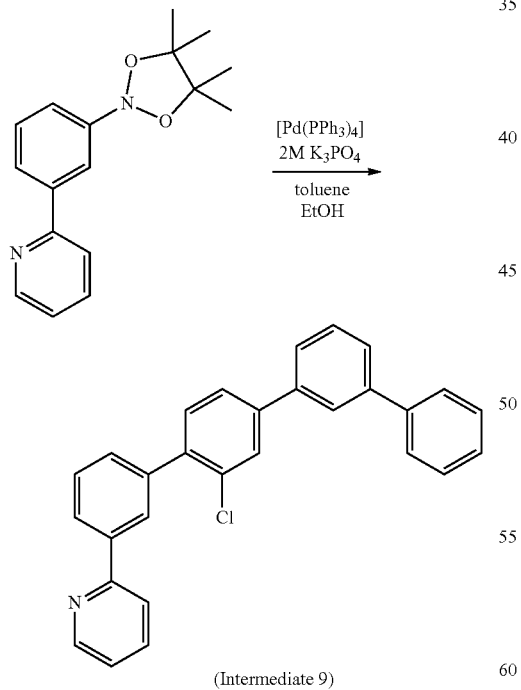

(Intermediate 9)

In a 1 L recovery flask, 27.3 g of intermediate 8, 18.6 g of 2-(3-pinacolborylphenyl)pyridine, 2.5 g of tetrakistriphenylphosphine palladium(0), 85 mL of a 2M-aqueous tripotassium phosphate solution, 80 mL of ethanol, and 160 mL of toluene were placed, and stirring was performed for 3.5 hours in an oil bath at 100° C. After 200 mL of water was added to perform separate washing, the resultant was dried over magnesium sulfate (30 mL by volume) and then filtered, and the solvent was removed under reduced pressure. The resulting residue was purified by silica gel column chromatography (neutral gel: 500 mL, dichloromethane/hexane=1/1, then 4/1) to obtain 18.3 g of intermediate 9 as a yellow oil.
<Reaction 10>

[Chem. 32]

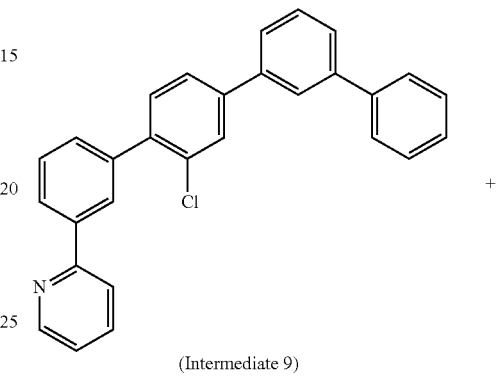

(Intermediate 9)

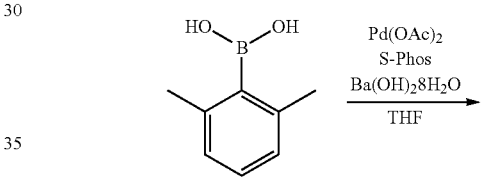

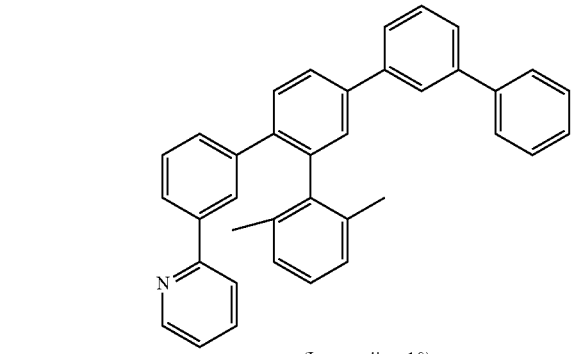

(Intermediate 10)

In a 1 L recovery flask, 16.8 g of intermediate 9, 12.1 g of 2,6-dimethylphenylboronic acid, 0.67 g of palladium acetate, 2.5 g of S-Phos, 25.8 g of barium hydroxide octahydrate, and 400 mL of tetrahydrofuran were placed, and stirring was performed for 4 hours and 40 minutes in an oil bath at 95° C. The resulting mixture was cooled and then filtered, and the solvent was removed under reduced pressure. The resulting residue was purified by silica gel column chromatography (neutral gel: 500 mL, dichloromethane) to obtain 18.6 g of intermediate 10 as a faint yellow solid.

<Reaction 11>

[Chem. 33]

IrCl₃nH₂O +

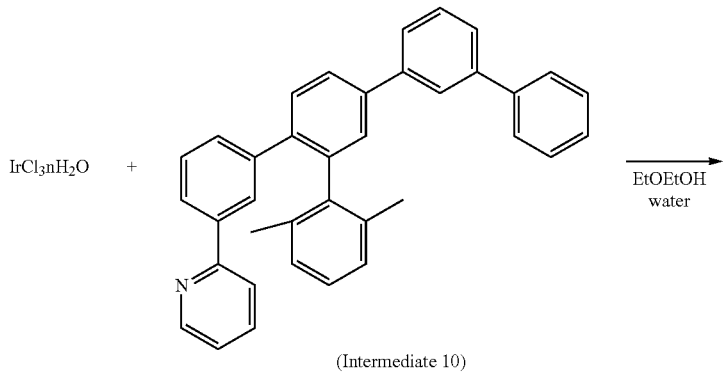

(Intermediate 10)

→ EtOEtOH water

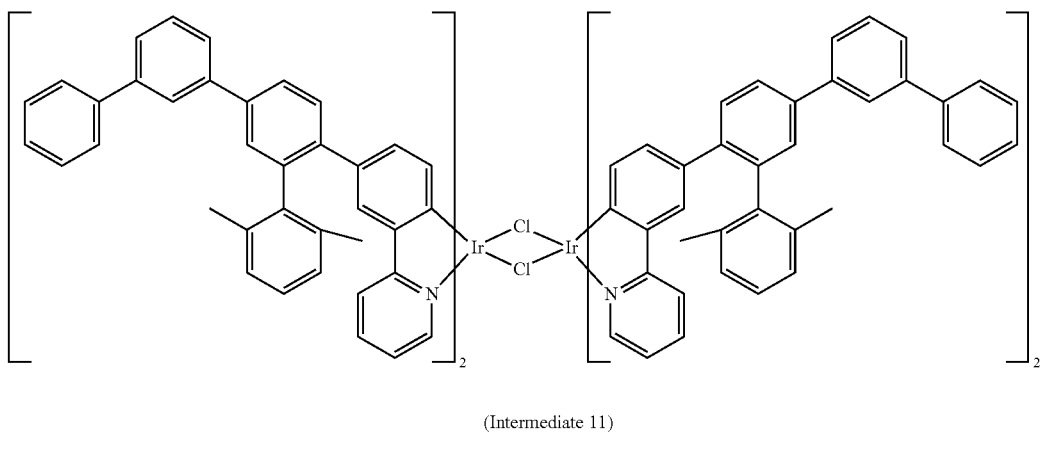

(Intermediate 11)

In a 300 mL recovery flask equipped with a Dimroth condenser having a side tube, 15.6 g of intermediate 10, 5.4 g of iridium chloride n-hydrate (manufactured by Furuya Metal Co., Ltd., Ir content: 52 mass %), 24 mL of water, and 80 mL of 2-ethoxyethanol were placed, and stirring was performed for 2 hours in an oil bath at 135° C., then for 8 hours at 145° C. During the reaction, evaporating solvent was condensed with the Dimroth condenser and removed through the side tube. After 4 hours since the start of the reaction, 40 mL of diglyme was added. After 7 hours since the start of the reaction, 20 mL of ethoxyethanol, 40 mL of toluene, and 0.5 g of iridium chloride n-hydrate were added. The total amount of removed solvent was 80 mL. After cooling to room temperature, 100 mL of water was added, and the resulting mixture was filtered through Celite. The residue was dissolved in 600 mL of dichloromethane, and the resulting solution was subjected to solvent removal under reduced pressure. The resulting residue was purified by silica gel column chromatography (neutral gel: 300 mL, dichloromethane) to obtain 16.8 g of intermediate 11 as an orange solid.

<Reaction 12>

[Chem. 34]

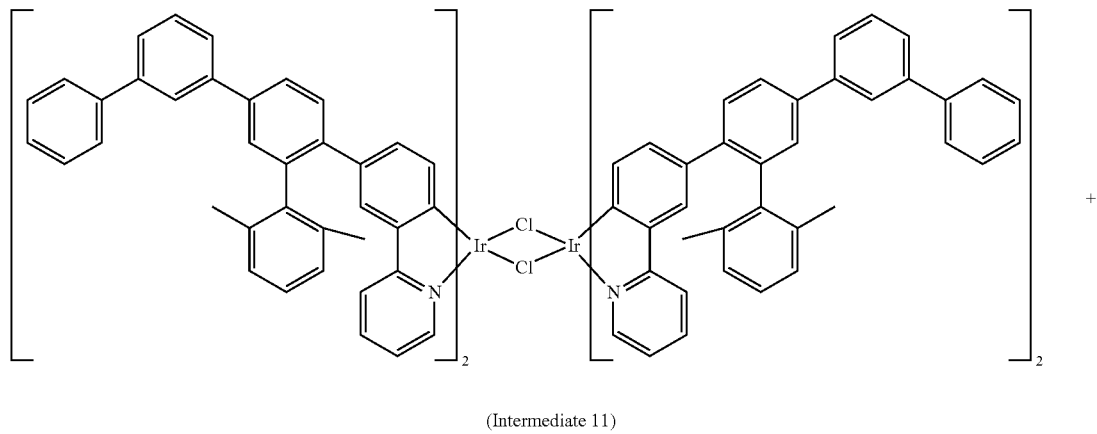

(Intermediate 11)

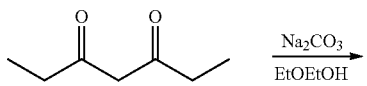

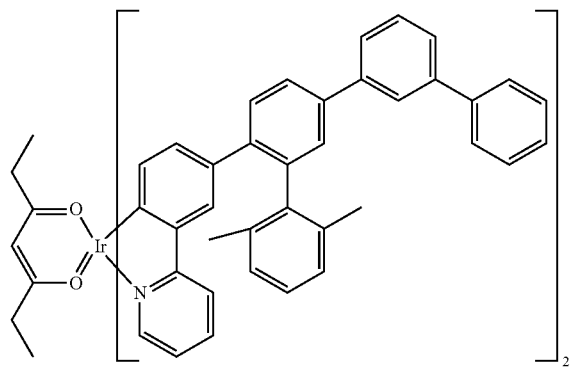

(Intermediate 12)

In a 100 mL recovery flask, 1.0 g of intermediate 11, 0.52 g of 3,5-heptanedione, 0.9 g of sodium carbonate, and 30 mL of dichloromethane were placed and refluxed at an oil bath temperature of 60° C. After 25 minutes since the start of the reaction, 25 mL of 2-ethoxyethanol were added, and the oil bath temperature was increased to 150° C. During the reaction, evaporating solvent was removed through the Dimroth condenser having a side tube. After 40 minutes since the start of the reaction, the temperature was cooled to room temperature. Thereafter, the reaction product was filtered, and 100 mL of water was added to the filtrate to give a precipitate of yellow powder. The precipitate was collected by filtration and washed with water and methanol to obtain 0.86 g of intermediate 12 as a yellow solid.

<Reaction 13>

[Chem. 35]

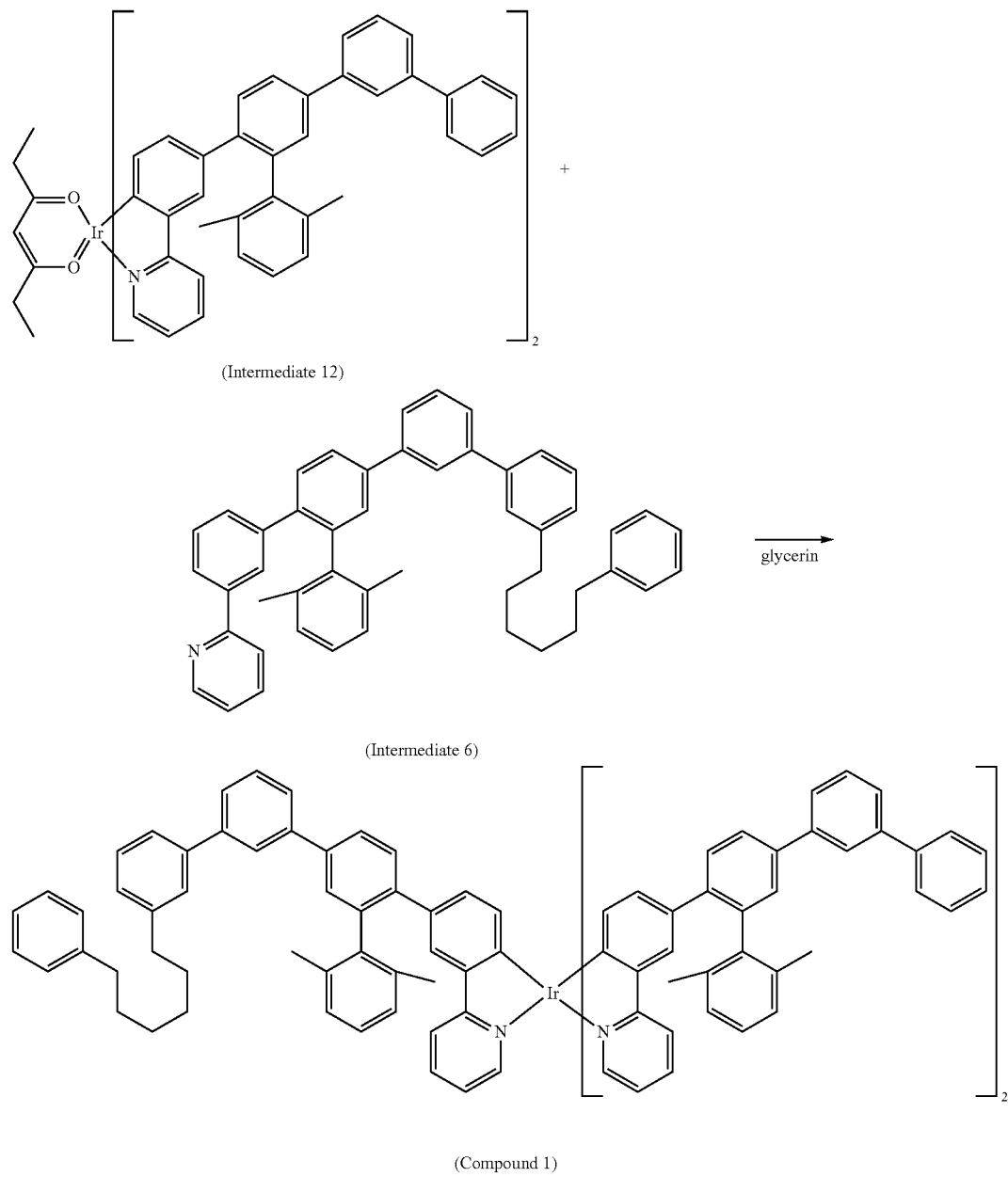

(Intermediate 12)

(Intermediate 6)

(Compound 1)

In a 500 mL recovery flask, 8.8 g of intermediate 12, 5.7 g of intermediate 6, and 91 g of glycerol were placed, and stirring was performed for 3 hours in an oil bath heated to 235° C. Thereafter, the temperature was cooled to 100° C., and 200 cc of water was then added thereto. The resulting mixture was filtered, and the solid collected by the filtration was dissolved in 400 mL of dichloromethane and washed with 400 mL water by separation. Thereafter, the resultant was dried over magnesium sulfate (50 mL by volume) and then filtered, and the solvent was removed under reduced pressure. The resulting residue was purified by silica gel column chromatography (neutral gel: 700 mL, dichloromethane/hexane=4/6) to obtain 1.5 g of compound 1.

[Evaluation of Solvent Solubility]

Compound 1, compound D-1 below, and compound D-2 below were each mixed with cyclohexylbenzene at a concentration of 3 mass %. At room temperature, solubility was observed only by means of manual shaking; the compounds were each dissolved within two minutes. It can be said that all the compounds have sufficient solvent solubility. Compound D-1 and compound D-2 were synthesized on the basis of Synthesis Example of compound 1 and the description of Japanese Unexamined Patent Application Publication No. 2014-111613.

[Chem. 36]

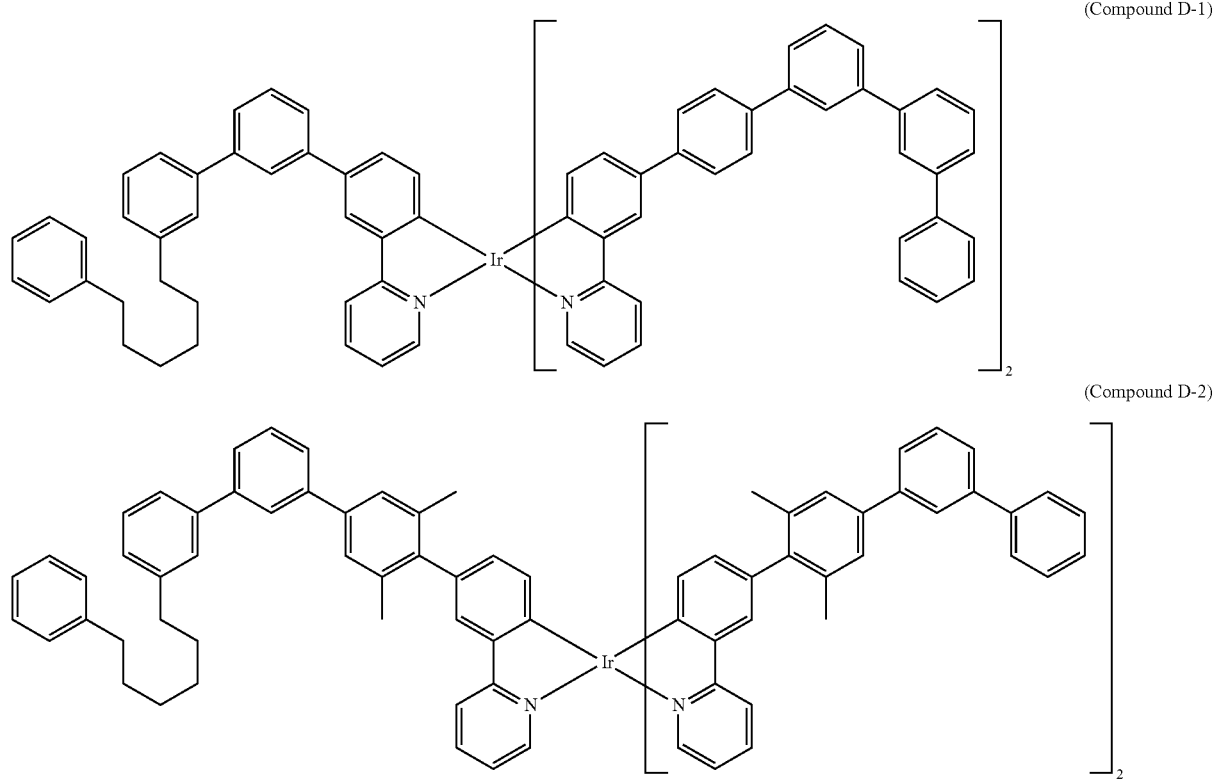

(Compound D-1)

(Compound D-2)

Example 1

Compound 1, that is, the iridium complex compound of the present invention, was measured for its luminescent quantum yield and maximum emission wavelength by the following methods. The results are shown in Table 1.

Compound 1 was dissolved in 2-methyltetrahydrofuran (manufactured by Aldrich, dehydrated, no stabilizer added) at room temperature to prepare a solution with a concentration of $1\times10^{-5}$ mol/l. The solution was placed in a quartz cell equipped with a Teflon (registered trademark) cock. Nitrogen bubbling was performed for 20 minutes or more, and the absolute quantum yield was measured at room temperature. CIE chromaticity coordinates were determined from a simultaneously obtained phosphorescence spectrum. The wavelength at a maximum intensity in the phosphorescence spectrum was used as a maximum emission wavelength. The luminescent quantum yield was expressed as a relative value, with the value of compound 1 being 1.

For the measurement of the luminescent quantum yield, the following instruments were used.

Apparatus: C9920-02 organic EL quantum yield spectrometer manufactured by Hamamatsu Photonics K. K.
Light source: L9799-01 monochromatic light source
Detector: PMA-11 multichannel detector
Excitation light: 380 nm

Comparative Example 1 and Comparative Example 2

The maximum emission wavelength, the CIE chromaticity coordinates, and the luminescent quantum yield were measured by the same procedure as in Example 1 except that compound 1 was replaced with compound D-1 or compound D-2. The results are shown in Table 1.

TABLE 1

| Iridium complex compound | Maximum emission wavelength (nm) | Luminescent quantum yield | CIE chromaticity coordinates | |
|---|---|---|---|---|
| | | | x | y |
| Example 1 | Compound 1 | 514 | 1 | 0.30 | 0.63 |
| Comparative Example 1 | Compound D-1 | 517 | 1 | 0.31 | 0.63 |
| Comparative Example 2 | Compound D-2 | 515 | 0.976 | 0.31 | 0.62 |

As is clear from Table 1, the iridium complex compound of the present invention has a short maximum emission wavelength, and thus is a green-light-emitting material with high color purity.

Compound D-1 has a clearly longer maximum emission wavelength than compound 1.

Although there is no big difference between the maximum emission wavelength of compound D-2 and the maximum emission wavelength of compound D-1, compound D-2 has a small luminescent quantum yield and hence poor light emission efficiency.

Comparison of the CIE chromaticity coordinates in the emission spectra shows that compound 1 has a smaller x coordinate value without a decrease in y coordinate value (i.e., without degradation of color purity) and thus has higher green color purity.

Reference Example

Reference Example according to the iridium complex compound 2 of the present invention will be described below.

[Synthesis of Iridium Complex Compound 2 (Compound 10) of Present Invention]

<Reaction 14>

[Chem. 37]

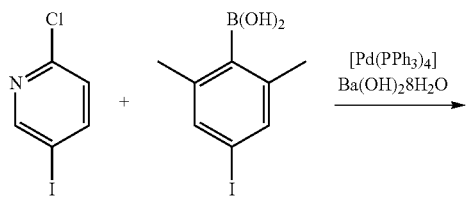

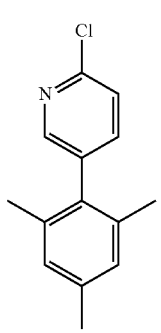

In a 300 mL recovery flask, 14.8 g of 2-chloro-5-iodopyridine, 10.1 g of 2,4,6-trimethylphenylboronic acid, 2.5 g of tetrakis triphenylphosphine palladium(0), 39.9 g of barium hydroxide octahydrate, and 150 mL of 1,4-dioxane were placed, and in an oil bath, stirring was performed at 90° C. for 2 hours, then at 100° C. for 3 hours. Thereafter, the solvent was removed under reduced pressure. The residue was purified by silica gel column chromatography (neutral gel: 500 mL, dichloromethane/hexane=7/3, then 1/0) to obtain 13.8 g of 2-chloro-5-(2,4,6-trimethylphenyl)pyridine as a yellow solid.

<Reaction 15>

[Chem. 38]

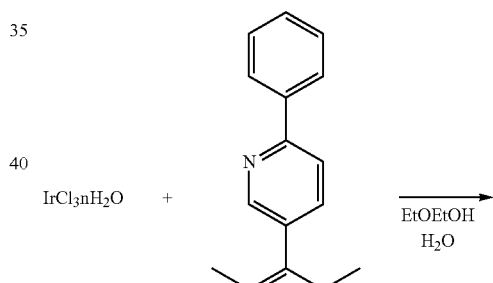

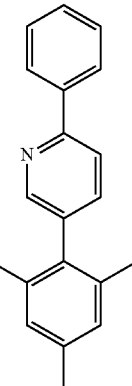

In a 1 L recovery flask, 13.8 g of 2-chloro-5-(2,4,6-trimethylphenyl)pyridine, 8.9 g of phenylboronic acid, 1.2 g of tetrakistriphenylphosphine palladium(0), 90 mL of a 2M-aqueous tripotassium phosphate solution, 40 mL of ethanol, and 80 mL of toluene were placed, and stirring was performed for 5 hours in an oil bath at 100° C. The aqueous phase was removed, and the solvent was removed under reduced pressure. The resulting residue was purified by silica gel column chromatography (neutral gel: 500 mL, dichloromethane/hexane=7/3, then 9/1) to obtain 15.7 g of 2-phenyl-5-(2,4,6-trimethylphenyl)pyridine as a yellow oil.

<Reaction 16>

[Chem. 39]

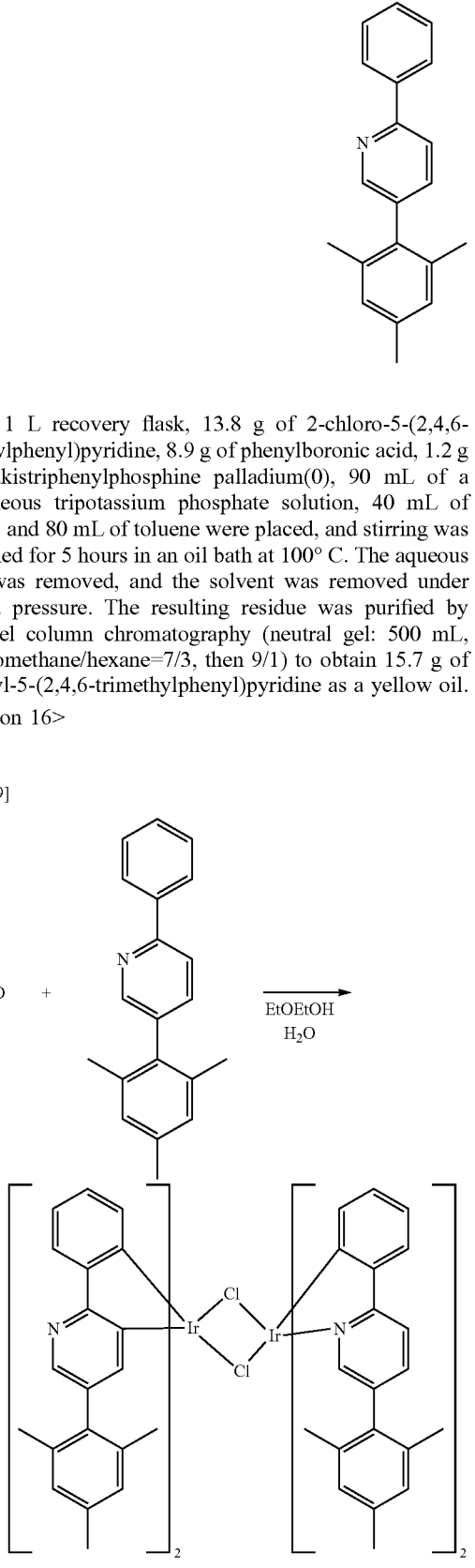

(Intermediate 13)

In a 300 mL recovery flask equipped with a Dimroth condenser having a side tube, 15.7 g of 2-phenyl-5-(2,4,6-trimethylphenyl)pyridine, 9.4 g of iridium chloride n-hydrate (manufactured by Furuya Metal Co., Ltd., Ir content: 52 mass %), 30 mL of water, and 100 mL of 2-ethoxyethanol were placed, and stirring was performed for 9.5 hours in an oil bath at 145° C. During the reaction, evaporating solvent was condensed with the Dimroth condenser and removed through the side tube. The total amount of removed solvent was 30 mL. After cooling to room temperature, 2 mL of water was added, and the resulting mixture was filtered, washed with 50 mL of methanol, and then dried to obtain 15.7 g of intermediate 13 as an orange solid.

<Reaction 17>

[Chem. 40]

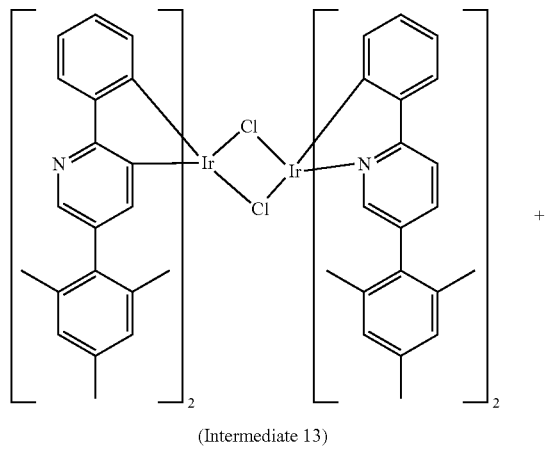

(Intermediate 13)

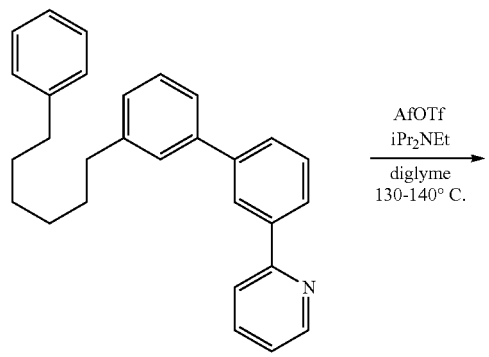

(Intermediate 14)

AfOTf
iPr₂NEt
―――――
diglyme
130-140° C.

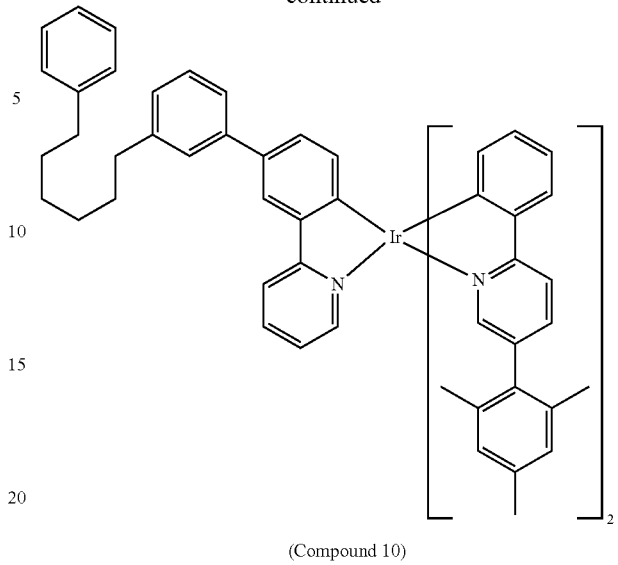

(Compound 10)

In an 300 mL recovery flask, 7.5 g of intermediate 13, 8.3 g of intermediate 14 synthesized by a method described in International Publication No. 2013/105615, 3.2 g of silver trifluoromethanesulfonate(I), and 25 mL of diglyme were placed, and heated to 130° C. in an oil bath. Immediately after the heating, 1.8 mL of diisopropylethylamine was added.

Stirring was performed for 1.5 hours, and then at 140° C. for 40 minutes. The solvent was removed under reduced pressure, and the resulting residue was purified by silica gel column chromatography (neutral gel: 500 mL, dichloromethane/hexane=4/6) to obtain 2.1 g of compound 10 as a yellow solid.

[Evaluation of Solvent Solubility]

Example I-1

Compound 10 was mixed with cyclohexylbenzene at a concentration of 3 wt %. At room temperature, solubility was observed only by means of manual shaking; the mixture was rapidly dissolved. Thereafter, the solution was allowed to sit at room temperature for 50 hours, and the occurrence of precipitation was observed; the solution maintained homogeneity. Compound 10 was found to have high solvent solubility.

Comparative Example I-1

Compound D-5 represented by the following formula was mixed with cyclohexylbenzene at a concentration of 3 wt %. At room temperature, solubility was observed only by means of manual shaking; the mixture was rapidly dissolved. Thereafter, the solution was allowed to sit at room temperature for 50 hours, and the occurrence of precipitation was observed; the solution maintained homogeneity. Compound D-5 was found to have high solvent solubility. Compound D-5 was synthesized on the basis of Synthesis Example of compound 10 and the description of Japanese Unexamined Patent Application Publication (Translation of PCT Application) No. 2008-504371.

[Chem. 41]

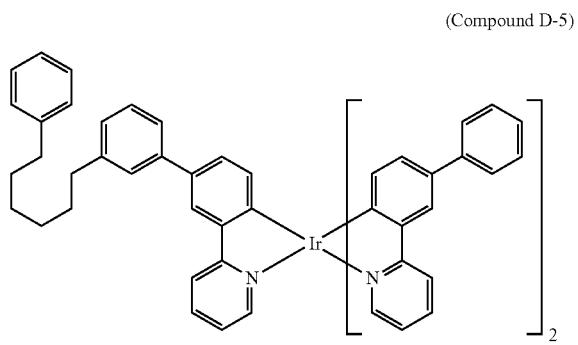

(Compound D-5)

<Comparative Example I-2>

Compound D-6 represented by the following formula was mixed with cyclohexylbenzene at a concentration of 3 wt %. At room temperature, solubility was observed only by means of manual shaking; a solid residue was observed. The solution was further heated for 3 minutes on a hot plate at 100° C., but compound D-6 was not completely dissolved. When the solution was further heated for 3 minutes at an increased temperature of 150° C., compound D-6 was dissolved to homogeneity. Thereafter, the solution was allowed to sit at room temperature; precipitation of a powdery solid was observed only after 2 hours. Compound D-6 was found to have poor solvent solubility. Compound D-6 was synthesized on the basis of Synthesis Example of compound 1 and the description of Japanese Unexamined Patent Application Publication No. 2014-111613.

[Chem. 42]

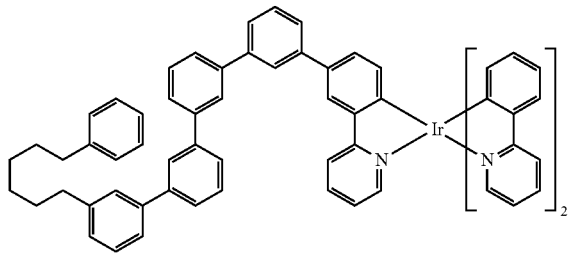

(Compound D-6)

[Evaluation of Luminescent Quantum Yield and Maximum Emission Wavelength]

Example II-1

Compound 10, that is, the iridium complex compound 2 of the present invention, was measured for its luminescent quantum yield and maximum emission wavelength in the same manner as in Example 1 above. The luminescent quantum yield was expressed as a relative value, with the value of compound 10 being 1. The results are shown in Table 2.

Comparative Example II-1

The maximum emission wavelength and the luminescent quantum yield were measured by the same procedure as in Example II-1 except that compound 10 was replaced with compound D-5. The results are shown in Table 2.

TABLE 2

| | Iridium complex compound | Luminescent quantum yield | Maximum emission wavelength (nm) |
|---|---|---|---|
| Example II-1 | Compound 10 | 1 | 516 |
| Comparative Example II-2 | Compound D-5 | 0.965 | 517 |

Table 2 shows that compound 10, that is, the iridium complex compound 2 of the present invention, has a clearly higher luminescent quantum yield and a shorter maximum emission wavelength than compound D-5, and thus is a green-light-emitting material with high color purity.

<Maximum Emission Wavelength Measurement Example>

The maximum emission wavelength of compound D-3 and compound D-4 represented by the following formulae was measured in the same manner as in Example II-1; compound D-3: 517 nm, compound D-4: 522 nm. From this it can be seen that when a 2- and 6-substituted benzene ring is introduced into the 4-position of the pyridine ring of a phenyl-pyridine ligand, the emission wavelength becomes longer than when the 2- and 6-substituted benzene ring is not introduced, thus causing a decrease in color purity for green light emission. Compounds D-3 and D-4 were synthesized on the basis of the description of Japanese Unexamined Patent Application Publication No. 2014-111613.

[Chem. 43]

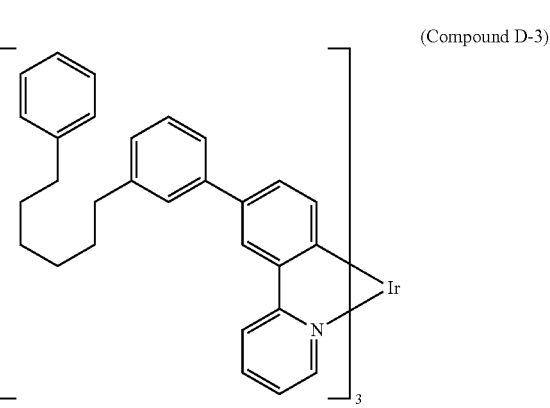

(Compound D-3)

(Compound D-4)

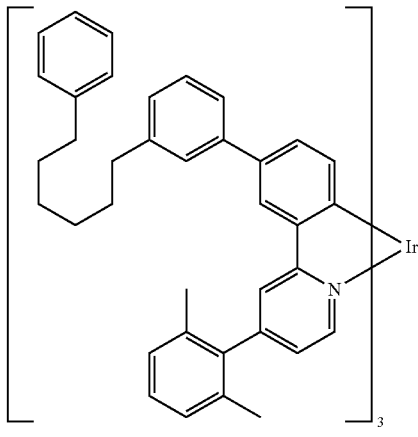

While the present invention has been described in detail using a specific embodiment, it should be apparent to those skilled in the art that various modifications can be made without departing from the spirit and scope of the present invention.

The present application is based on Japanese Patent Application Nos. 2017-229167 and 2017-229168 filed on Nov. 29, 2017, which are incorporated herein by reference in their entirety.

REFERENCE SIGNS LIST 1 substrate
2 anode
3 hole injection layer
4 hole transport layer
5 light-emitting layer
6 hole blocking layer
7 electron transport layer
8 electron injection layer
9 cathode
10 organic electroluminescent element

The invention claimed is:

1. An iridium complex compound of formula (10):

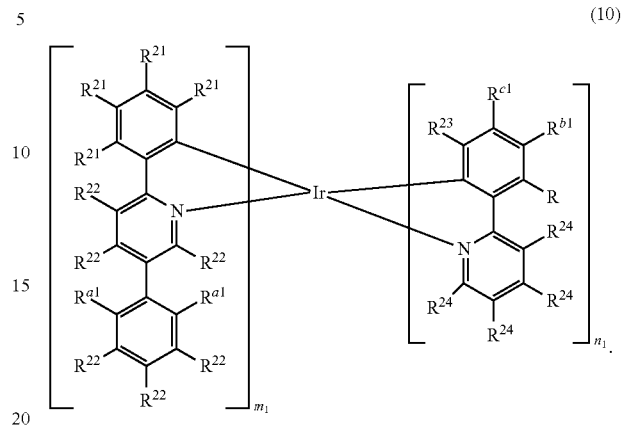

(10)

wherein Ir represents an iridium atom;
m1 represents an integer of 1 or 2, n1 represents an integer of 1 or 2, and m1+n1=3;
R is hydrogen;
Ra1 at each occurrence represents an alkyl group or an aralkyl group;
Rb1, Rc1, and R21 to R24 each independently represent a hydrogen atom or a substituent; and
Ra1 to Rc1 and R21 to R24 are further optionally bonded to each other to form a ring, and
wherein at least one of Rb1 and Rc1 is a substituted or unsubstituted aromatic or heteroaromatic group.

2. The iridium complex compound according to claim 1, wherein m1 is 2.

3. The iridium complex compound according to claim 1, wherein Rb1 is a substituted or unsubstituted aromatic or heteroaromatic group.

4. The iridium complex compound according to claim 1, wherein R21 at each occurrence is a hydrogen atom or an alkyl or aralkyl group having 1 to 20 carbon atoms.

5. A composition containing:
the iridium complex compound according to claim 1 and a solvent.

6. An organic electroluminescent element, comprising the iridium complex compound according to claim 1.

7. A display device, comprising the organic electroluminescent element according to claim 6.

8. An illumination device, comprising the organic electroluminescent element according to claim 6.

* * * * *